(12) United States Patent
Kim et al.

(10) Patent No.: US 12,433,123 B2
(45) Date of Patent: Sep. 30, 2025

(54) ORGANIC ELECTROLUMINESCENCE DEVICE

(71) Applicant: Samsung Display Co., Ltd., Yongin-si (KR)

(72) Inventors: Taeil Kim, Hwaseong-si (KR); Sun Young Pak, Suwon-si (KR); Junha Park, Gwacheon-si (KR); Jang Yeol Baek, Yongin-si (KR); Kyoung Baek Sunwoo, Hwaseong-si (KR); Mun-Ki Sim, Seoul (KR); Chanseok Oh, Seoul (KR); Minjung Jung, Gangwon-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 951 days.

(21) Appl. No.: 17/560,738

(22) Filed: Dec. 23, 2021

(65) Prior Publication Data

US 2022/0352466 A1 Nov. 3, 2022

(30) Foreign Application Priority Data

Apr. 19, 2021 (KR) .......................... 10-2021-0050545

(51) Int. Cl.
| | |
|---|---|
| *H01L 51/50* | (2006.01) |
| *H10K 59/32* | (2023.01) |
| *H10K 85/30* | (2023.01) |
| *H10K 85/60* | (2023.01) |
| *H10K 50/11* | (2023.01) |

(Continued)

(52) U.S. Cl.
CPC ........... *H10K 59/32* (2023.02); *H10K 85/322* (2023.02); *H10K 85/631* (2023.02); *H10K 85/654* (2023.02); *H10K 85/658* (2023.02); *H10K 50/11* (2023.02); *H10K 50/15* (2023.02);
(Continued)

(58) Field of Classification Search
None
See application file for complete search history.

(56) References Cited

U.S. PATENT DOCUMENTS

| | | | |
|---|---|---|---|
| 10,374,166 B2 | 8/2019 | Hatakeyama et al. | |
| 2010/0001301 A1* | 1/2010 | Karg .................... | H10K 59/878 257/40 |

(Continued)

FOREIGN PATENT DOCUMENTS

| | | |
|---|---|---|
| KR | 10-2016-0119683 | 10/2016 |
| KR | 10-2020-0052513 | 5/2020 |

(Continued)

OTHER PUBLICATIONS

Anton Pershin et al., "Highly emissive excitons with reduced exchange energy in thermally activated delayed fluorescent molecules", Nature Communications, Feb. 5, 2019, vol. 10, No. 597.

(Continued)

*Primary Examiner* — Gregory D Clark
(74) *Attorney, Agent, or Firm* — Lerner David LLP

(57) ABSTRACT

An organic electroluminescence device includes a first electrode, a second electrode facing the first electrode, and a plurality of organic layers disposed between the first electrode and the second electrode. At least one organic layer includes a fused polycyclic compound represented by Formula 1, thereby exhibiting improved luminous efficiency.

20 Claims, 6 Drawing Sheets

(51) Int. Cl.
  *H10K 50/15*   (2023.01)
  *H10K 59/12*   (2023.01)
  *H10K 101/10*  (2023.01)
  *H10K 101/20*  (2023.01)

(52) U.S. Cl.
  CPC ......... *H10K 59/12* (2023.02); *H10K 2101/10* (2023.02); *H10K 2101/20* (2023.02)

(56) References Cited

U.S. PATENT DOCUMENTS

2020/0144503 A1   5/2020   Hayano
2020/0190115 A1   6/2020   Hatakeyama et al.

FOREIGN PATENT DOCUMENTS

| KR | 10-2020-0107848 | | 9/2020 | |
| KR | 10-2020-0125583 | | 11/2020 | |
| WO | 2018/212169 | | 11/2018 | |
| WO | WO 2020/045681 | * | 3/2020 | ............. H10L 51/50 |

OTHER PUBLICATIONS

Yasuhiro Kondo et al., "Narrowband deep-blue organic light-emitting diode featuring an organoboron-based emitter", Nature Photonics, Jul. 15, 2019, pp. 678-682, vol. 13, https://doi.org/10.1038/s41566-019-0476-5.

* cited by examiner

ORGANIC ELECTROLUMINESCENCE DEVICE

CROSS-REFERENCE TO RELATED APPLICATION(S)

This application claims priority to and benefits of Korean Patent Application No. 10-2021-0050545 under 35 U.S.C. § 119, filed on Apr. 19, 2021 in the Korean Intellectual Property Office, the entire contents of which are incorporated herein by reference.

BACKGROUND

1. Technical Field

The disclosure herein relates to an organic electroluminescence device including a fused polycyclic compound used as a luminescent material.

2. Description of the Related Art

Active development continues for an organic electroluminescence display apparatus as an image display apparatus. In contrast to liquid crystal display apparatuses and the like, the organic electroluminescence display apparatus is a so-called self-luminescent display apparatus in which holes and electrons respectively injected from a first electrode and a second electrode recombine in an emission layer, and thus a luminescent material including an organic compound in the emission layer emits light to implement display.

In the application of an organic electroluminescence display apparatus to an image display apparatus, there is a demand for decreasing driving voltage and for increasing emission efficiency and the life of the organic electroluminescence device, and continuous development is required on materials for an organic electroluminescence device which are capable of stably attaining such characteristics.

Recently, in order to achieve an organic electroluminescence device with high efficiency, techniques on phosphorescence emission which uses energy in a triplet state or on delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organic electroluminescence device having improved emission efficiency.

An embodiment provides an organic electroluminescence device which may include a first electrode, a second electrode facing the first electrode, and organic layers disposed between the first electrode and the second electrode, wherein the organic layers may include at least one organic layer including a fused polycyclic compound represented by Formula 1, and at least one organic layer including an amine compound represented by Formula H-1:

[Formula 1]

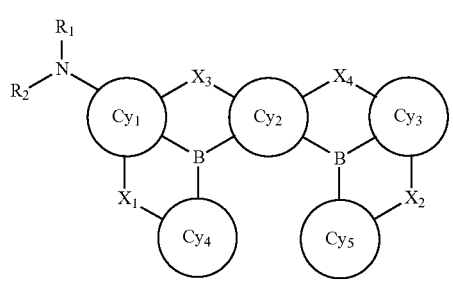

In Formula 1, $Cy_1$ to $Cy_5$ may each independently be a substituted or unsubstituted aromatic hydrocarbon ring, or a substituted or unsubstituted aromatic heterocycle, $X_1$ to $X_4$ may each independently be $C(R_{10})(R_{11})$, $N(R_{12})$, O, S, or Se, and $R_1$ and $R_2$ may each independently be a substituted or unsubstituted silyl group, a substituted or unsubstituted alkyl group having 1 to 20 carbon atoms, a substituted or unsubstituted cycloalkyl group having 3 to 20 ring-forming carbon atoms, or may be bonded to an adjacent group to form a ring, and $R_{10}$ to $R_{12}$ may each independently be a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

[Formula H-1]

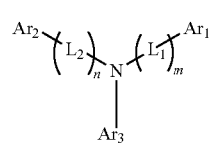

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms, m and n may each independently be an integer from 0 to 10, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, and $Ar_3$ may be a substituted or unsubstituted aryl group having 6 to 30 ring-forming carbon atoms.

In an embodiment, the organic layers may include a hole transport region disposed on the first electrode, an emission layer disposed on the hole transport region, and an electron transport region disposed on the emission layer, and the emission layer may include the fused polycyclic compound represented by Formula 1.

In an embodiment, the emission layer may emit delayed fluorescence.

In an embodiment, the emission layer may be a delayed fluorescence emission layer including a first compound and a second compound, and the first compound may include the fused polycyclic compound represented by Formula 1.

In an embodiment, the hole transport region may include a hole injection layer disposed on the first electrode, and a hole transport layer disposed on the hole injection layer, and the hole transport layer may include the amine compound represented by Formula H-1.

In an embodiment, the hole transport region may further include an electron blocking layer disposed on the hole transport layer.

In an embodiment, the organic electroluminescence device may further include a capping layer disposed on the second electrode and having a refractive index equal to or greater than about 1.6.

In an embodiment, the fused polycyclic compound represented by Formula 1 may be represented by Formula 2:

[Formula 2]

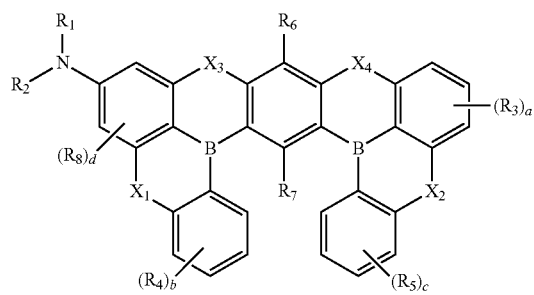

In Formula 2, $R_3$ to $R_8$ may each independently be a hydrogen atom, a deuterium atom, a halogen atom, a cyano group, a substituted or unsubstituted oxy group, a substituted or unsubstituted amine group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or may be bonded to an adjacent group to form a ring, a may be an integer from 0 to 3, b and c may each independently be an integer from 0 to 4, d may be an integer from 0 to 2, and $X_1$ to $X_4$, $R_1$, and $R_2$ may be the same as defined in Formula 1.

In an embodiment, the fused polycyclic compound represented by Formula 2 may be represented by any one of Formula 3-1 to Formula 3-3:

[Formula 3-1]

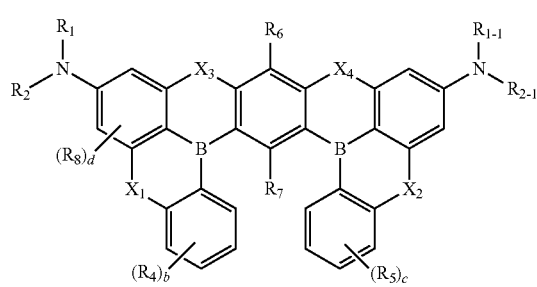

[Formula 3-2]

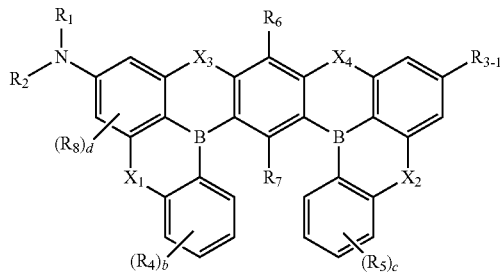

[Formula 3-3]

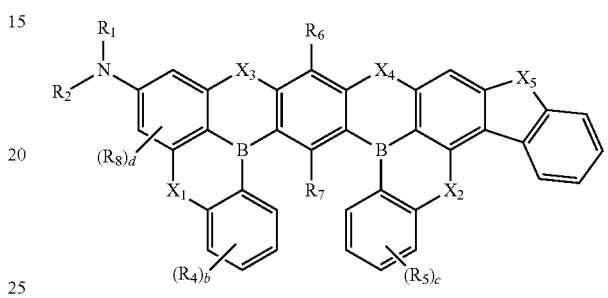

In Formula 3-1 to Formula 3-3, and $R_{2-1}$ may each independently be a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or may be bonded to an adjacent group to form a ring, $R_{3-1}$ may be a hydrogen atom, a deuterium atom, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, $X_5$ may be $N(R_{13})$, O, or S, $R_{13}$ may be a substituted or unsubstituted aryl group having 6 to 60 ring-forming carbon atoms, or a substituted or unsubstituted heteroaryl group having 2 to 60 ring-forming carbon atoms, $R_4$ to $R_8$ may each independently be a hydrogen atom, a deuterium atom, a halogen atom, a cyano group, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, and $X_1$ to $X_4$, $R_1$, $R_2$, and b to d may be the same as defined in Formula 2.

In an embodiment, the fused polycyclic compound represented by Formula 2 may be represented by Formula 4-1 or Formula 4-2:

[Formula 4-1]

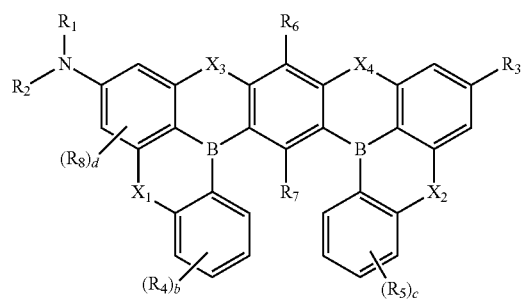

[Formula 5-2]

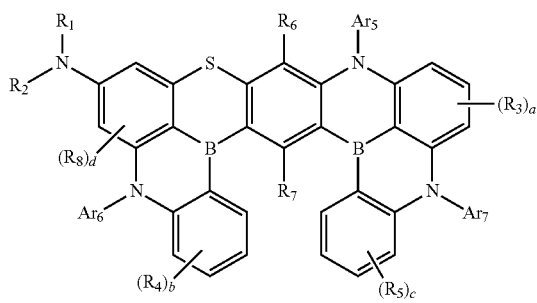

[Formula 4-2]

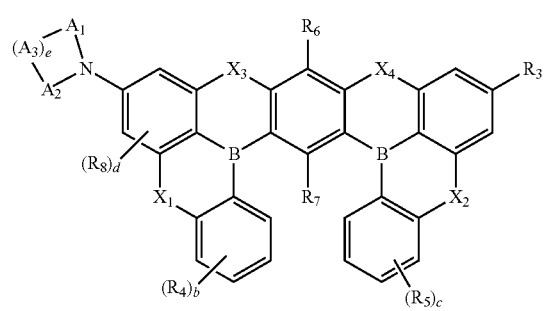

[Formula 5-3]

[Formula 5-4]

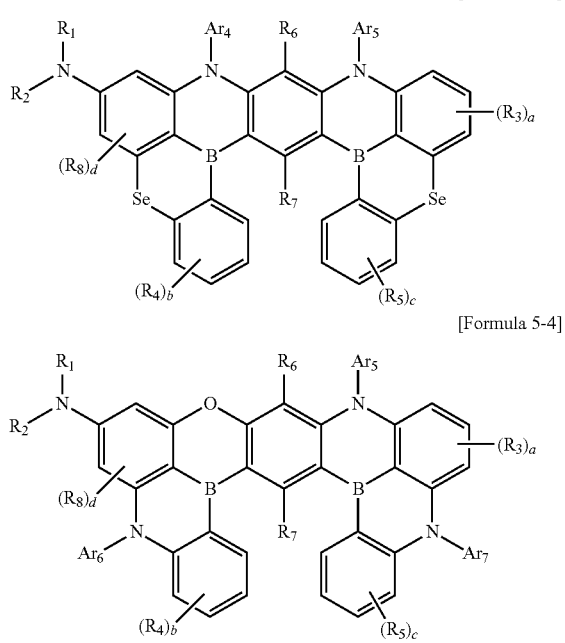

In Formula 4-1 to Formula 4-2, $R_1$ and $R_2$ may each independently be a substituted or unsubstituted silyl group, a substituted or unsubstituted alkyl group having 1 to 10 carbon atoms, or a substituted or unsubstituted cycloalkyl group having 3 to 20 ring-forming carbon atoms, $A_1$ to $A_3$ may each independently be a substituted or unsubstituted alkylene group having 1 to 20 carbon atoms, e may be an integer from 0 to 5, and $X_1$ to $X_4$, $R_3$ to $R_8$, and b to d may be the same as defined in Formula 2.

In an embodiment, in Formula 1, at least two of $X_1$ to $X_4$ may each independently be represented by $N(Ar_4)$, and $Ar_4$ may be a substituted or unsubstituted aryl group having 6 to 30 ring-forming carbon atoms.

In an embodiment, the fused polycyclic compound represented by Formula 2 may be represented by any one of Formula 5-1 to Formula 5-4:

[Formula 5-1]

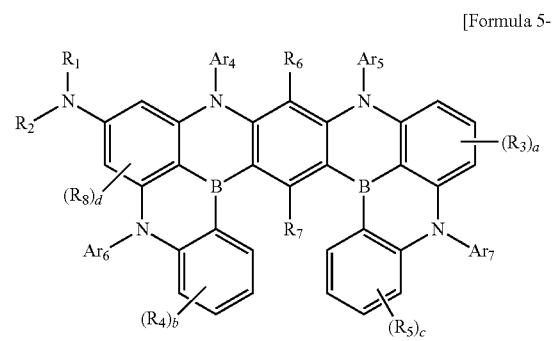

In Formula 5-1 to Formula 5-4, $Ar_4$ to $Ar_7$ may each independently be a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, and $R_1$ to $R_8$, and a to d may be the same as defined in Formula 2.

In an embodiment, the fused polycyclic compound represented by Formula 2 may be represented by Formula 6-1 or Formula 6-2:

[Formula 6-1]

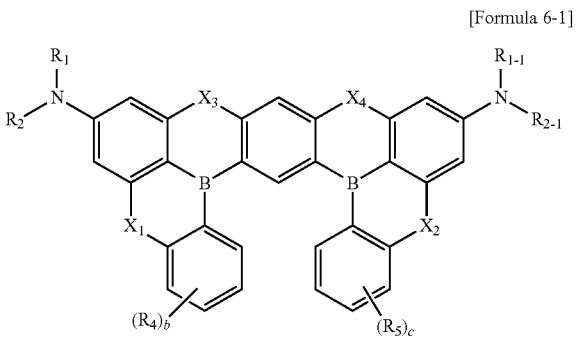

-continued

[Formula 6-2]

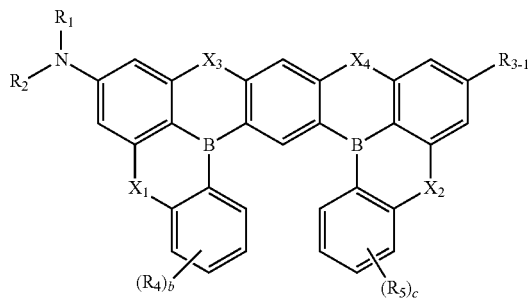

In Formula 6-1 and Formula 6-2 above, $R_{1-1}$ and $R_{2-1}$ may each independently be a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or may be bonded to an adjacent group to form a ring, $R_{3-1}$ may be a hydrogen atom, a deuterium atom, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, $R_4$ and $R_5$ may each independently be a hydrogen atom, a deuterium atom, a halogen atom, a cyano group, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, and $X_1$ to $X_4$, $R_1$, $R_2$, b, and c may be the same as defined in Formula 2.

In an embodiment, the fused polycyclic compound represented by Formula 1 may be one selected from Compound Group 1, which is explained below.

An embodiment provides an organic electroluminescence device which may include a first electrode, a second electrode facing the first electrode, and organic layers disposed between the first electrode and the second electrode, wherein at least one organic layer may include a fused polycyclic compound represented by Formula 1, and a polycyclic compound represented by Formula E-2b:

[Formula E-2b]

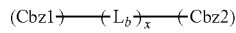

In Formula E-2b, Cbz1 and Cbz2 may each independently be an unsubstituted carbazole group, or a carbazole group substituted with an aryl group having 6 to 30 ring-forming carbon atoms, $L_b$ may be a direct linkage, a substituted or unsubstituted arylene group having 6 to 30 ring-forming carbon atoms, or a substituted or unsubstituted heteroarylene group having 2 to 30 ring-forming carbon atoms, and x may be an integer from 0 to 10.

In an embodiment, the organic layers may include a hole transport region disposed on the first electrode, an emission layer disposed on the hole transport region, and an electron transport region disposed on the emission layer, and the emission layer may include the fused polycyclic compound represented by Formula 1 and the polycyclic compound represented by Formula E-2b.

In an embodiment, the emission layer may be a delayed fluorescence emission layer including a host and a dopant, the host may include the polycyclic compound represented by Formula E-2b, and the dopant may include the fused polycyclic compound represented by Formula 1.

In an embodiment, a maximum emission wavelength of the emission layer may be in a range of about 450 nm to about 470 nm.

BRIEF DESCRIPTION OF THE DRAWINGS

The accompanying drawings are included to provide a further understanding of the embodiment, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
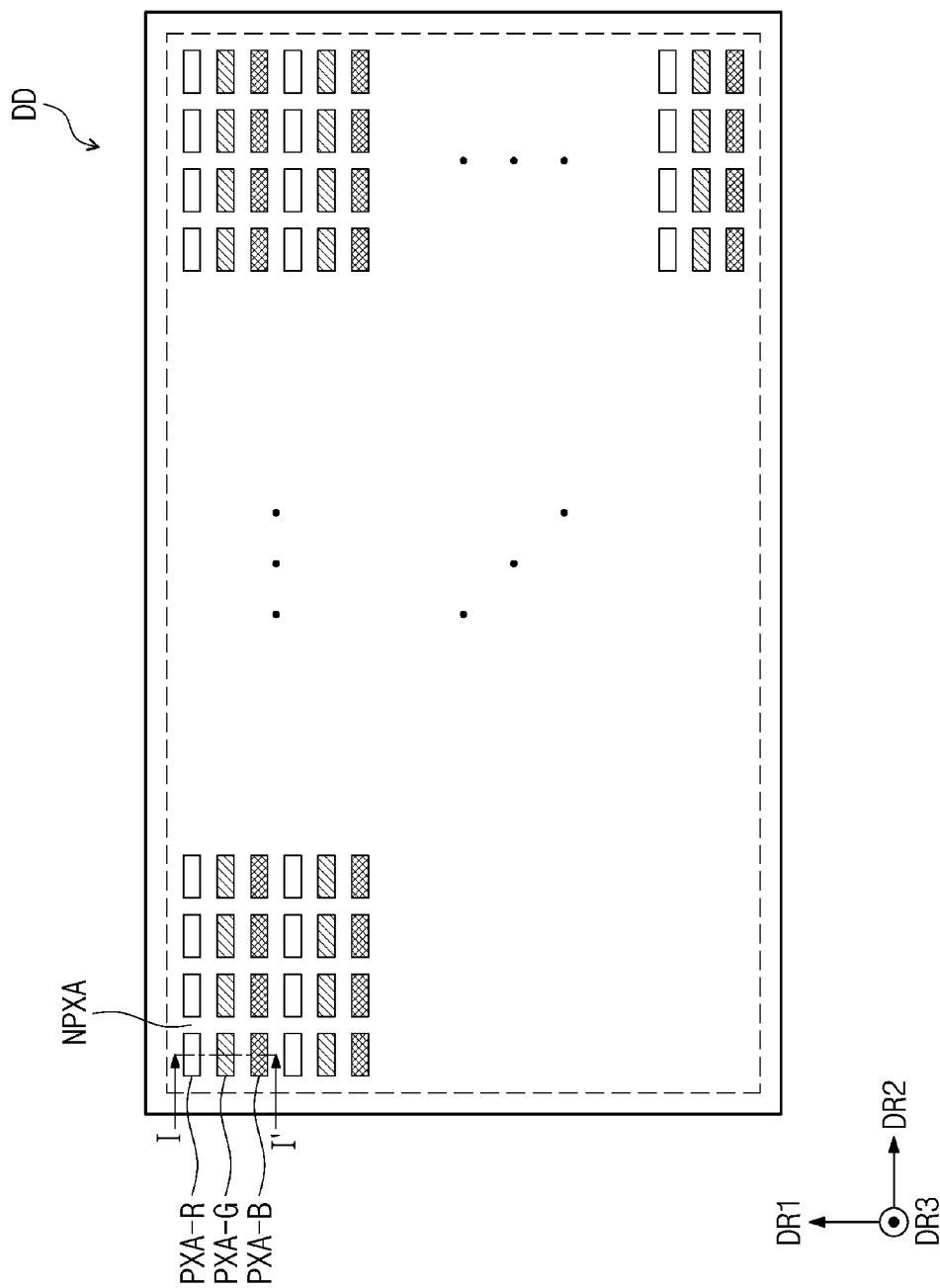
FIG. 1 is a plan view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, the organic electroluminescence device according to an embodiment will be explained with reference to attached drawings.

Figure 2:
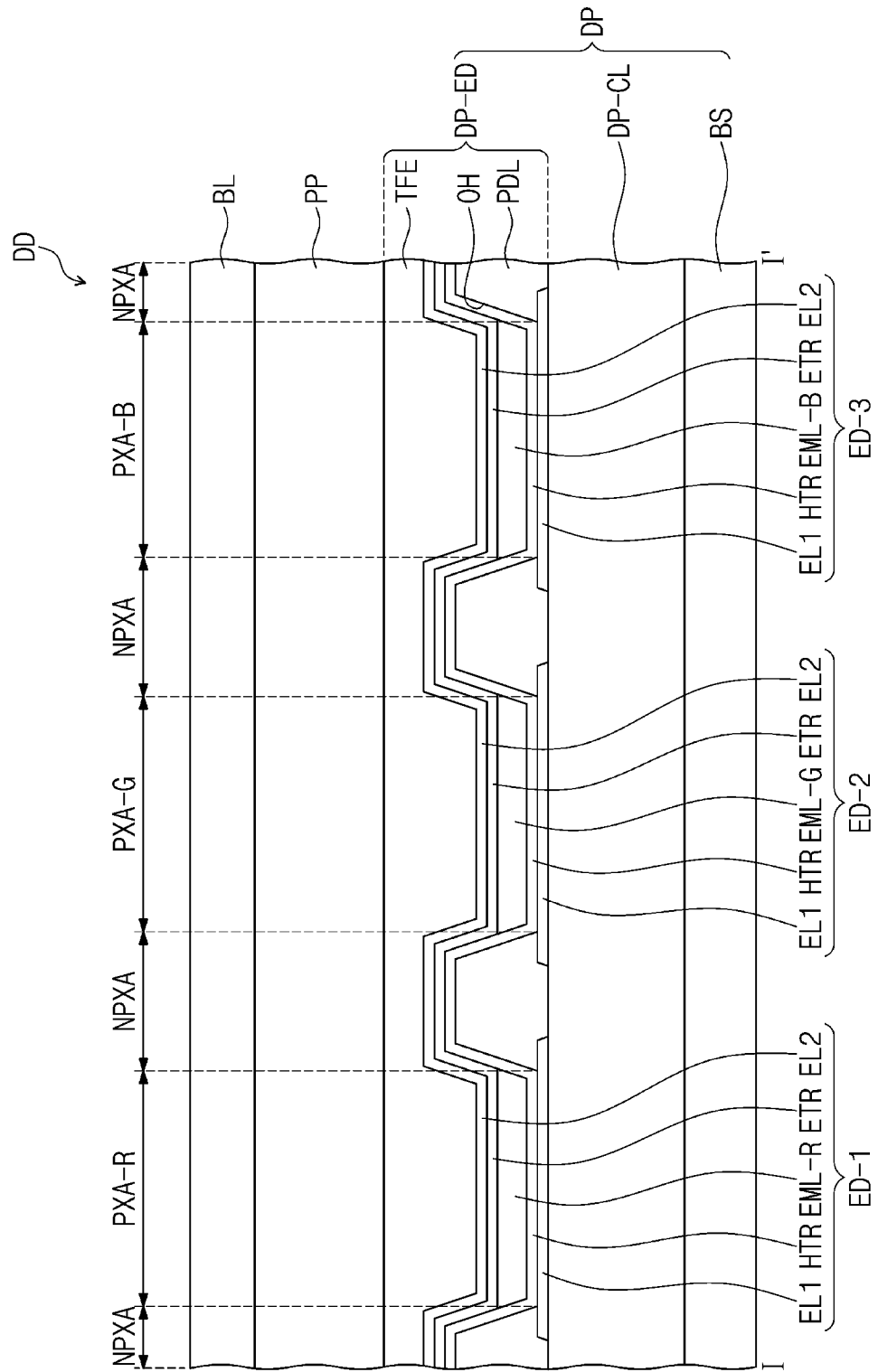
FIG. 2 is a schematic cross-sectional view illustrating a display apparatus according to an embodiment.

FIG. 1 is a plan view illustrating an embodiment of a display apparatus DD. FIG. 2 is a schematic cross-sectional view of the display apparatus DD of the embodiment. FIG. 2 is a schematic cross-sectional view illustrating a part taken along line I-I' of FIG. 1.

The display apparatus DD may include a display panel DP and an optical layer PP disposed on the display panel DP. The display panel DP includes organic electroluminescence devices ED-1, ED-2, and ED-3. The display apparatus DD may include multiples of each of the organic electroluminescence devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface on which the optical layer PP disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

The display apparatus DD according to an embodiment may further include a filling layer (not shown). The filling layer (not shown) may be disposed between a display device layer DP-ED and the base substrate BL. The filling layer (not shown) may be an organic material layer. The filling layer (not shown) may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the organic electroluminescence devices ED-1, ED-2, and ED-3 disposed between portions of the pixel defining film PDL, and an encapsulation layer TFE disposed on the organic electroluminescence devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor which drive the organic electroluminescence devices ED-1, ED-2, and ED-3 of the display device layer DP-ED.

Each of the organic electroluminescence devices ED-1, ED-2, and ED-3 may have a structure of an organic electroluminescence device ED of an embodiment according to FIGS. 3 to 6, which will be described later. The organic electroluminescence devices ED-1, ED-2, and ED-3 may each include a first electrode EL1 and a second electrode EL2, and organic layers disposed between the first electrode EL1 and the second electrode EL2. The organic layers may include, for example, a hole transport region HTR, emission layers EML-R, EML-G, and EML-B, and an electron transport region ETR.

FIG. 2 illustrates an embodiment in which the emission layers EML-R, EML-G, and EML-B of the organic electroluminescence devices ED-1, ED-2, and ED-3 are disposed in the openings OH defined in the pixel defining film PDL, and the hole transport region HTR, the electron transport region ETR, and the second electrode EL2 are each provided as a common layer in the entire organic electroluminescence devices ED-1, ED-2, and ED-3. However, embodiments are not limited thereto, and although not illustrated in FIG. 2, in an embodiment, the hole transport region HTR and the electron transport region ETR may each be provided by being patterned inside the openings OH defined in the pixel defining film PDL. For example, in an embodiment, the hole transport region HTR, the emission layers EML-R, EML-G, and EML-B, and the electron transport region ETR of the organic electroluminescence devices ED-1, ED-2, and ED-3 may each be patterned and provided by an inkjet printing method.

An encapsulation layer TFE may cover the organic electroluminescence devices ED-1, ED-2, and ED-3. The encapsulation layer TFE may seal the display device layer DP-ED. The encapsulation layer TFE may be a thin film encapsulation layer. The encapsulation layer TFE may be one layer or a lamination of multiple layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film may protect the display device layer DP-ED from moisture and/or oxygen, and the encapsulation-organic film may protect the display device layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic-based compound, an epoxy-based compound, or the like. The encapsulation-organic film may include a photopolymerizable organic material, but embodiments are not particularly limited thereto.

The encapsulation layer TFE may be disposed on the second electrode EL2 and may be disposed to fill the openings OH.

Referring to FIGS. 1 and 2, the display apparatus DD may include non-light emitting regions NPXA and light emitting regions PXA-R, PXA-G and PXA-B. The light emitting regions PXA-R, PXA-G and PXA-B may each be a region which emits light generated from the organic electroluminescence devices ED-1, ED-2, and ED-3, respectively. The light emitting regions PXA-R, PXA-G, and PXA-B may be spaced apart from each other in a plane.

Each of the light emitting regions PXA-R, PXA-G, and PXA-B may be a region separated from each other by the pixel defining film PDL. The non-light emitting regions NPXA may be regions between the adjacent light emitting regions PXA-R, PXA-G, and PXA-B, which correspond to portions of the pixel defining film PDL. In the specification, each of the light emitting regions PXA-R, PXA-G, and PXA-B may correspond to a pixel. The pixel defining film PDL may separate the organic electroluminescence devices ED-1, ED-2, and ED-3. The emission layers EML-R, EML-G and EML-B of the organic electroluminescence devices ED-1, ED-2 and ED-3 may be disposed in openings OH defined by the pixel defining film PDL and separated from each other.

The light emitting regions PXA-R, PXA-G, and PXA-B may be divided into groups according to the color of light generated from each of the organic electroluminescence devices ED-1, ED-2, and ED-3. In the display apparatus DD of an embodiment shown in FIGS. 1 and 2, three light emitting regions PXA-R, PXA-G, and PXA-B which respectively emit red light, green light, and blue light, are illustrated. For example, the display apparatus DD of an embodiment may include the red light emitting region PXA-R, the green light emitting region PXA-G, and the blue light emitting region PXA-B which are separated from one another.

In the display apparatus DD according to an embodiment, the organic electroluminescence devices ED-1, ED-2 and ED-3 may each emit light having wavelengths different from one another. For example, in an embodiment, the display apparatus DD may include a first organic electroluminescence device ED-1 that emits red light, a second organic electroluminescence device ED-2 that emits green light, and a third organic electroluminescence device ED-3 that emits blue light. For example, the red light emitting region PXA-R, the green light emitting region PXA-G, and the blue light emitting region PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light in a same wavelength range or at least one organic electroluminescence device may emit light in a wavelength range that is different from the others. For example, the first to third organic electroluminescence devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the red light emitting regions PXA-R, the green light emitting regions PXA-G, and the blue light emitting regions PXA-B may each be arranged along a second directional axis DR2. The red light emitting region PXA-R, the green light emitting region PXA-G, and the blue light emitting region PXA-B may be alternately arranged in this order along a first directional axis DR1.

FIGS. 1 and 2 illustrate that the light emitting regions PXA-R, PXA-G, and PXA-B all have a similar area, but embodiments are not limited thereto, and the light emitting regions PXA-R, PXA-G, and PXA-B may have different areas from each other according to a wavelength range of the emitted light. The areas of the light emitting regions PXA-R, PXA-G, and PXA-B may be areas in a plan view that are defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to display quality characteristics required for the display apparatus DD. For example, the arrangement form of the light emitting regions PXA-R, PXA-G, and PXA-B may be a PENTILE® arrangement form or a diamond arrangement form.

In an embodiment, the areas of the light emitting regions PXA-R, PXA-G, and PXA-B may be different from each other. For example, the area of the green light emitting region PXA-G may be smaller than that of the blue light emitting region PXA-B, but embodiments are not limited thereto.

Hereinafter, FIGS. 3 to 6 are each a schematic cross-sectional view illustrating an organic electroluminescence device according to embodiments. In each of the organic electroluminescence devices ED according to embodiments, a first electrode EL1 and a second electrode EL2 are disposed facing each other, and organic layers may be disposed between the first electrode EL1 and the second electrode EL2. The organic layers may include a hole transport region HTR, an emission layer EML, and an electron transport region ETR. For example, each of the organic electroluminescence devices ED according to embodiments may include the first electrode ELL the hole transport region HTR, the emission layer EML, the electron transport region ETR, and the second electrode EL2 that are stacked in that order.

The organic electroluminescence device ED of an embodiment may include a fused polycyclic compound according to an embodiment, which will be described below, in at least one organic layer among the organic layers disposed between the first electrode EL1 and the second electrode EL2. For example, the organic electroluminescence device ED of an embodiment may include a fused polycyclic compound according to an embodiment, which will be described below, in the emission layer EML disposed between the first electrode EL1 and the second electrode EL2. However, embodiments are not limited thereto, and the organic electroluminescence device ED of an embodiment may include a fused polycyclic compound according to an embodiment, which will be described later, in at least one organic layer which is included in the hole transport region HTR and the electron transport region ETR which are among the organic layers disposed between the first electrode EL1 and the second electrode EL2, or may include a fused polycyclic compound according to an embodiment, which will be described later, in the capping layer CPL disposed on the second electrode EL2.

Figure 3:
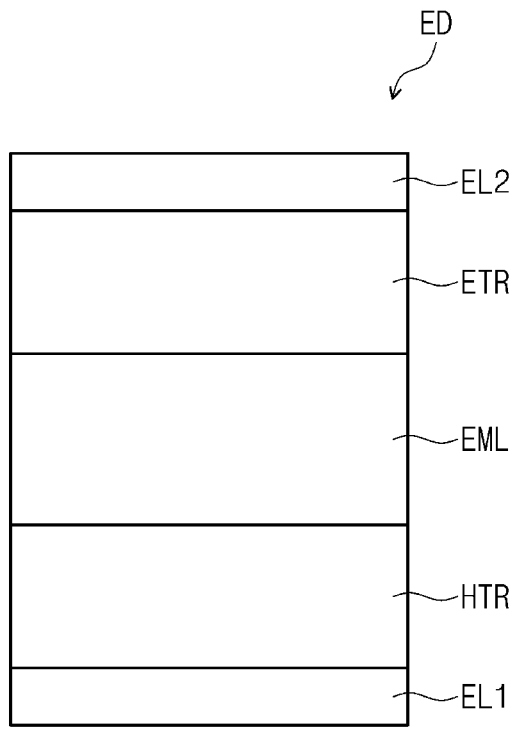
FIG. 3 is a schematic cross-sectional view illustrating an organic electroluminescence device according to an embodiment.
Figure 4:
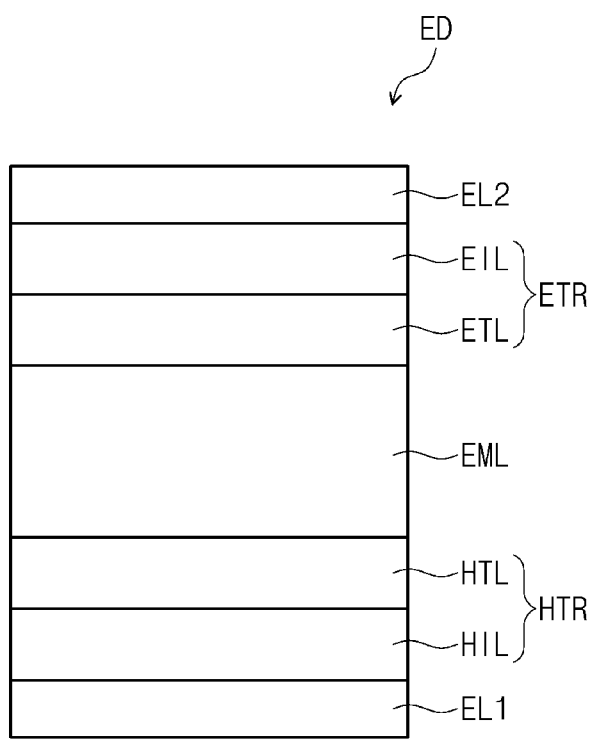
FIG. 4 is a schematic cross-sectional view illustrating an organic electroluminescence device according to an embodiment.
Figure 5:
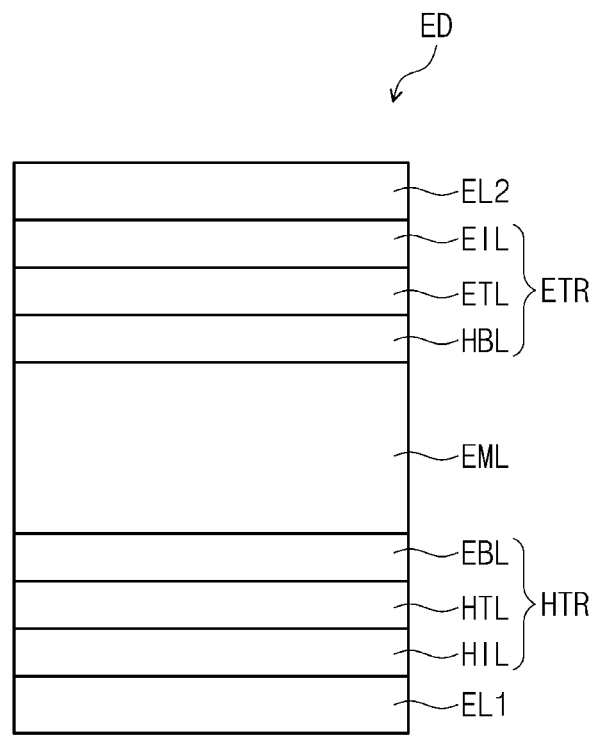
FIG. 5 is a schematic cross-sectional view illustrating an organic electroluminescence device according to an embodiment.
Figure 6:
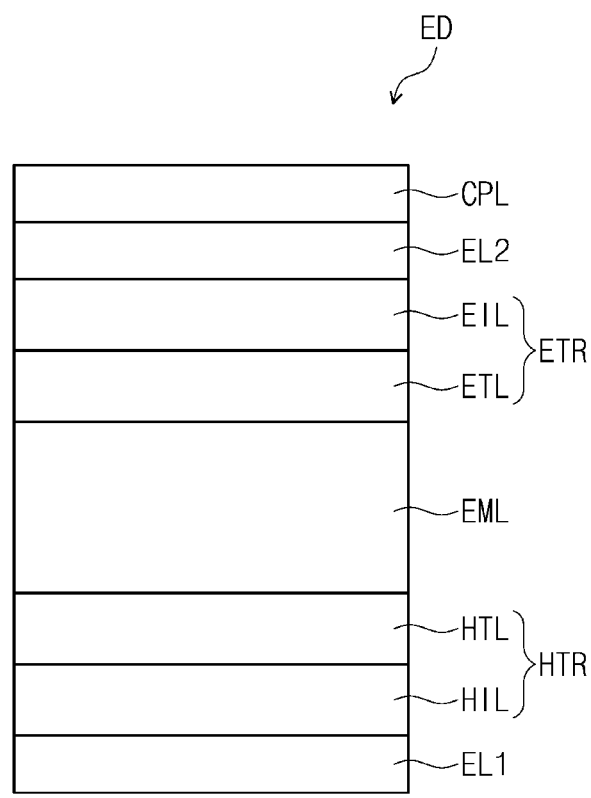
FIG. 6 is a schematic cross-sectional view illustrating an organic electroluminescence device according to an embodiment.

In comparison to FIG. 3, FIG. 4 illustrates a schematic cross-sectional view of an organic electroluminescence device ED of an embodiment, in which a hole transport region HTR includes a hole injection layer HIL and a hole transport layer HTL, and an electron transport region ETR includes an electron injection layer EIL and an electron transport layer ETL. In comparison to FIG. 3, FIG. 5 illustrates a schematic cross-sectional view of an organic electroluminescence device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of an organic electroluminescence device ED of an embodiment that includes a capping layer CPL disposed on a second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments are not limited thereto. The first electrode EL1 may include the above-described metal materials, combinations of at least two metal materials of the above-described metal materials, oxides of the above-described metal materials, or the like. A thickness of the first electrode EL1 may be in a range of about 700 Å to about 10,000 Å. For example, a thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission-auxiliary layer (not shown), or an electron blocking layer EBL. A thickness of the hole transport region HTR may be, for example, in a range of about 50 Å to about 15,000 Å.

The hole transport region HTR may be a layer formed of a single material, a layer formed of different materials, or a multilayer structure including a layers formed of different materials.

For example, the hole transport region HTR may have a single layer structure of the hole injection layer HIL or the hole transport layer HTL, or may have a single layer structure formed of a hole injection material and a hole transport material. The hole transport region HTR may have a single layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below:

[Formula H-1]

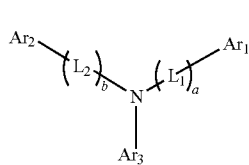

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 may be a monoamine compound. In another embodiment, the compound represented by Formula H-1 above may be a diamine compound in which at least one of $Ar_1$ to $Ar_3$ may include the amine group as a substituent. For example, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be any one selected from Compound Group H below. However, the compounds listed in Compound Group H are examples, and the compounds represented by Formula H-1 are not limited to Compound Group H:

[Compound Group H]

H-1-1

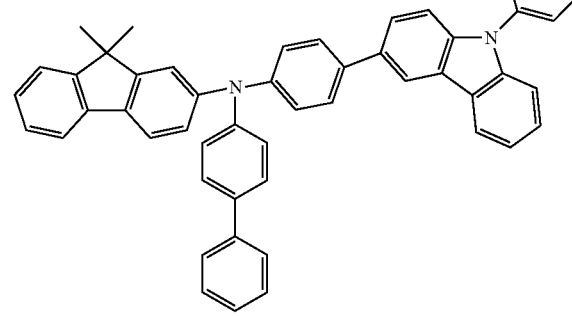

H-1-2

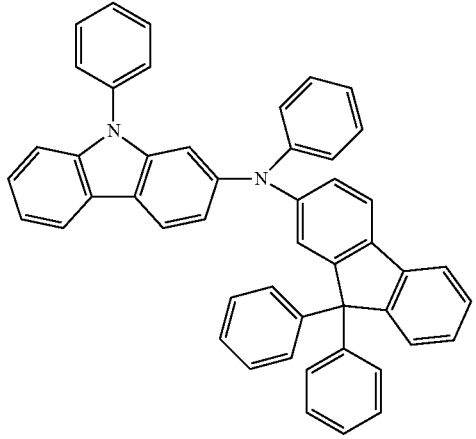

H-1-3

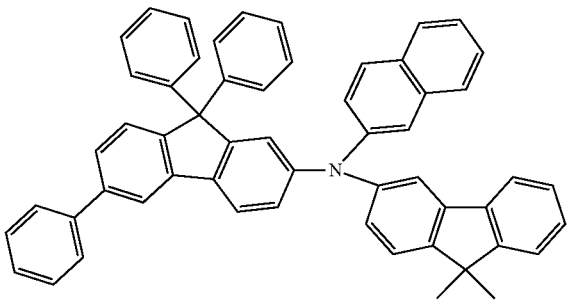

H-1-4

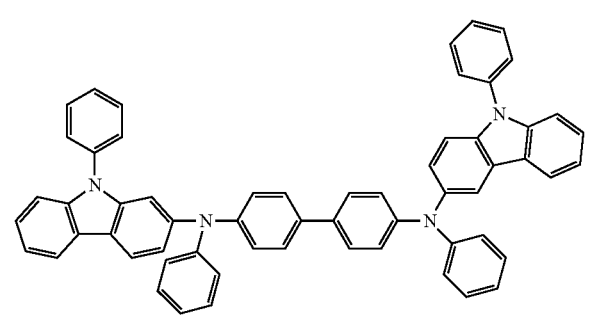

H-1-5

H-1-6
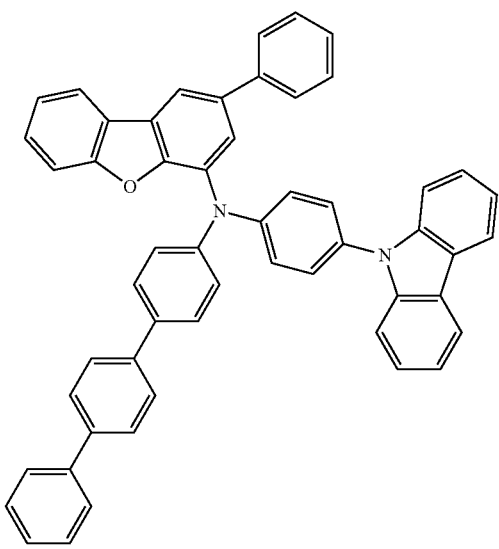
H-1-7
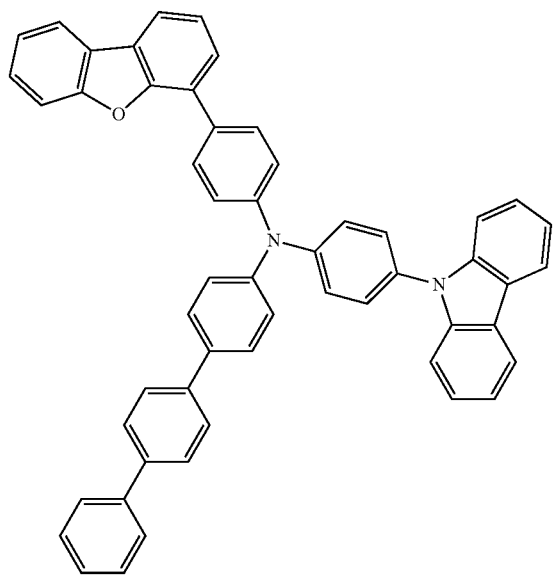
H-1-8
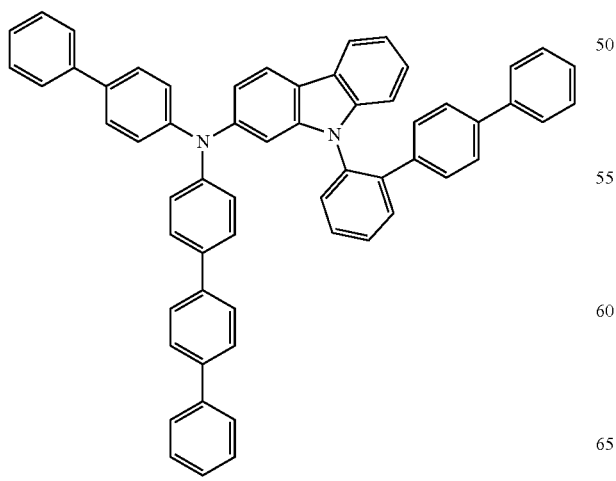
H-1-9
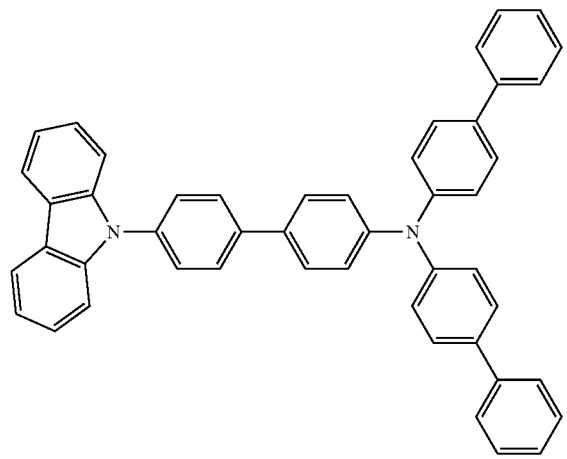
H-1-10
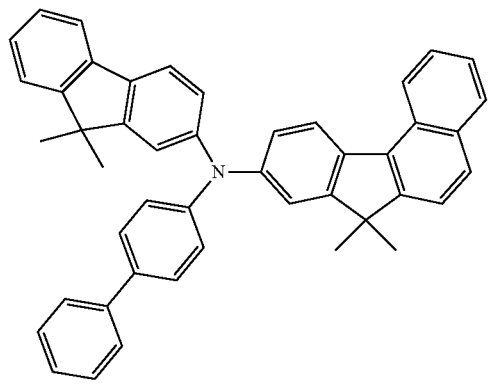
H-1-11
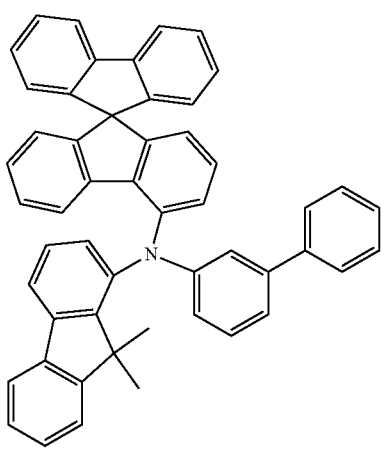

H-1-12
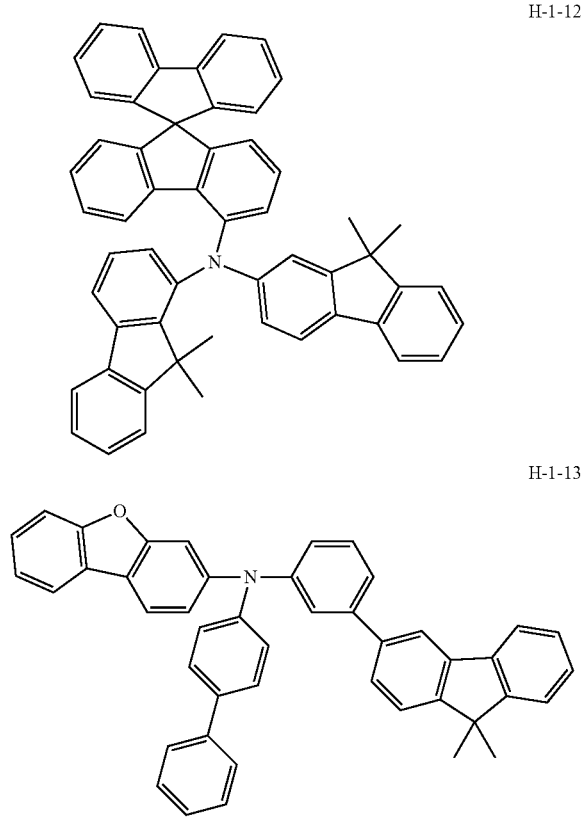
H-1-13
H-1-14
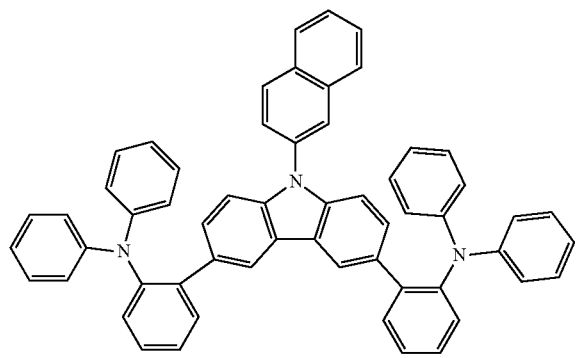
H-1-15
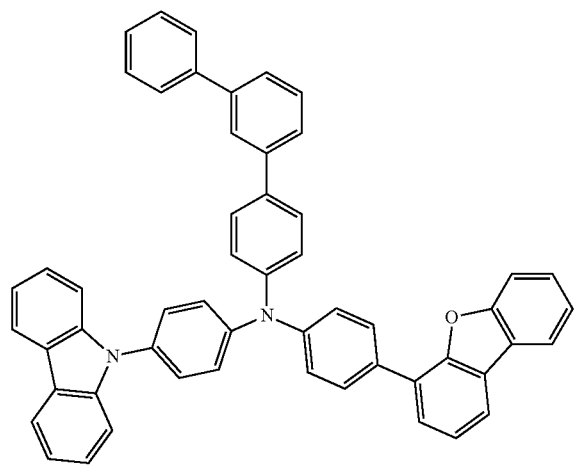
H-1-16
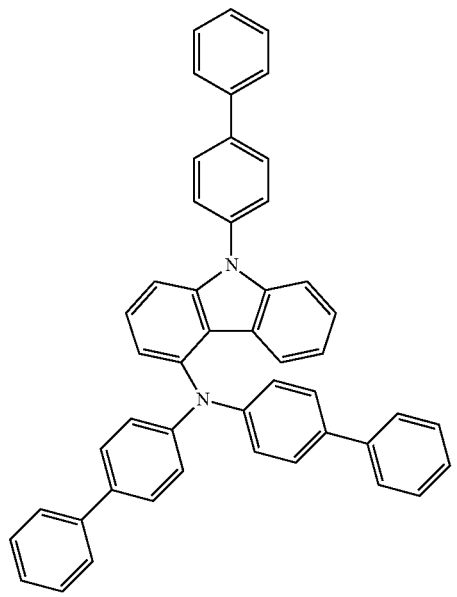
H-1-17
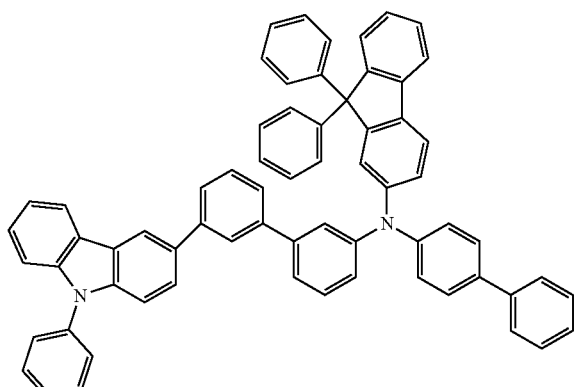
H-1-18
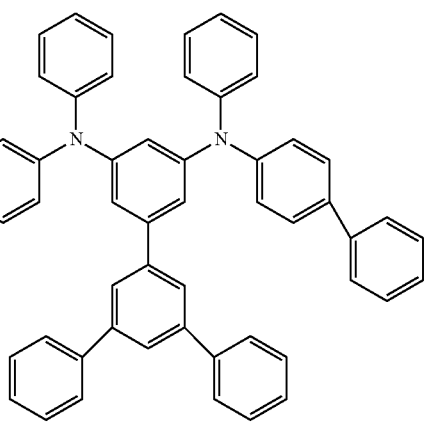

-continued

H-1-19

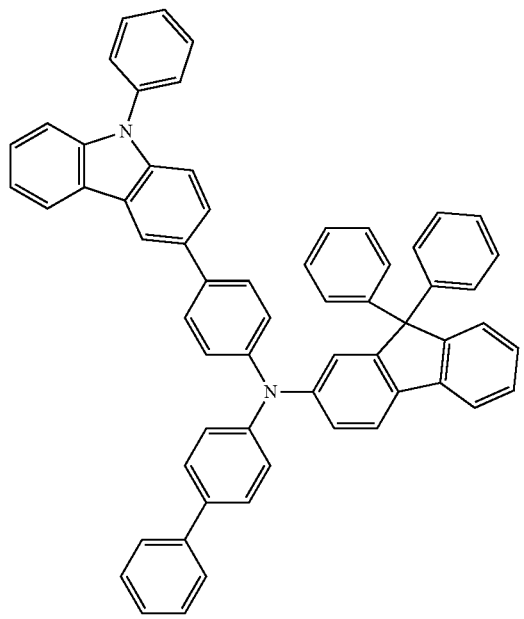

H-1-20

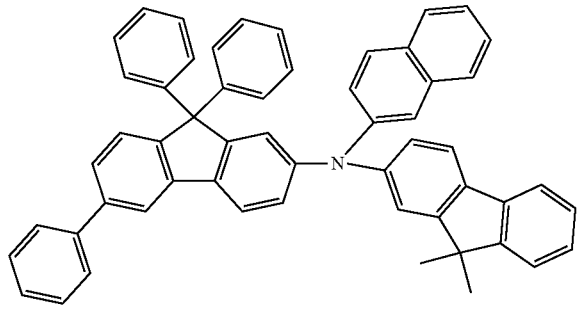

The hole transport region HTR may include a phthalocyanine compound such as copper phthalocyanine; $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f:2',3'-h]quinoxaline-2,3,6,7,10,11-hexacarbonitrile (HATCN), etc.

The hole transport region HTR may include a carbazole-based derivative such as N-phenyl carbazole and polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris (N-carbazolyl)triphenylamine (TCTA), N,N'-di (naphthalene-1-yl)-N,N'-diphenyl-benzidine (NPB), 4,4'-cyclohexylidene bis[N,N-bis(4-methylphenyl) benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, a thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. When the hole transport region HTR includes an electron blocking layer EBL, the electron blocking layer EBL may have a thickness in a range of about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include a charge generating material to increase conductivity. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments are not limited thereto. For example, the p-dopant may include a metal halide compound such as CuI and RbI, a quinone derivative such as tetracyanoquinodimethane (TCNQ) and 2,3,5,6-tetrafluoro-7,7'8,8-tetracyanoquinodimethane (F4-TCNQ), a metal oxide such as tungsten oxide and molybdenum oxide, a cyano group-containing compound such as dipyrazino[2,3-f:2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments are not limited thereto.

As described above, the hole transport region HTR may further include at least one of a buffer layer (not shown) or an electron blocking layer EBL in addition to the hole injection layer HIL and the hole transport layer HTL. The buffer layer (not shown) may compensate for a resonance distance according to a wavelength of light emitted from the emission layer EML and may thus increase light emission efficiency. A material that may be included in the hole transport region HTR may be used as a material in the buffer layer (not shown). The electron blocking layer EBL may prevent electron injection from the electron transport region ETR to the hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

The emission layer EML in the organic electroluminescence device ED of an embodiment may include a fused polycyclic compound of an embodiment.

In the specification the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkoxy group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the specification, the term "bonded to an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The rings formed by being bonded to an adjacent group may each be monocyclic or polycyclic. Rings which are formed by groups being bonded to each other may be connected to another ring to form a spiro structure.

In the specification, the term "adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, two methyl groups in dimethylamine may be interpreted as "adjacent groups" to each other.

In the specification, examples of the halogen atom may include a fluorine atom, a chlorine atom, a bromine atom, or an iodine atom.

In the specification, an alkyl group may be linear or branched. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, a cycloalkyl group may be a cyclic alkyl group. The number of carbon atoms in the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., but embodiments are not limited thereto.

In the specification, an alkenyl group may be a hydrocarbon group including at least one carbon-carbon double bond in the middle or a terminal end of an alkyl group having 2 or more carbon atoms. The alkenyl group may be a linear chain or a branched chain. The number of carbon atoms is not limited, but may be 2 to 30, 2 to 20 or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, an alkynyl group may be a hydrocarbon group including at least one carbon-carbon triple bond in the middle or a terminal end of an alkyl group having 2 or more carbon atoms. The alkynyl group may be a linear chain or a branched chain. The number of carbon atoms is not limited, but may be 2 to 30, 2 to 20 or 2 to 10. Examples of the alkynyl group may include an ethynyl group, a propynyl group, etc., without limitation.

In the specification, a hydrocarbon ring may be an optional functional group or substituent which is derived from an aliphatic hydrocarbon ring, or an optional functional group or substituent which is derived from an aromatic hydrocarbon ring. The number of ring-forming carbon atoms in the hydrocarbon ring may be 5 to 60, 5 to 30, or 5 to 20.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., but embodiments are not limited thereto.

In the specification, a fluorenyl group may be substituted, and two substituents may be combined with each other to form a spiro structure. Examples of substituted fluorenyl groups are as follows. However, embodiments are not limited thereto.

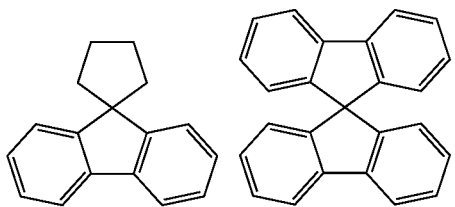

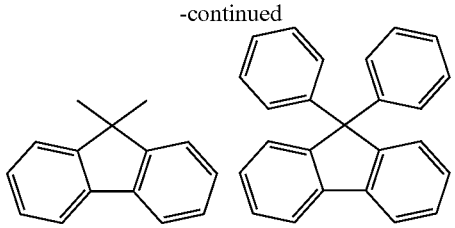

In the specification, a heterocyclic group may be any functional group or substituent derived from a ring containing at least one of B, O, N, P, Si, or S as a heteroatom. The heterocyclic group may include an aliphatic heterocyclic group and an aromatic heterocyclic group. The aromatic heterocyclic group may be a heteroaryl group. The aliphatic heterocycle and the aromatic heterocycle may each be monocyclic or polycyclic.

In the specification, a heterocyclic group may include at least one of B, O, N, P, Si, or S as a heteroatom. If a heterocyclic group includes two or more heteroatoms, the two or more heteroatoms may be the same as or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, or 2 to 10.

In the specification, an aliphatic heterocyclic group may include at least one of B, O, N, P, Si or S as a heteroatom. The number of ring-forming carbon atoms in the aliphatic heterocyclic group may be 2 to 60, 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyrane group, a 1,4-dioxane group, etc., without limitation.

In the specification, a heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 60, 2 to 30, 2 to 20, or 2 to 10. Examples of the heteroaryl group may include thiophene, furan, pyrrole, imidazole, triazole, pyridine, bipyridine, pyrimidine, pyrazine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the specification, the above description of the alkyl group may be applied to an alkylene group, except that the alkylene group is a divalent group. The above description of the aryl group may be applied to an arylene group, except that the arylene group is a divalent group. The above description of the heteroaryl group may be applied to a heteroarylene group, except that the heteroarylene group is a divalent group.

In the specification, a silyl group may be an alkylsilyl group or an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenyl silyl, etc. However, embodiments are not limited thereto.

In the specification, a thio group may be an alkylthio group or an arylthio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments are not limited thereto.

In the specification, an oxy group may be an oxygen atom that is bonded to an alkyl group or an aryl group as defined above. The oxy group may be an alkoxy group or an aryl oxy group. The alkoxy group may be a linear, branched, or ring type. The number of carbon atoms in the alkoxy group is not limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but embodiments are not limited thereto.

In the specification, the number of carbon atoms in an amine group is not limited, but may be 1 to 30. The amine group may include an alkyl amine group, an aryl amine group, or a heteroaryl amine group. Examples of the amine group may include a methylamine group, a dimethylamine group, a phenylamine group, a diphenylamine group, a naphthylamine group, a 9-methyl-anthracenylamine group, etc., but embodiments are not limited thereto.

In the specification, the alkyl group in an alkyl silyl group, an alkyl thio group, an alkyl aryl group, and an alkyl amine group may be the same as the examples of the alkyl group described above.

In the specification, the aryl group in an aryl oxy group, an aryl thio group, an aryl amine group, and an aryl silyl group may be the same as the examples of the aforementioned aryl group.

In the specification, a direct linkage may be a single bond.

A fused polycyclic compound of an embodiment may be represented by Formula 1:

[Formula 1]

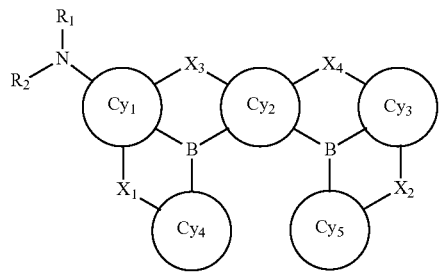

In Formula 1, $Cy_1$ to $Cy_5$ may each independently be a substituted or unsubstituted aromatic hydrocarbon ring, or a substituted or unsubstituted aromatic heterocycle.

In Formula 1, $X_1$ to $X_4$ may each independently be $C(R_{10})(R_{11})$, $N(R_{12})$, O, S, or Se.

In Formula 1, $R_1$ and $R_2$ may each independently be a substituted or unsubstituted silyl group, a substituted or unsubstituted alkyl group having 1 to 20 carbon atoms, or a substituted or unsubstituted cycloalkyl group having 3 to 20 ring-forming carbon atoms, or may be bonded to an adjacent group to form a ring.

In Formula 1, $R_{10}$ to $R_{12}$ may each independently be a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

In an embodiment, the fused polycyclic compound represented by Formula 1 may be represented by Formula 2:

[Formula 2]

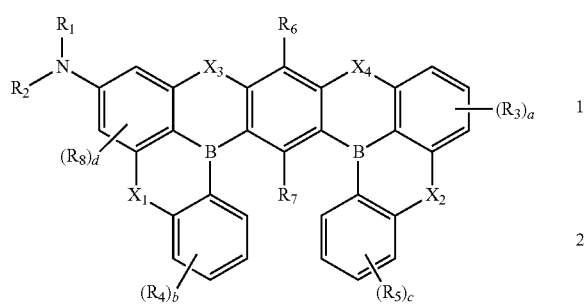

In Formula 2, $R_3$ to $R_8$ may each independently be a hydrogen atom, a deuterium atom, a halogen atom, a cyano group, a substituted or unsubstituted oxy group, a substituted or unsubstituted amine group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or may be bonded to an adjacent group to form a ring.

In Formula 2, a may be an integer from 0 to 3, and when a is 2 or more, multiple $R_3$ groups may be the same as or different from each other.

In Formula 2, b and c may each independently be an integer from 0 to 4. When b is 2 or more, multiple $R_4$ groups may be the same as or different from each other, and when c is 2 or more, multiple $R_5$ groups may be the same as or different from each other.

In Formula 2, d may be an integer from 0 to 2. When d is 2 or more, multiple $R_8$ groups may be the same as or different from each other.

In Formula 2, $X_1$ to $X_4$, $R_1$, and $R_2$ may be the same as defined in Formula 1.

In an embodiment, the fused polycyclic compound represented by Formula 2 may be represented by any one of Formula 3-1 to Formula 3-3:

[Formula 3-1]

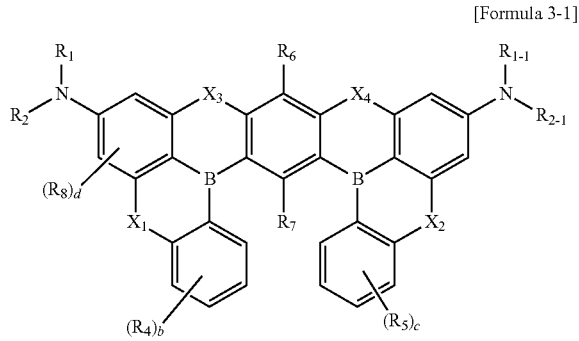

[Formula 3-2]

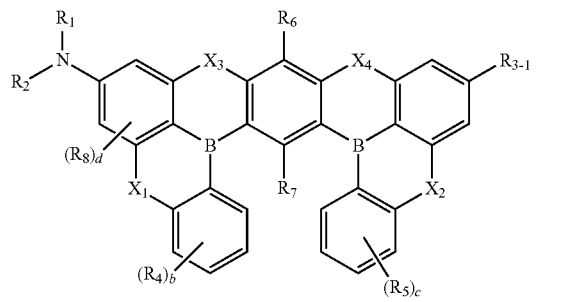

[Formula 3-3]

In Formula 3-1, $R_{1-1}$ and $R_{2-1}$ may each independently be a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or may be bonded to an adjacent group to form a ring.

In Formula 3-2, $R_{3-1}$ may be a hydrogen atom, a deuterium atom, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms.

In Formula 3-3, $X_5$ may be $N(R_{13})$, O, or S, and Ria may be a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

In Formula 3-1 to Formula 3-3, $R_4$ to $R_8$ may each independently be a hydrogen atom, a deuterium atom, a halogen atom, a cyano group, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms.

In Formula 3-1 to Formula 3-3, $X_1$ to $X_4$, $R_1$, $R_2$, and b to d may be the same as defined in Formula 2.

In an embodiment, the fused polycyclic compound represented by Formula 2 may be represented by Formula 4-1 or Formula 4-2:

[Formula 4-1]

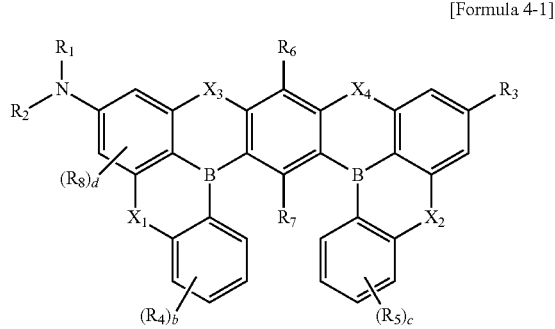

[Formula 4-2]

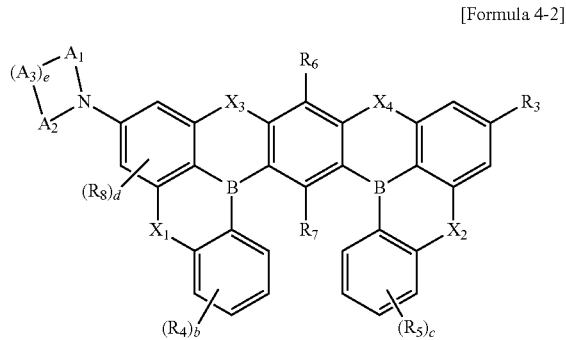

In Formula 4-1, $R_1$ and $R_2$ may each independently be a substituted or unsubstituted silyl group, a substituted or unsubstituted alkyl group having 1 to 10 carbon atoms, or a substituted or unsubstituted cycloalkyl group having 3 to 20 ring-forming carbon atoms.

In Formula 4-2, $A_1$ to $A_3$ may each independently be a substituted or unsubstituted alkylene group having 1 to 20 carbon atoms.

In Formula 4-2, e may be an integer from 0 to 5, and when e is 2 or more, multiple $A_3$ groups may be the same as or different from each other.

In Formula 4-1 to Formula 4-2, $X_1$ to $X_4$, $R_3$ to $R_8$, and b to d may be the same as defined in Formula 2.

In the fused polycyclic compound of an embodiment, any one of $X_1$ to $X_4$ may be represented by $N(Ar_4)$, and $Ar_4$ may be a substituted or unsubstituted aryl group having 6 to 30 ring-forming carbon atoms.

In the fused polycyclic compound of an embodiment, two of $X_1$ to $X_4$ may each independently be represented by $N(Ar_4)$, and $Ar_4$ may be a substituted or unsubstituted aryl group having 6 to 30 ring-forming carbon atoms.

In the fused polycyclic compound of an embodiment, three of $X_1$ to $X_4$ may each independently be represented by $N(Ar_4)$, and $Ar_4$ may be a substituted or unsubstituted aryl group having 6 to 30 ring-forming carbon atoms.

In the fused polycyclic compound of an embodiment, $X_1$ to $X_4$ may each independently be represented by $N(Ar_4)$, and $Ar_4$ may be a substituted or unsubstituted aryl group having 6 to 30 ring-forming carbon atoms.

In an embodiment, the fused polycyclic compound represented by Formula 2 may be represented by any one of Formula 5-1 to Formula 5-4:

[Formula 5-1]

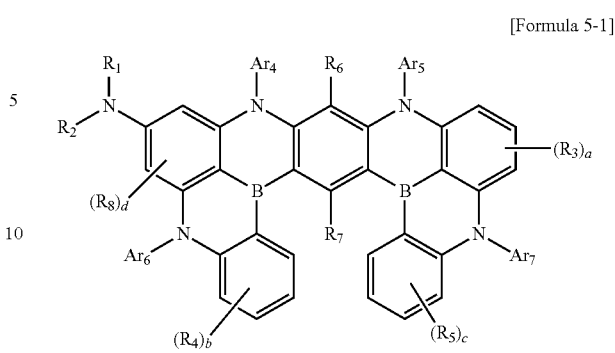

[Formula 5-2]

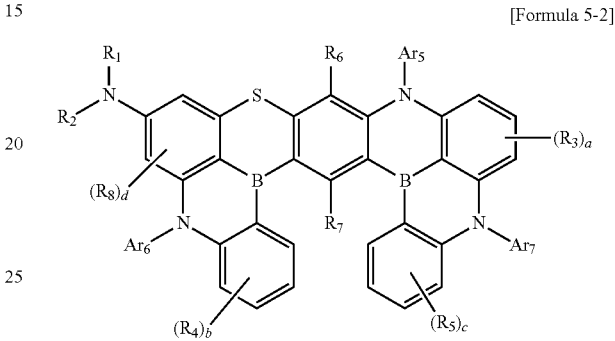

[Formula 5-3]

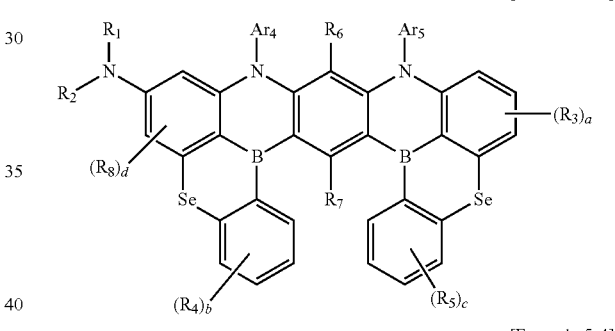

[Formula 5-4]

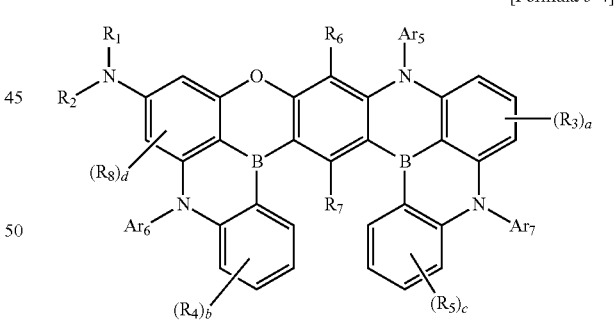

In Formula 5-1 to Formula 5-4, $Ar_4$ to $Ar_7$ may each independently be a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

In Formula 5-1 to Formula 5-4, $R_1$ to $R_8$, and a to d may be the same as defined in Formula 2.

In an embodiment, the fused polycyclic compound represented by Formula 2 may be represented by Formula 6-1 or Formula 6-2:

[Formula 6-1]

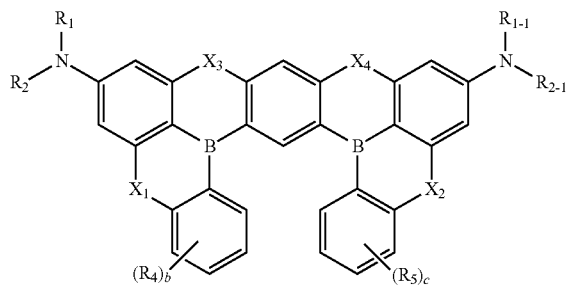

[Formula 6-2]

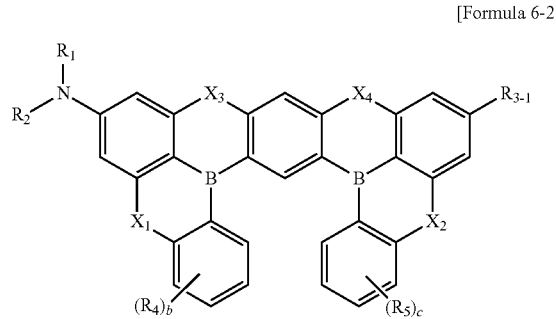

In Formula 6-1, $R_{1-1}$ and $R_{2-1}$ may each independently be a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or may be bonded to an adjacent group to form a ring.

In Formula 6-2, $R_{3-1}$ may be a hydrogen atom, a deuterium atom, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms.

In Formula 6-1 and Formula 6-2, $R_4$ and $R_5$ may each independently be a hydrogen atom, a deuterium atom, a halogen atom, a cyano group, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms.

In Formula 6-1 and Formula 6-2, $X_1$ to $X_4$, $R_1$, $R_2$, b, and c may be the same as defined in Formula 2.

The fused polycyclic compound of an embodiment may be any one selected from Compound Group 1. The organic electroluminescence device ED of an embodiment may include at least one fused polycyclic compound selected from Compound Group 1 in the emission layer EML.

[Compound Group 1]

1

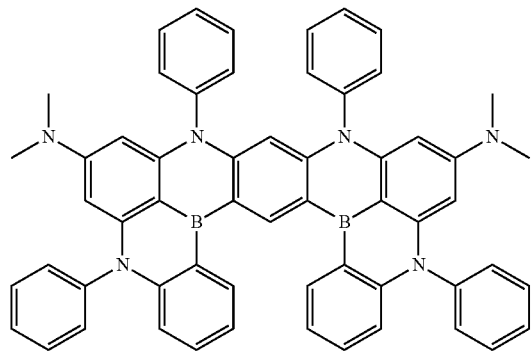

2

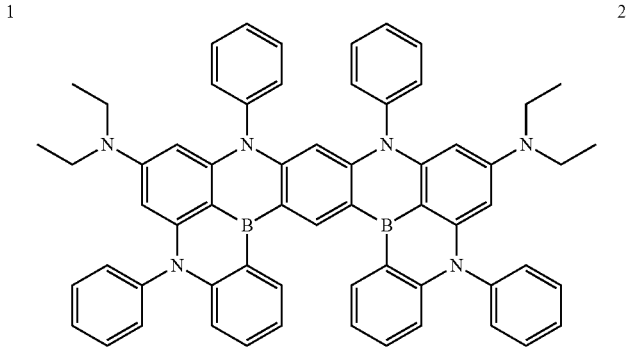

3

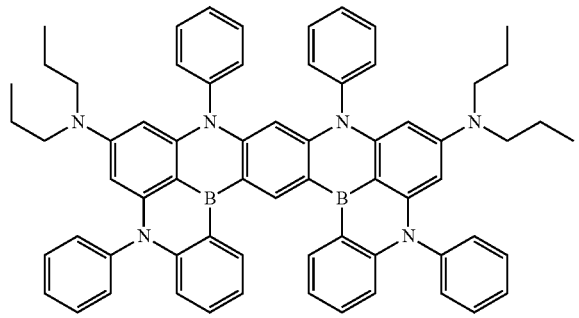

4

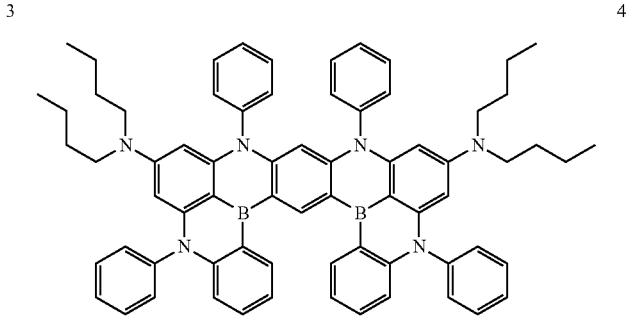

5
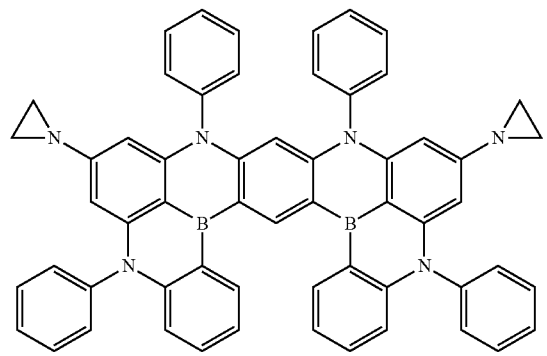
6
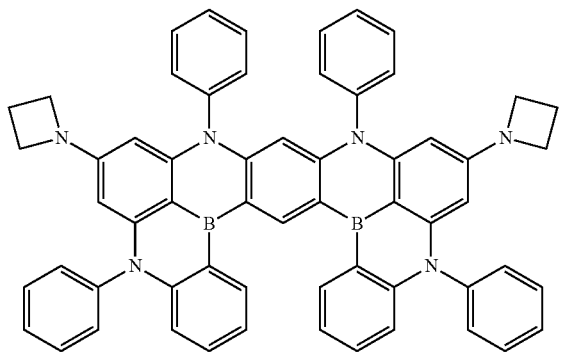
7
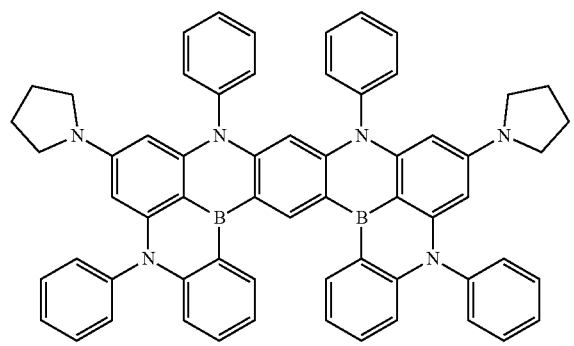
8
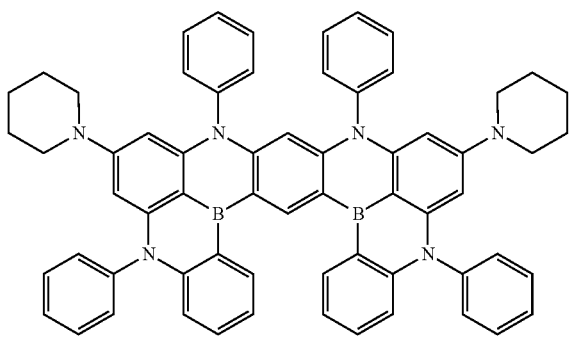
9
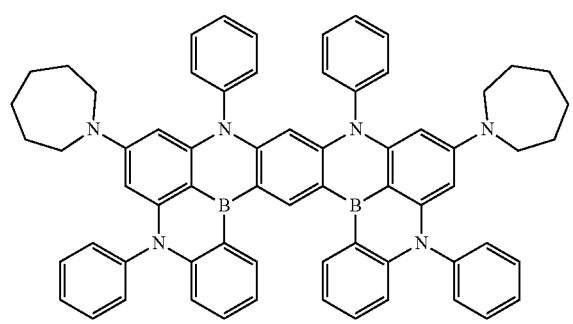
10
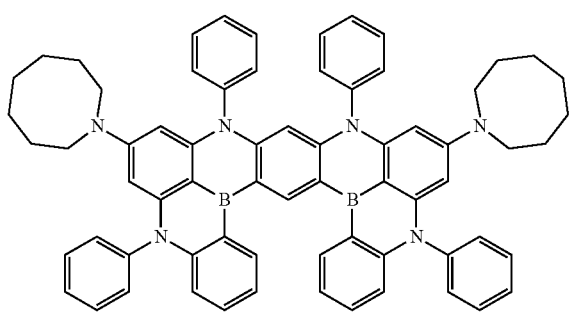
11
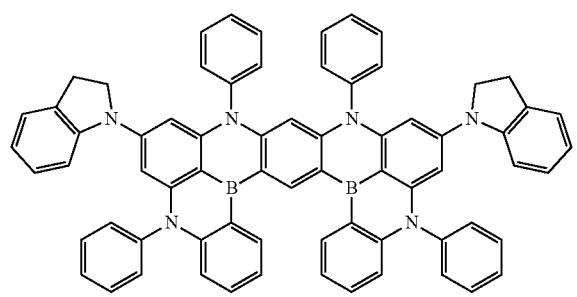
12
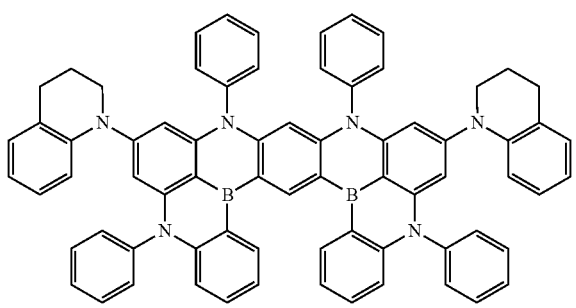

-continued
13
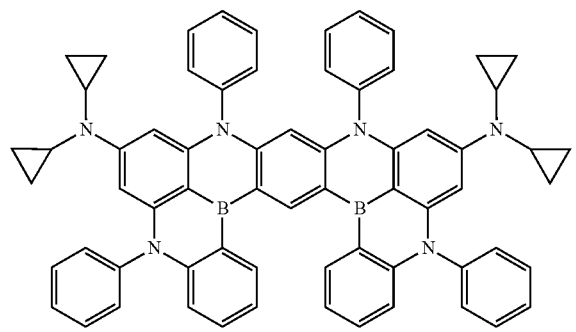
14
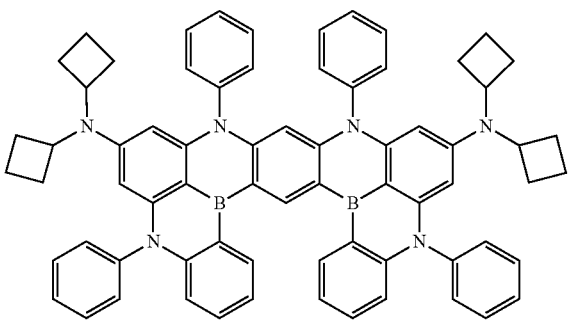
15
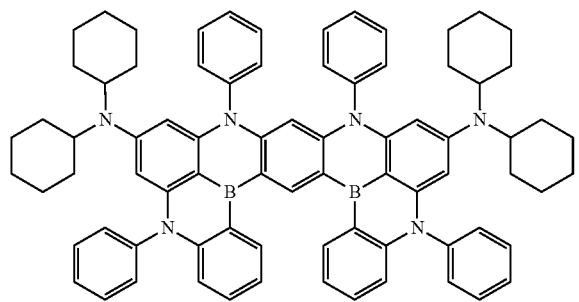
16
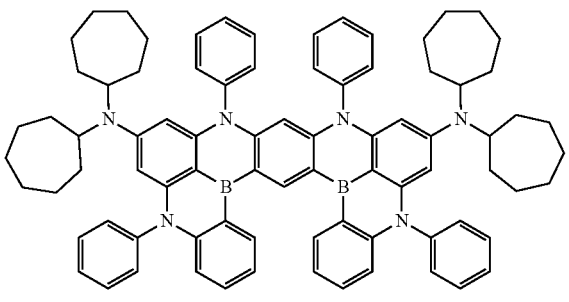
17
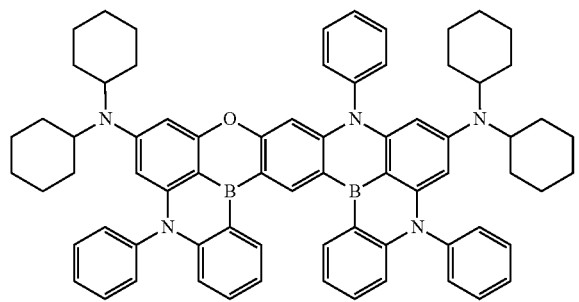
18
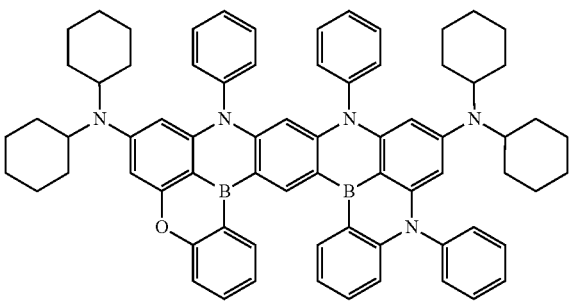
19
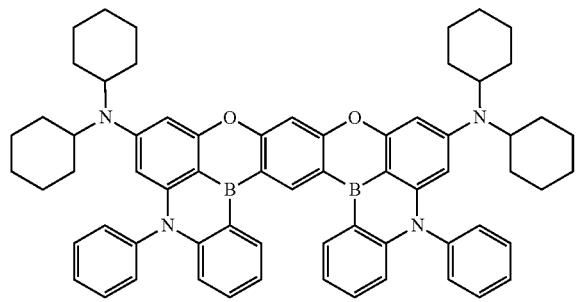
20
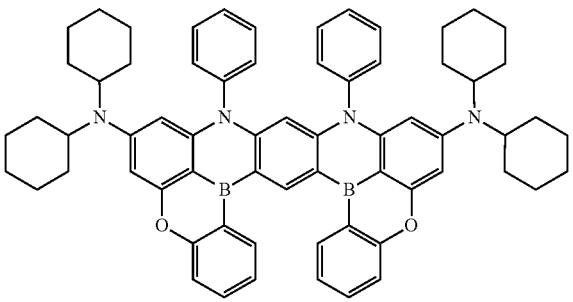
21
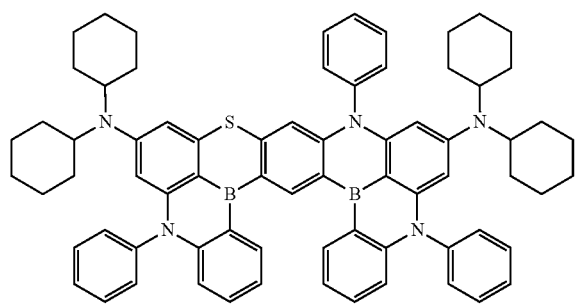
22
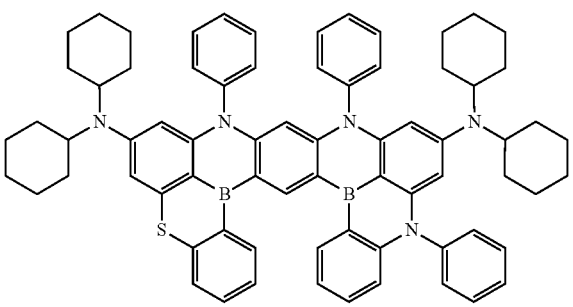

-continued
23
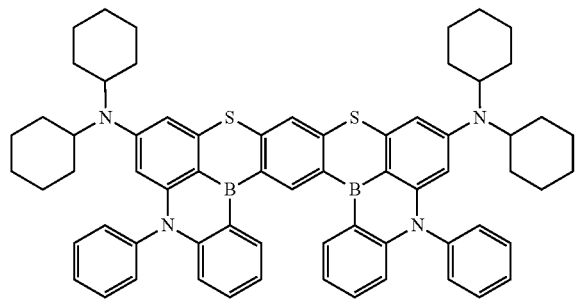
24
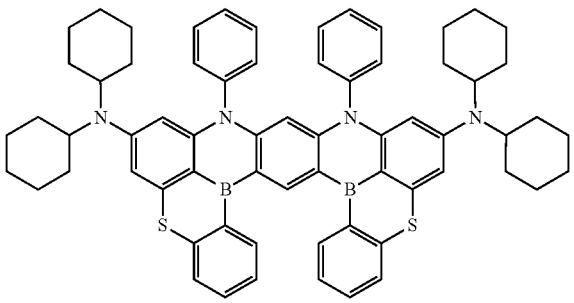
25
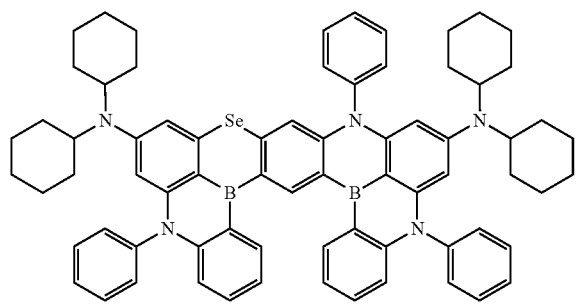
26
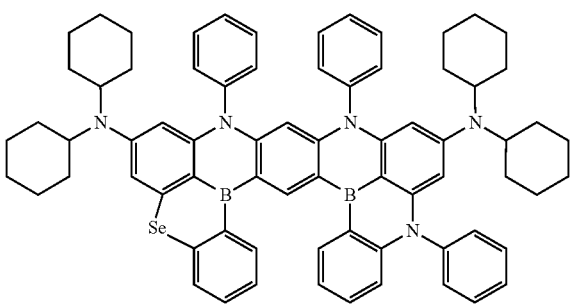
27
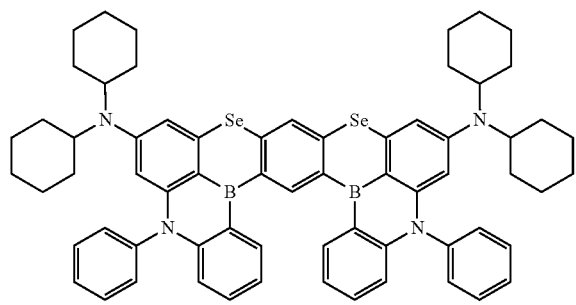
28
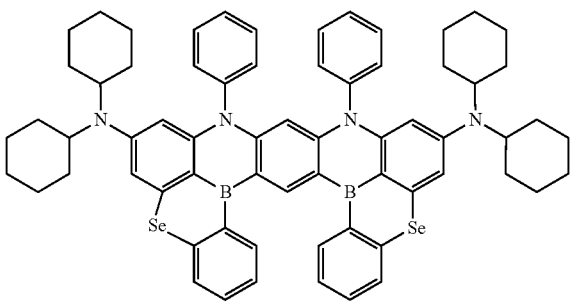
29
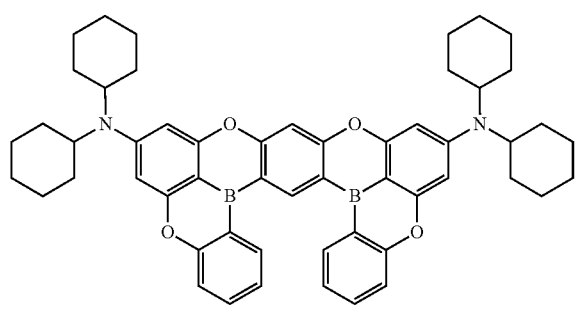
30
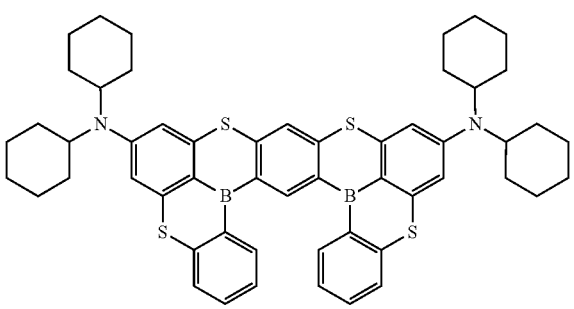
31
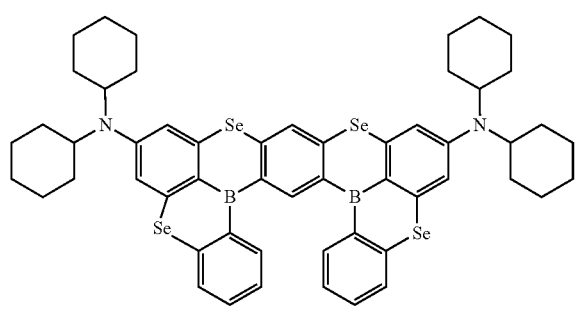
32
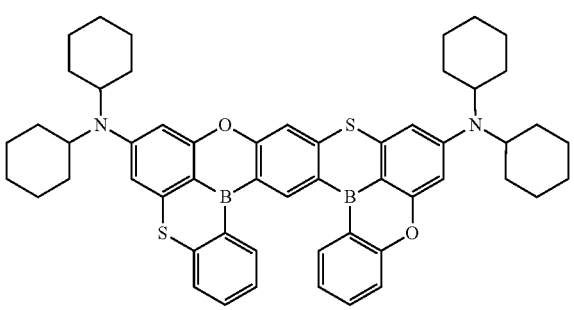

-continued
33
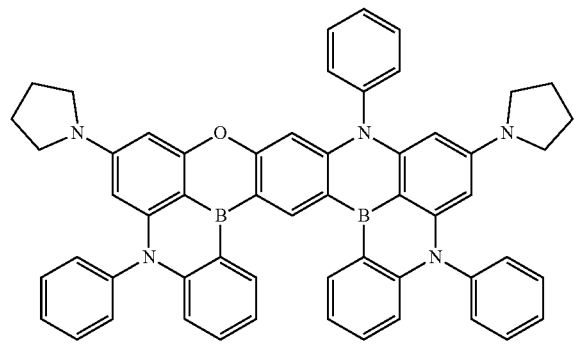
34
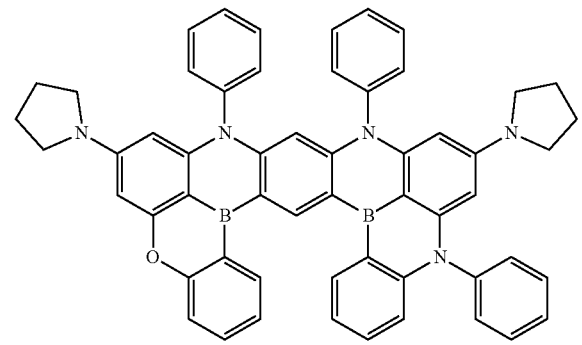
35
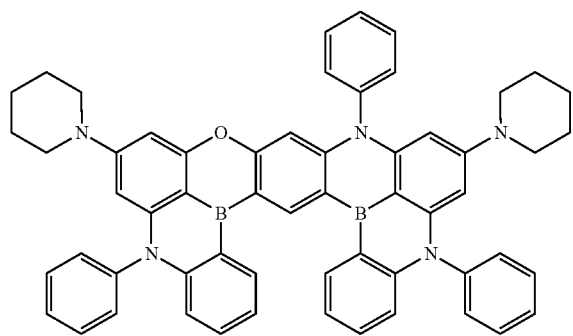
36
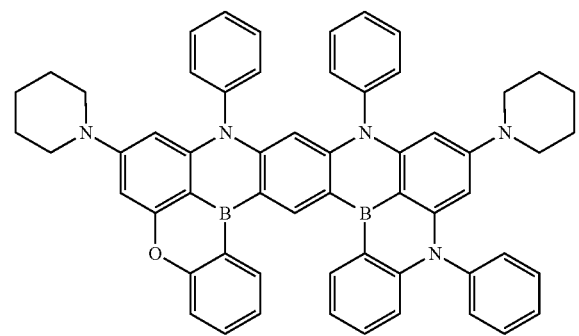
37
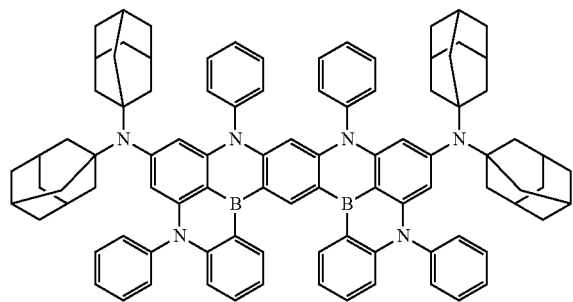
38
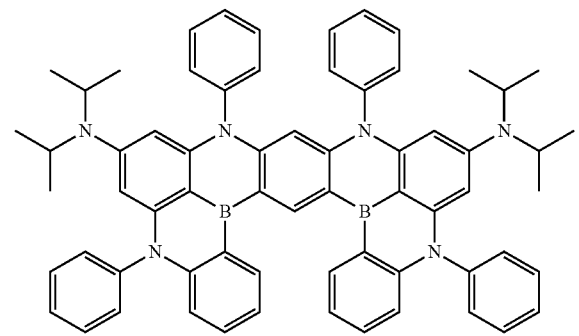
39
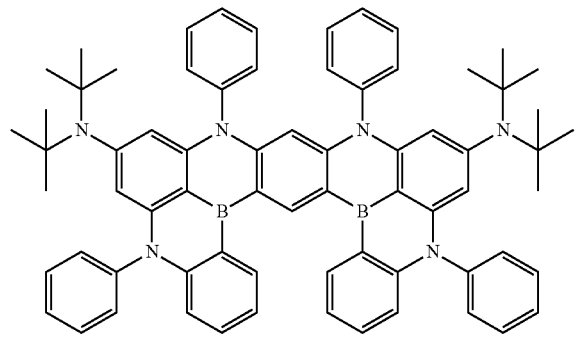
40
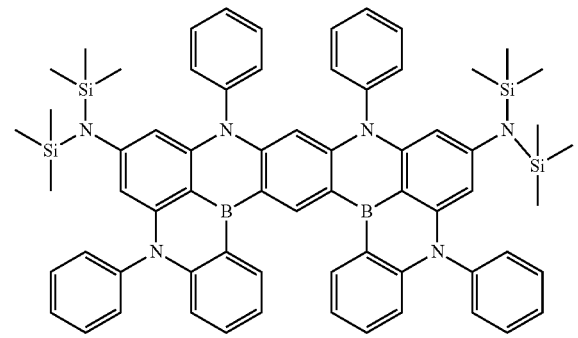

-continued
41
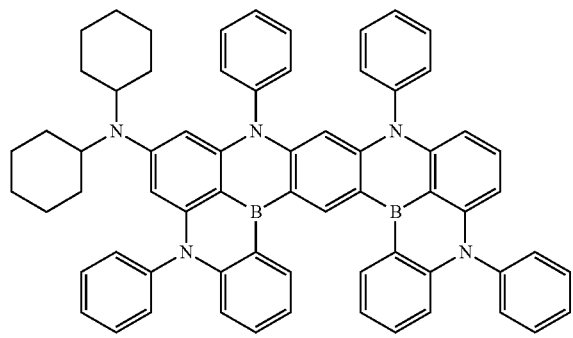
42
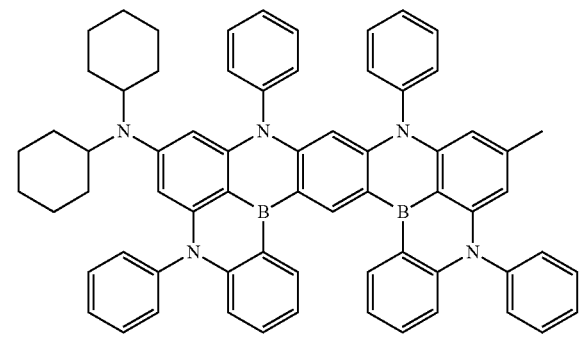
43
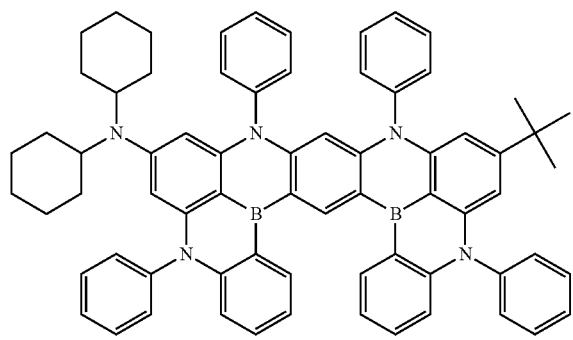
44
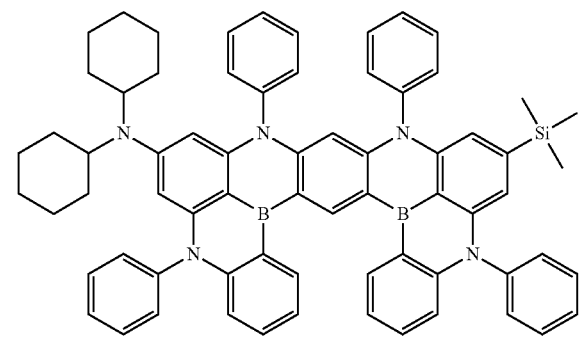
45
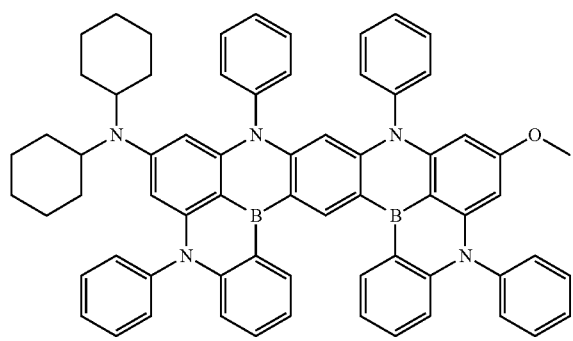
46
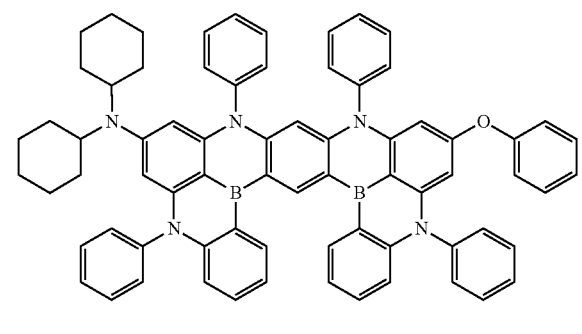
47
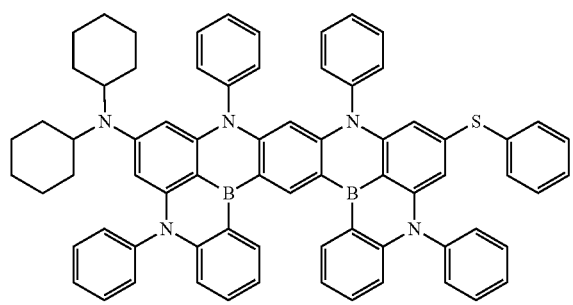
48
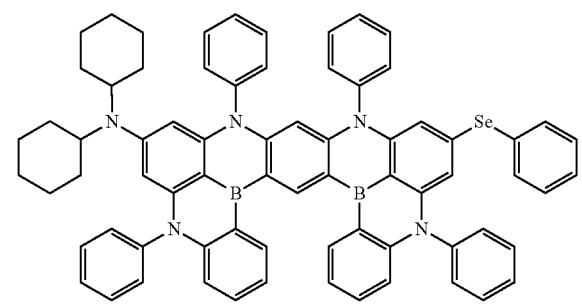

-continued
49
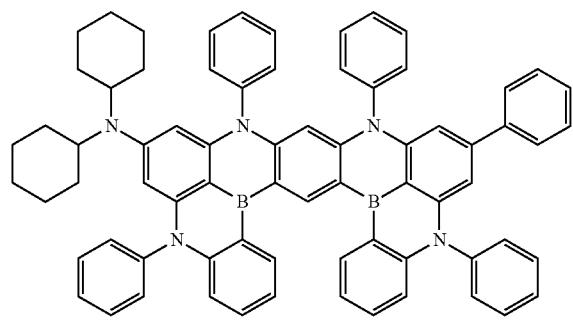
50
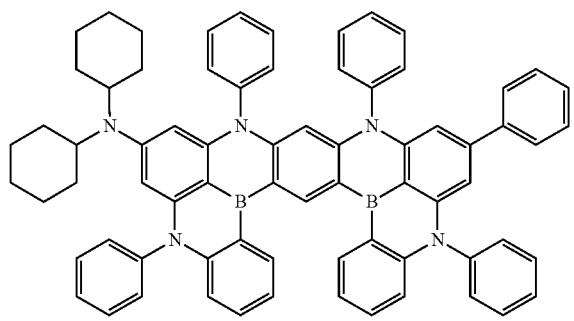
51
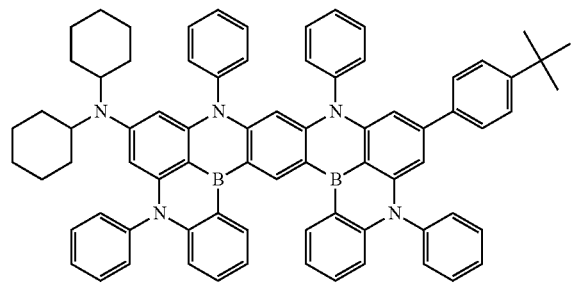
52
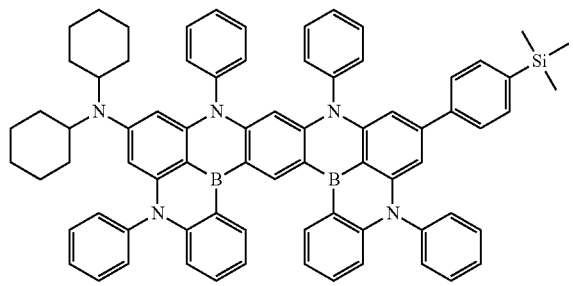
53
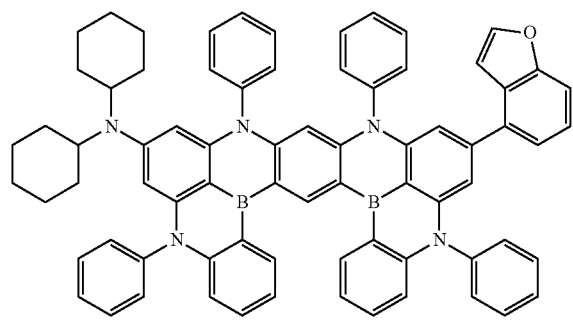
54
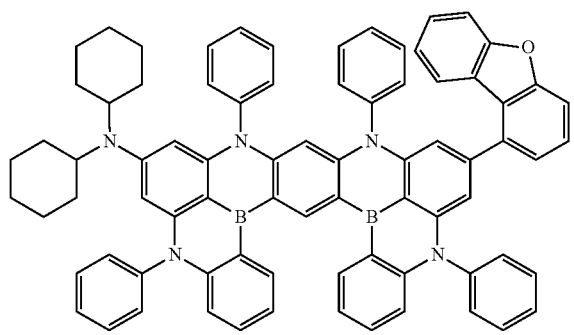
55
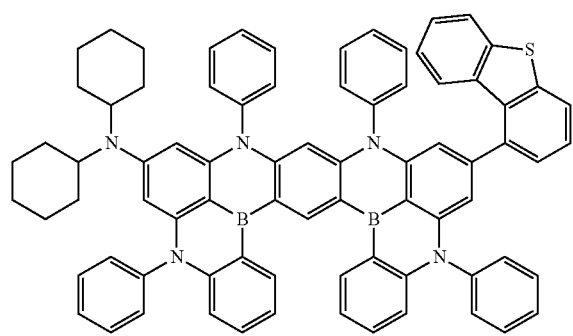
56
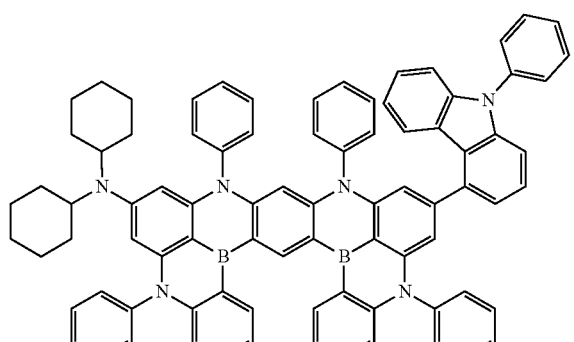

-continued
57
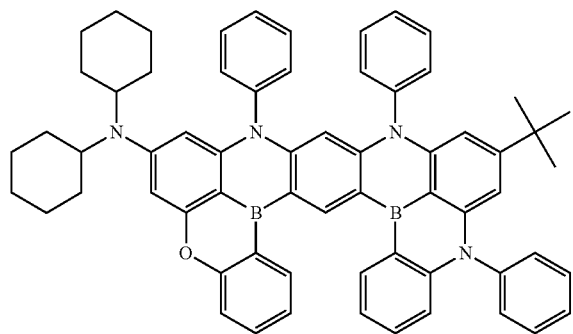
58
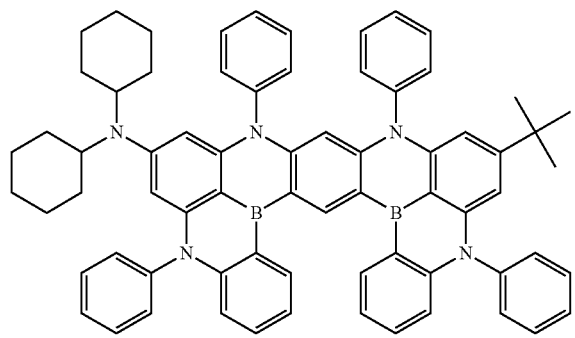
59
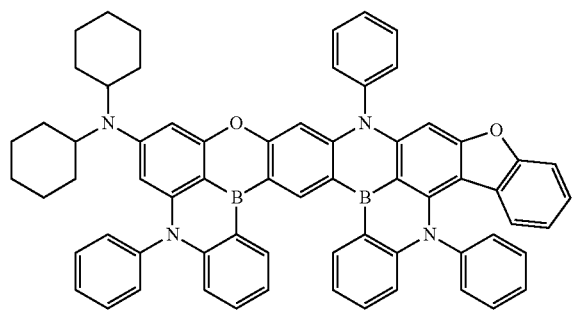
60
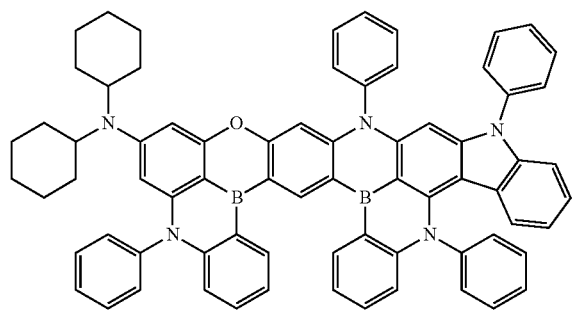
61
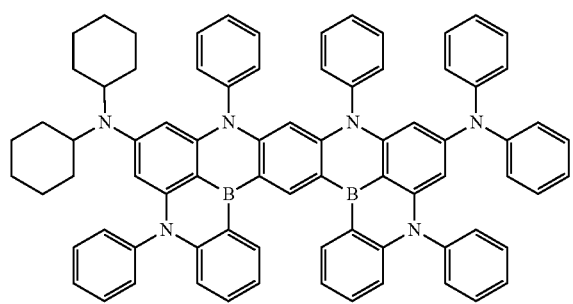
62
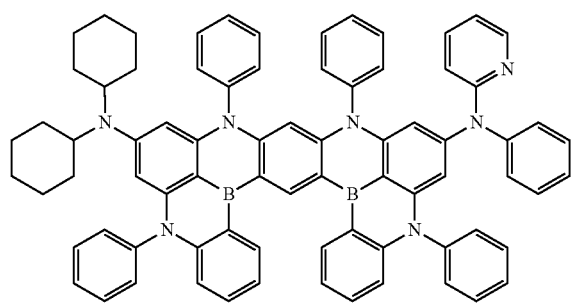
63
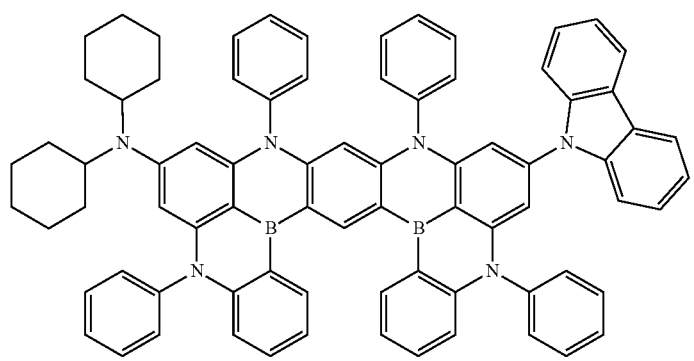

-continued
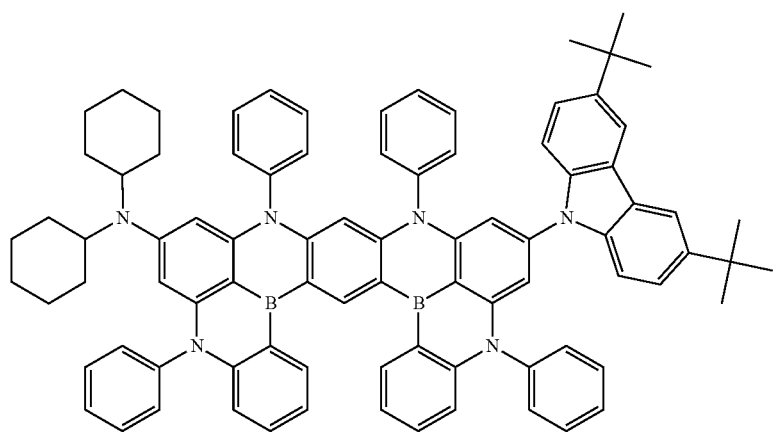
64
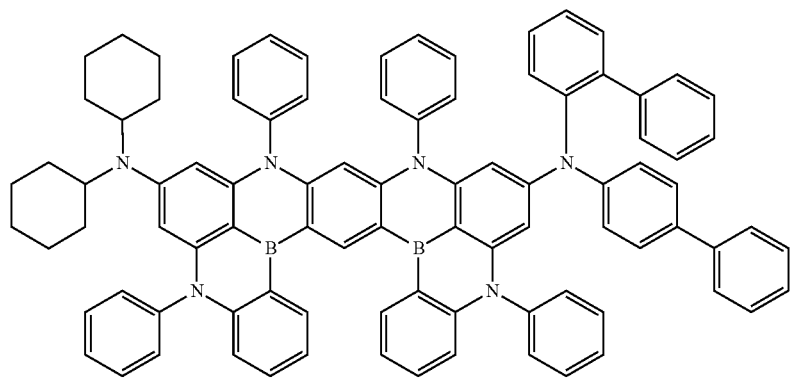
65
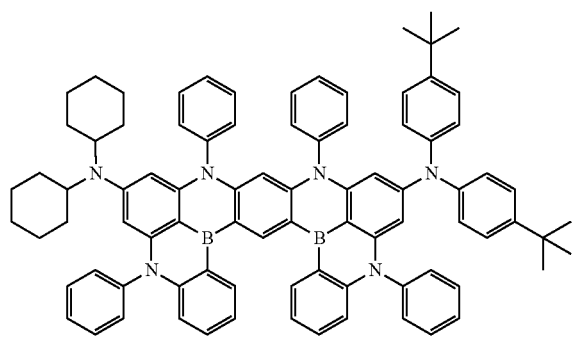
66
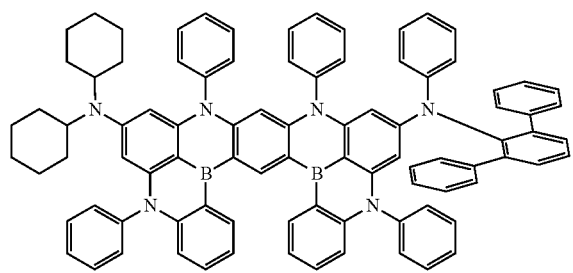
68
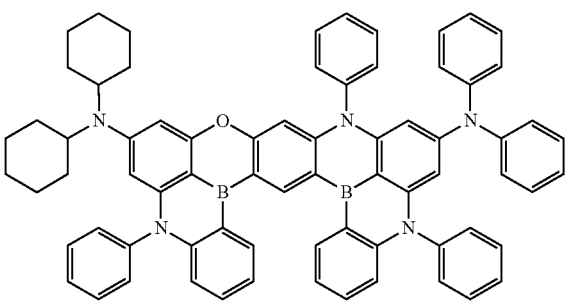
69

-continued
70
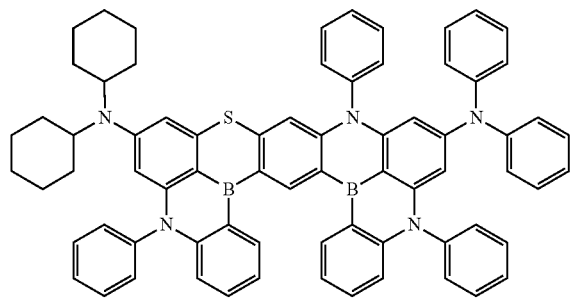
71
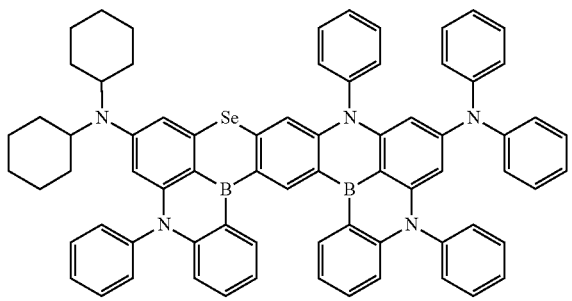
72
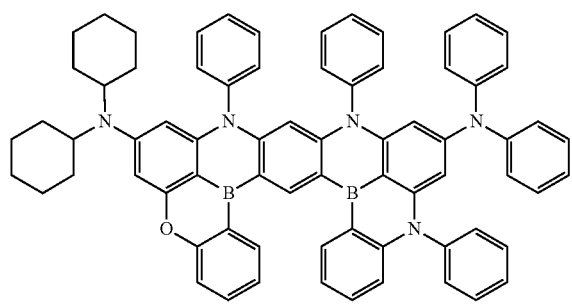
73
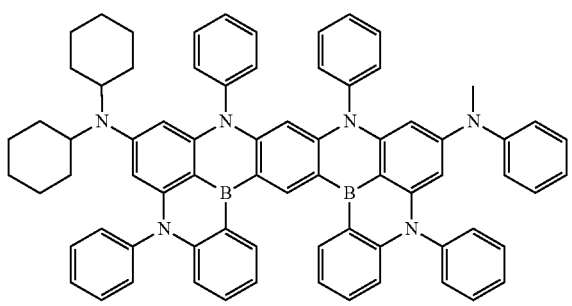
74
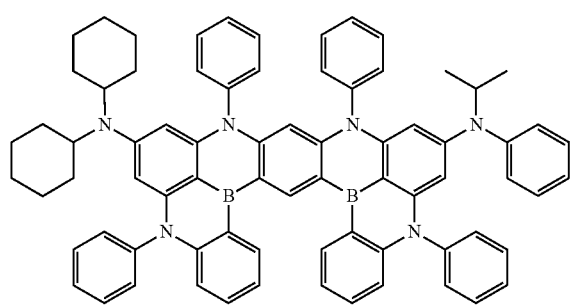
75
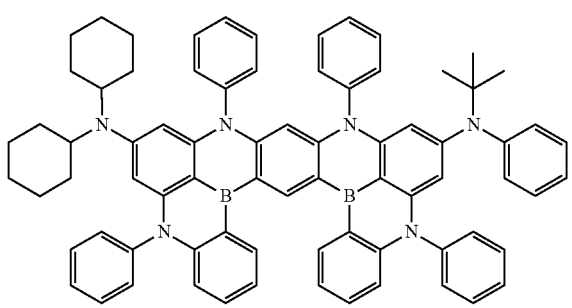
76
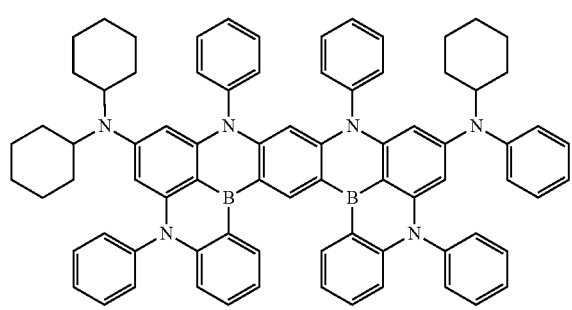
77
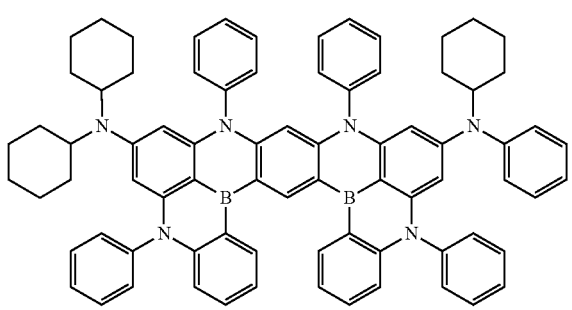
78
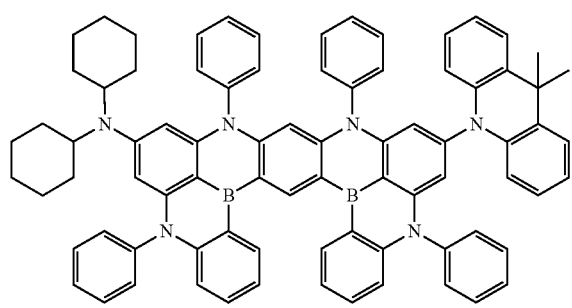
79
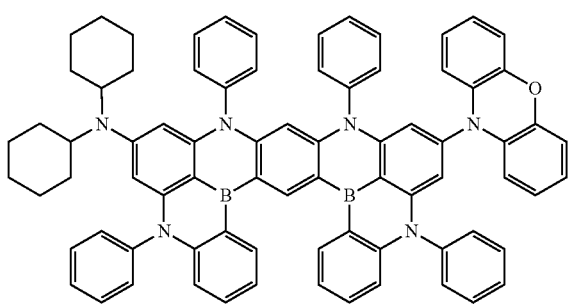

-continued

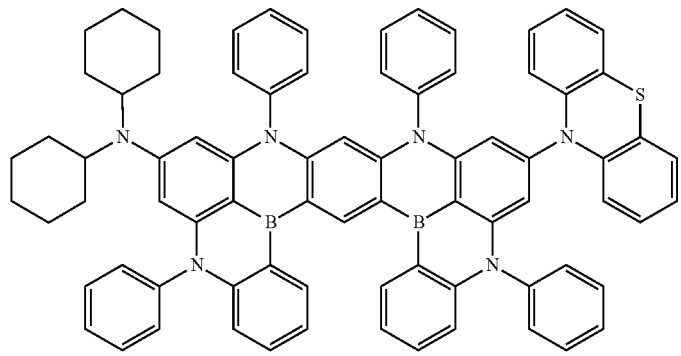
80

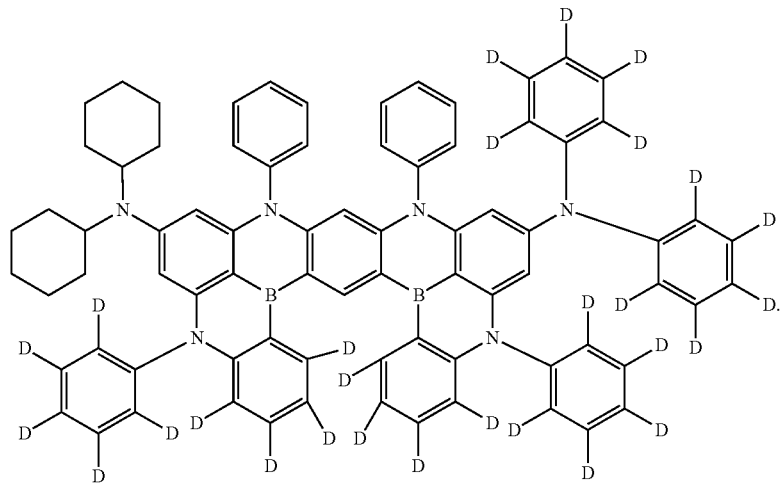
61D

The fused polycyclic compound of an embodiment, represented by Formula 1, may be a material for emitting thermally activated delayed fluorescence. The fused polycyclic compound of an embodiment, represented by Formula 1, may be a thermally activated delayed fluorescence dopant having a difference ($\Delta E_{ST}$) between the lowest triplet exciton energy level (T1 level) and a lowest singlet exciton energy level (S1 level) equal to or less than about 0.2 eV.

The fused polycyclic compound of an embodiment, represented by Formula 1, may be a material emitting light in a blue region. The blue region may be, for example, a wavelength region in a range of about 430 nm to about 490 nm.

In an embodiment, the fused polycyclic compound of an embodiment, represented by Formula 1, may be a blue thermally activated delayed fluorescence (TADF) dopant. However, embodiments are not limited thereto, and when the fused polycyclic compound of an embodiment is used as a luminescent material, the fused polycyclic compound may be used as a dopant material emitting light in various wavelength regions, such as a red luminescence dopant and a green luminescence dopant. In another embodiment, the fused polycyclic compound represented by Formula 1 may be a host.

The fused polycyclic compound according to an embodiment may be used in the organic electroluminescence device ED of an embodiment to improve efficiency and a service life of the organic electroluminescence device. The fused polycyclic compound according to an embodiment may be used in the emission layer EML of the organic electroluminescence device ED of an embodiment to improve luminous efficiency and a service life of the organic electroluminescence device.

In an embodiment, the emission layer EML may emit delayed fluorescence. In an embodiment, the emission layer EML may be a delayed fluorescence emission layer including a first compound and a second compound, and the first compound of the emission layer EML may include the fused polycyclic compound of an embodiment represented by Formula 1. For example, the first compound may be a dopant, and the second compound may be a host.

In an embodiment, the host may be a host for emitting delayed fluorescence, and the dopant may be a dopant for emitting delayed fluorescence. The fused polycyclic compound represented by Formula 1 of an embodiment may be included as a dopant material in the emission layer EML. For example, the polycyclic compound of an embodiment, represented by Formula 1 may be used as a TADF dopant.

In an embodiment, the emission layer EML may emit blue light. For example, the emission layer EML may emit deep blue light. In an embodiment, a maximum emission wavelength of the emission layer EML may be in a range of about 450 nm to about 470 nm.

Although not shown in the drawing, the organic electroluminescence device ED of an embodiment may include multiple emission layers. The emission layers may be stacked and provided, so that the organic electroluminescence device ED including multiple emission layers may emit white light. The organic electroluminescence device including multiple emission layers may be an organic electroluminescence device having a tandem structure. When the organic electroluminescence device ED includes multiple emission layers, at least one emission layer EML may include the polycyclic compound according to an embodiment as described above.

In the light emitting device ED of an embodiment, the emission layer EML may include an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

In an embodiment, the emission layer EML may include a compound represented by Formula E-1 below. The compound represented by Formula E-1 below may be used as a host material.

[Formula E-1]

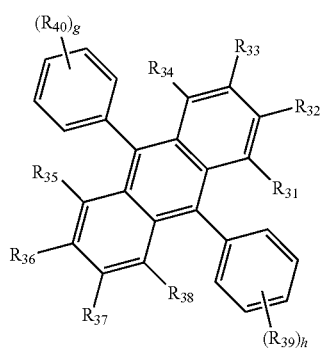

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, g and h may each independently be an integer from 0 to 5.

The compound represented by Formula E-1 may be any one selected from Compound E1 to Compound E19:

E1
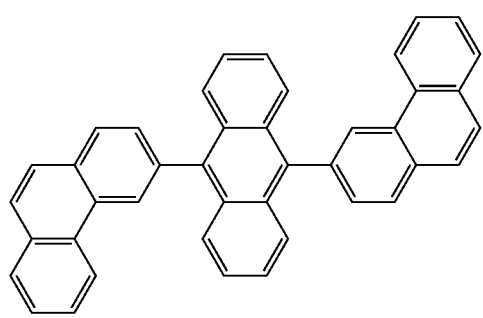

E2
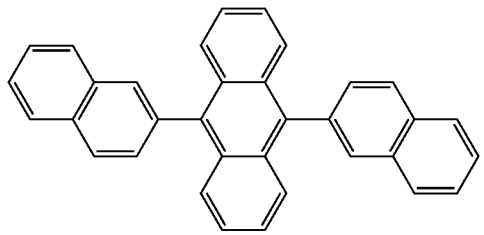

E3
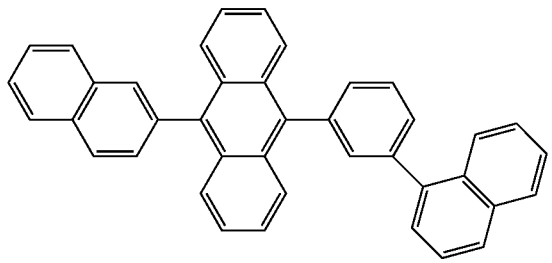

E4
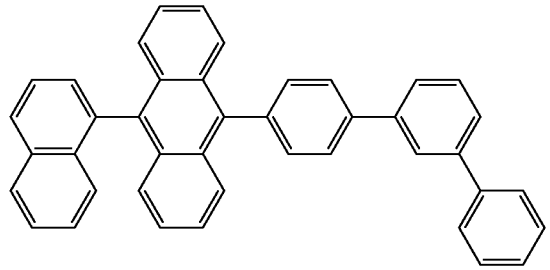

E5
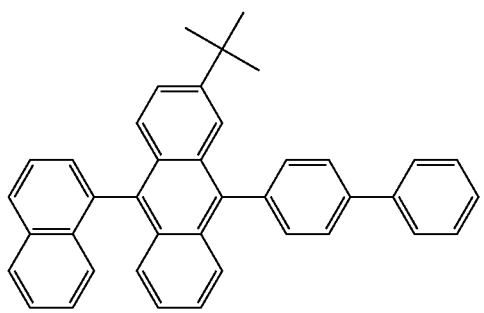

E6
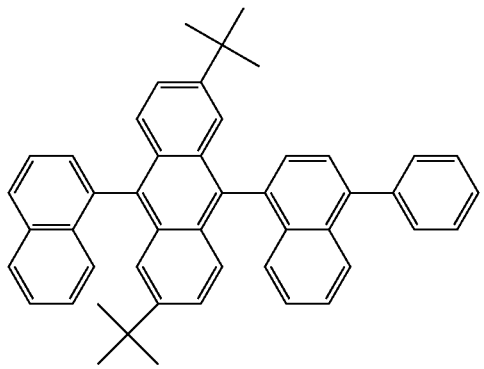

E7
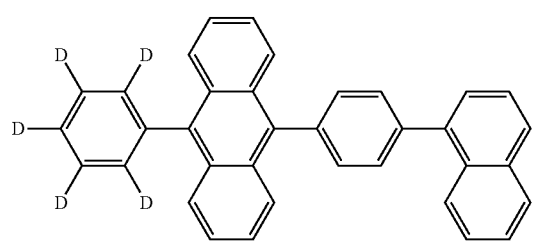
E8
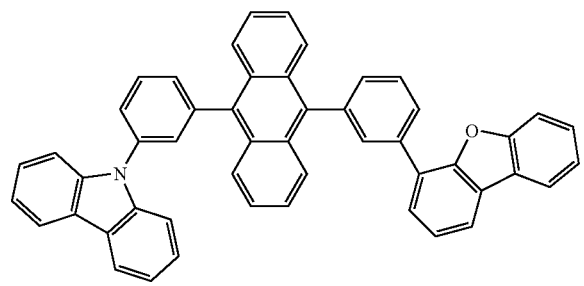
E9
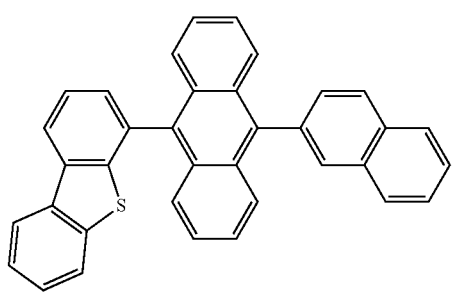
E10
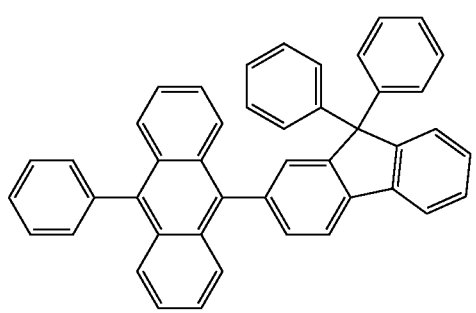
E11
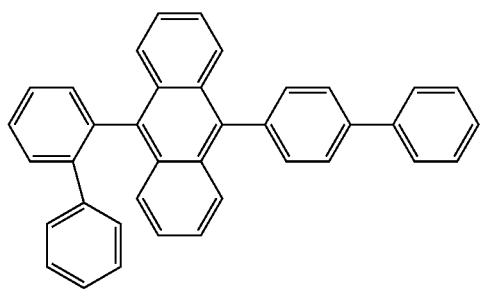
E12
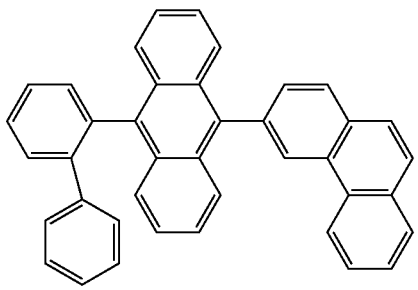
E13
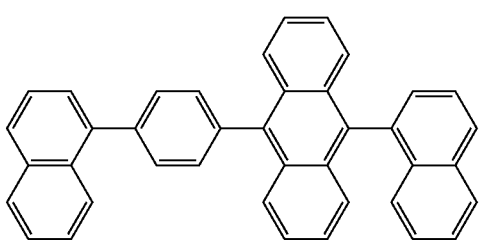
E14
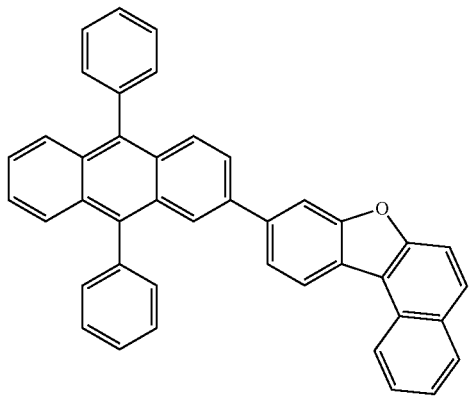
E15
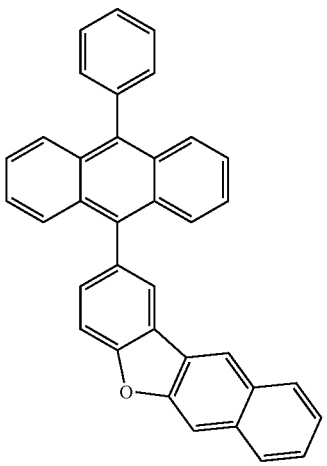

E16
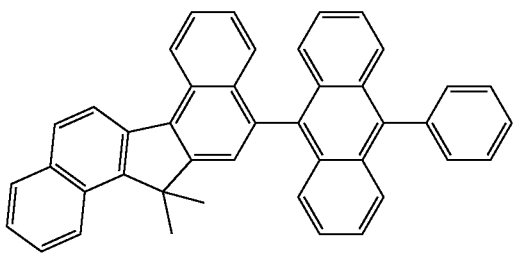

E17
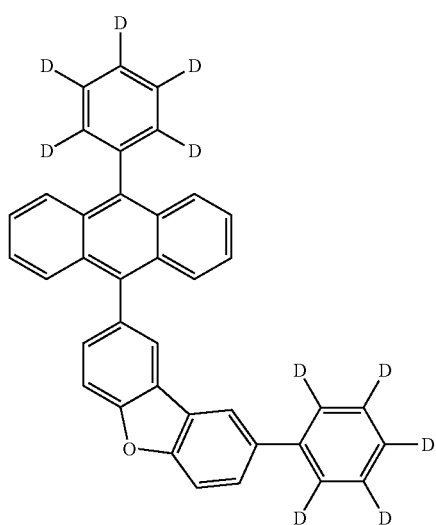

E18
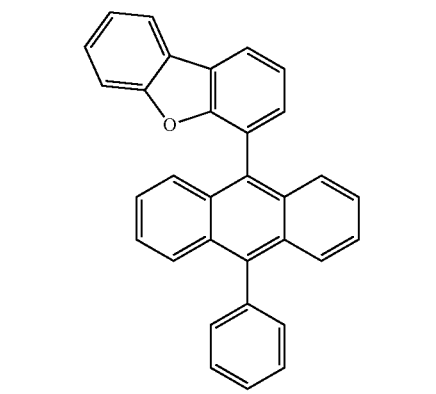

E19
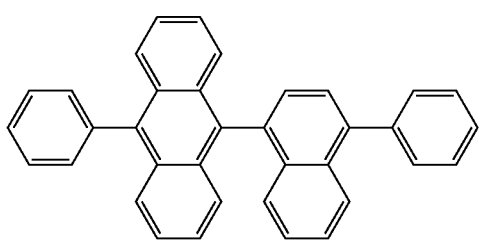

In an embodiment, the emission layer EML may include a compound represented by Formula E-2a or Formula E-2b. The compound represented by Formula E-2a or Formula E-2b may be used as a phosphorescence host material.

[Formula E-2a]

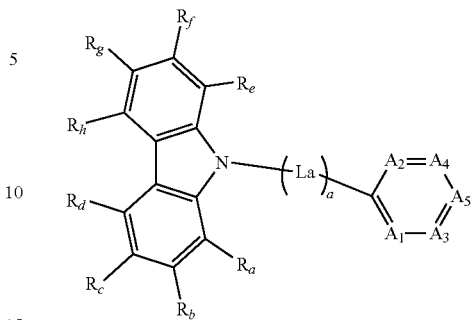

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or more, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

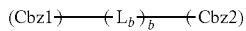

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or more, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2. However, the compounds listed in Compound Group E-2 are examples, and the compound represented by Formula E-2a or Formula E-2b is not limited to those listed in Compound Group E-2.

[Compound Group E-2]
E-2-1
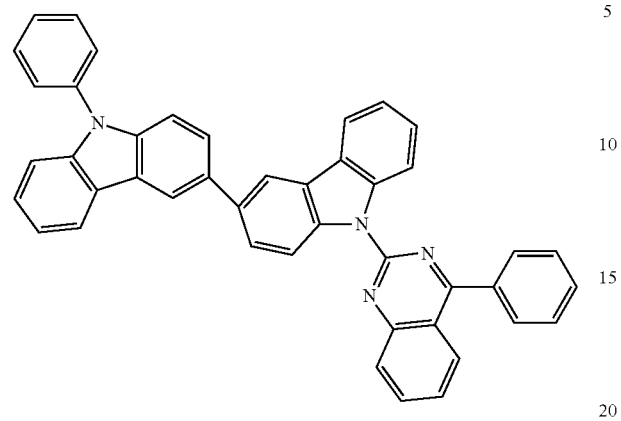
E-2-2
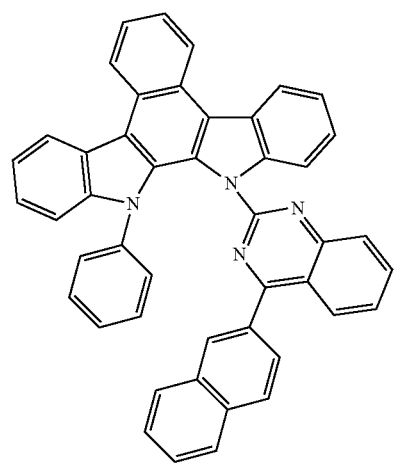
E-2-3
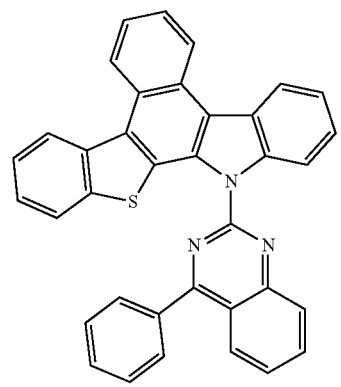
E-2-4
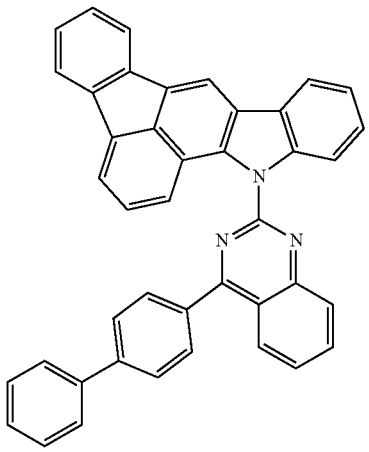
E-2-5
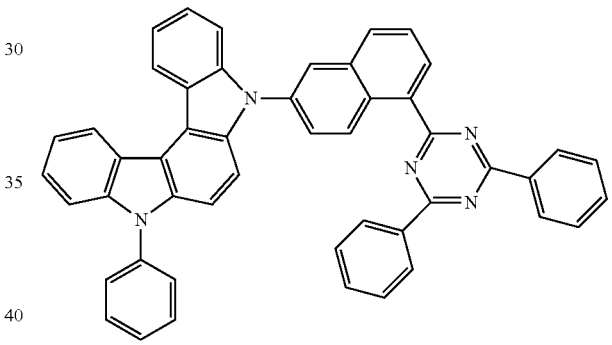
E-2-6
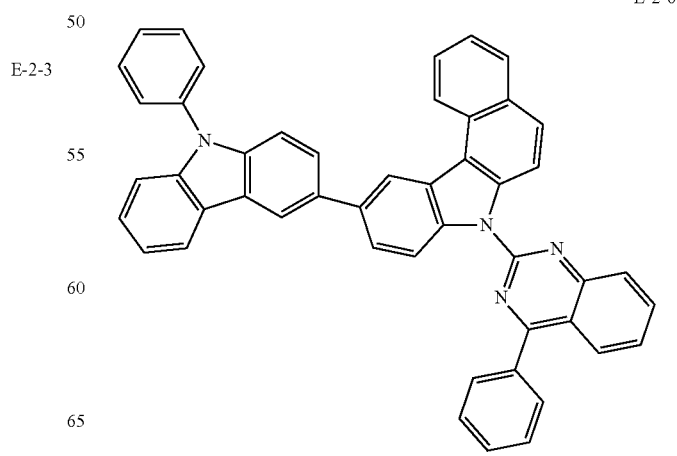

-continued
E-2-7
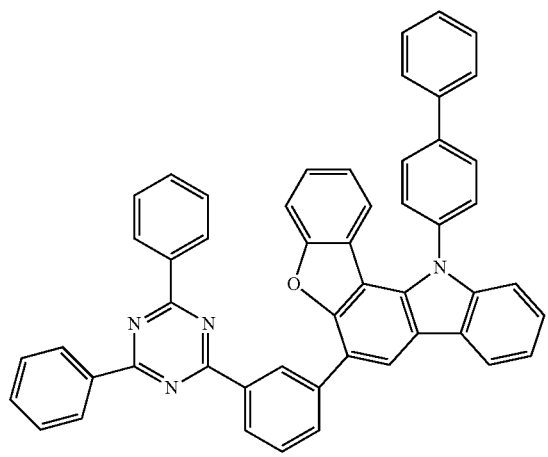
E-2-8
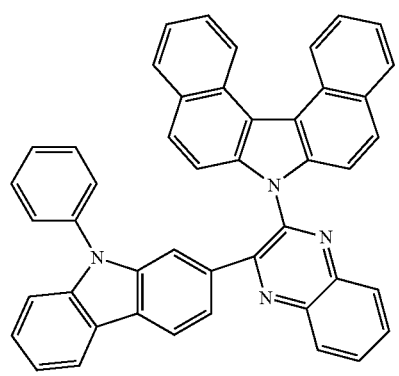
E-2-9
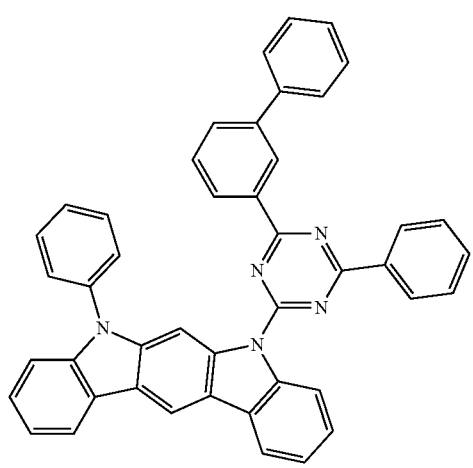
-continued
E-2-10
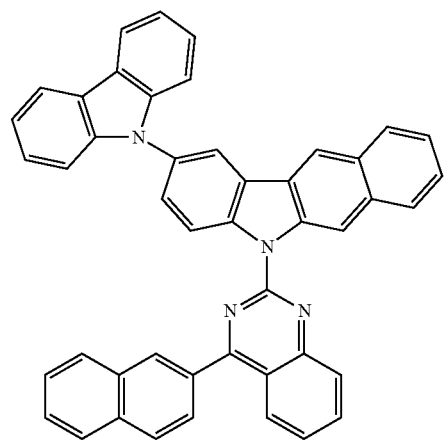
E-2-11
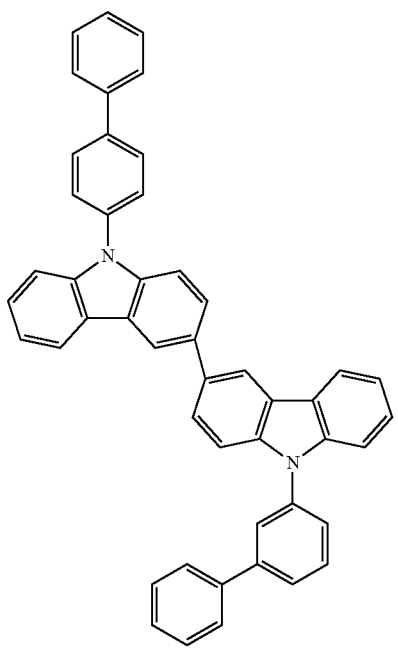
E-2-12
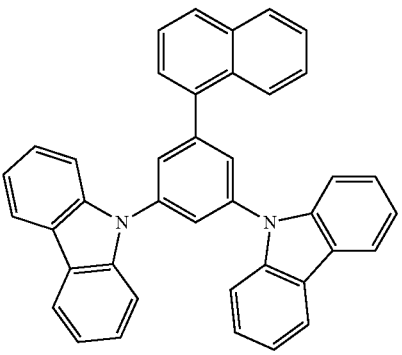

E-2-13
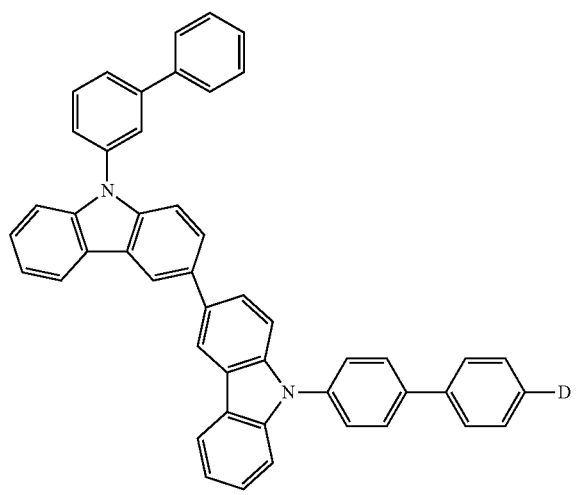
E-2-14
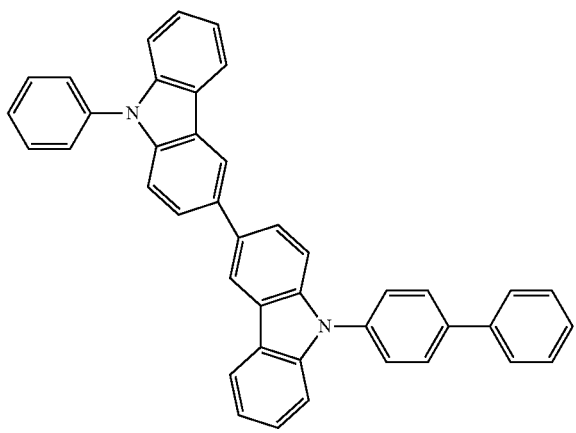
E-2-15
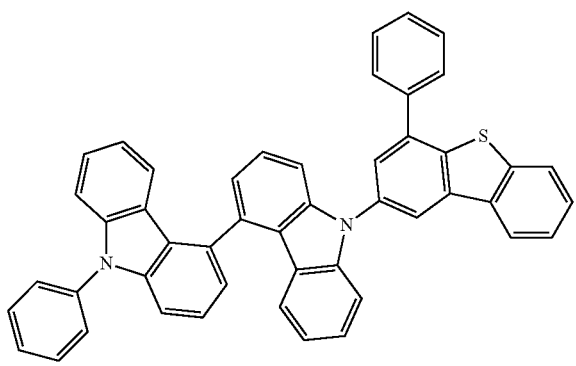
E-2-16
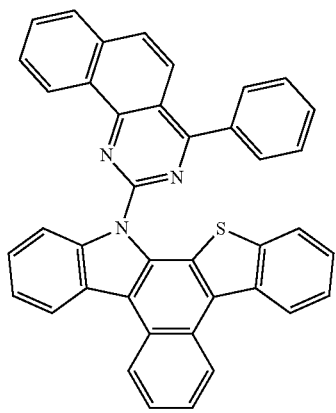
E-2-17
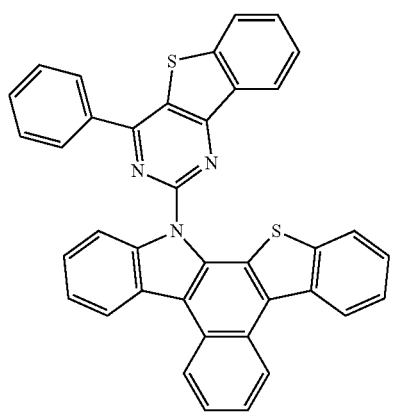
E-2-18
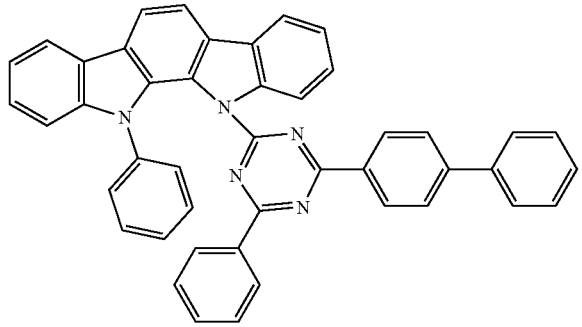
E-2-19
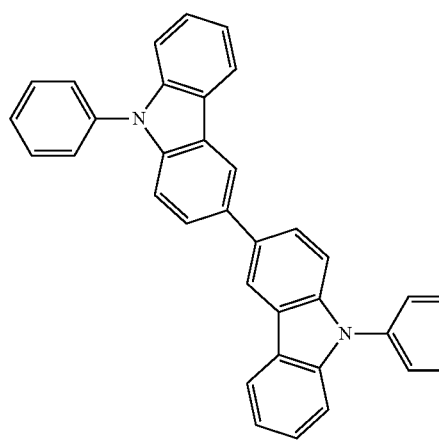

E-2-20

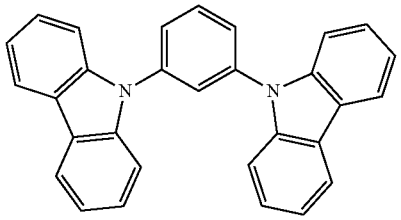

E-2-21

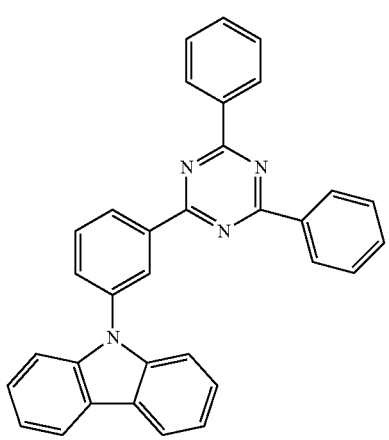

E-2-22

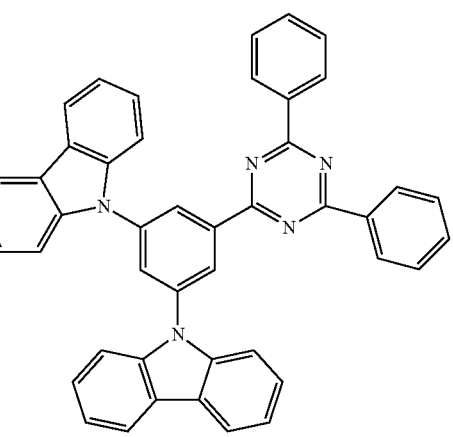

E-2-23

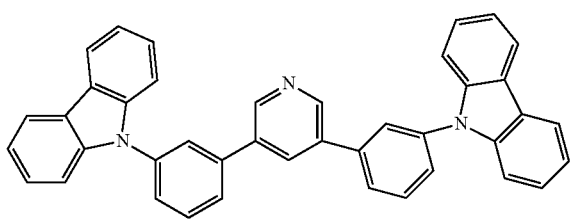

E-2-24

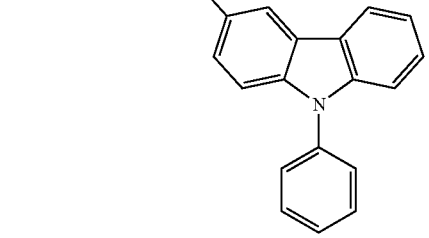

The emission layer EML may further include a general material in the art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may include a compound represented by Formula M-a or Formula M-b. The compound represented by Formula M-a or Formula M-b may be used as a phosphorescence dopant material.

[Formula M-a]

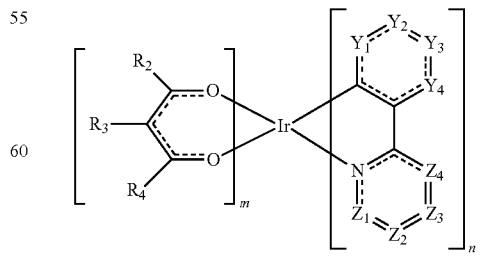

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescence dopant.

The compound represented by Formula M-a may be any one selected from Compound M-a1 to Compound M-a25. However, Compounds M-a1 to M-a25 are examples, and the compound represented by Formula M-a is not limited to Compounds M-a1 to M-a25.

M-a1

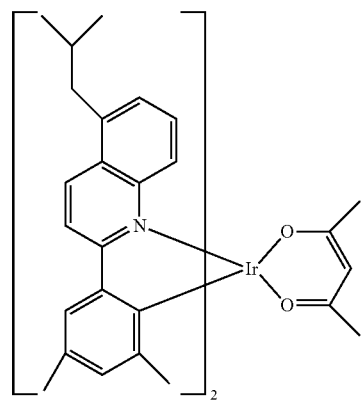

M-a2

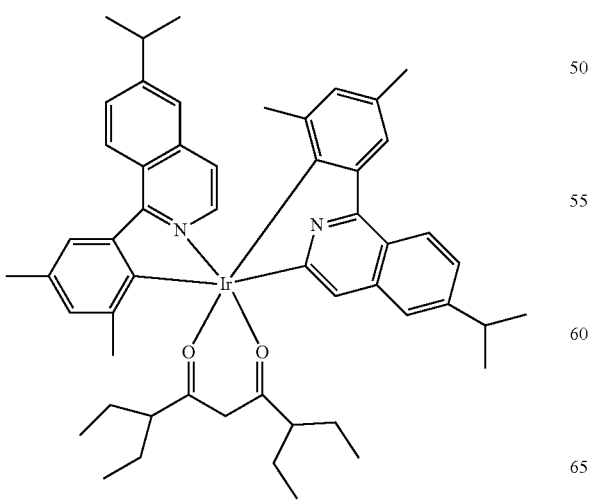

M-a3

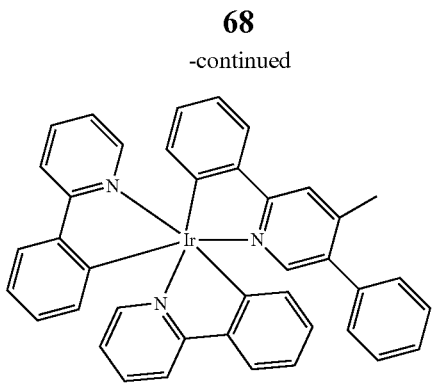

M-a4

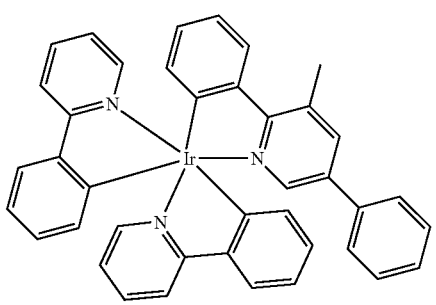

M-a5

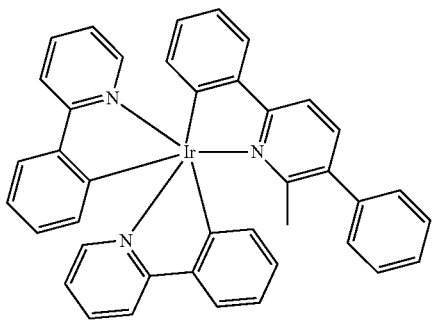

M-a6

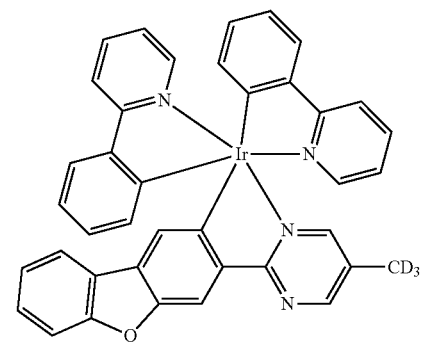

M-a7
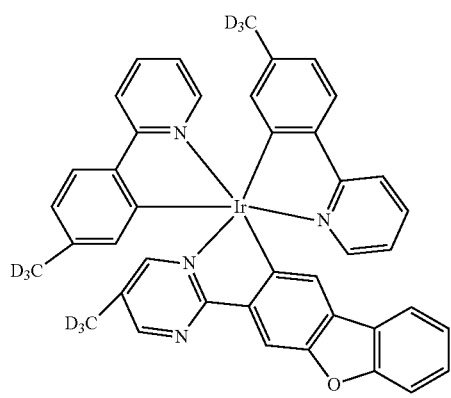
M-a8
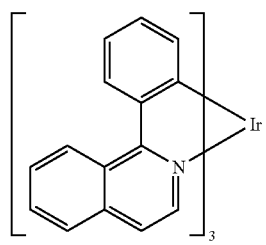
M-a9
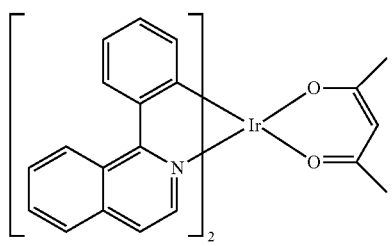
M-a10
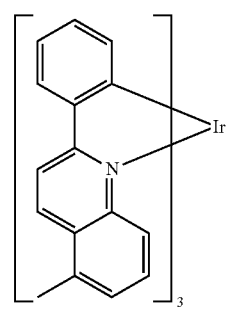
M-a-11
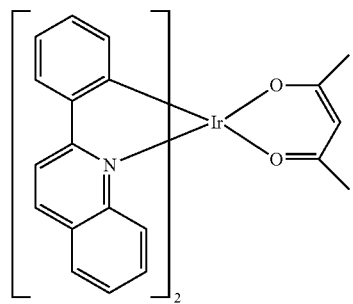
M-a12
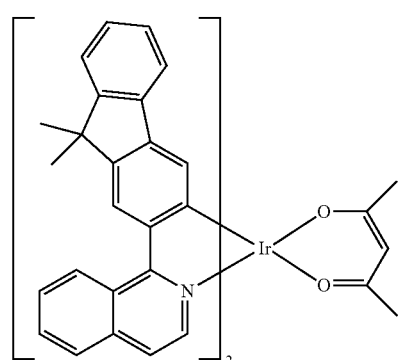
M-a13
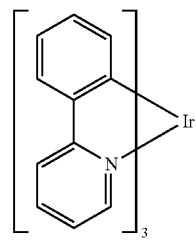
M-a14
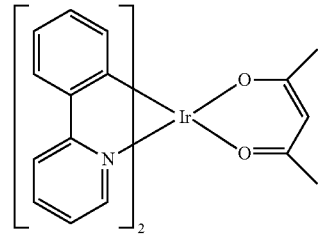
M-a15
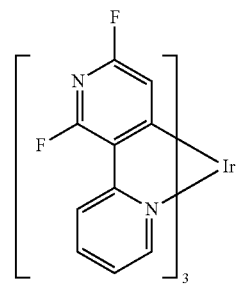
M-a16
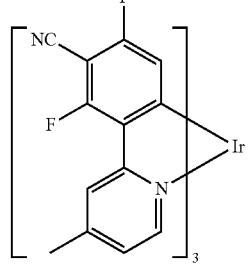

-continued
M-a17
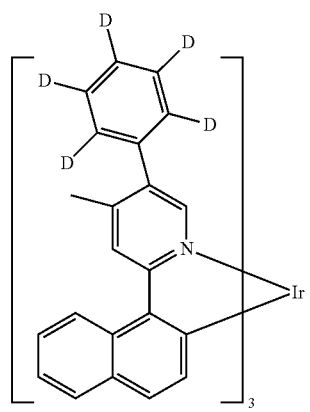
M-a18
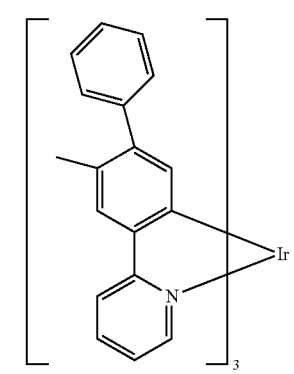
M-a19
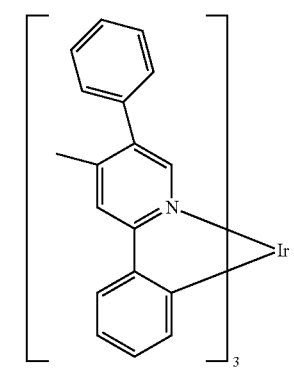
M-a20
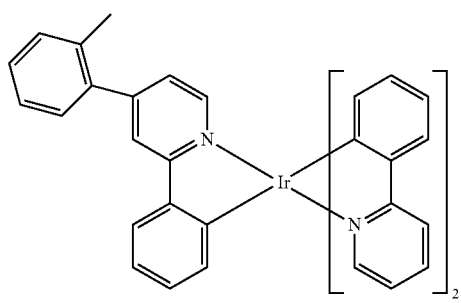
-continued
M-a21
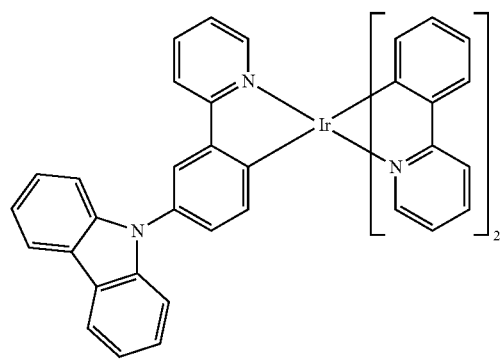
M-a22
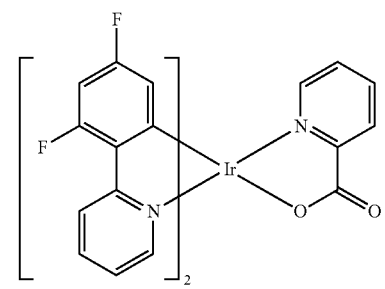
M-a23
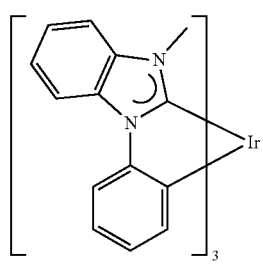
M-a24
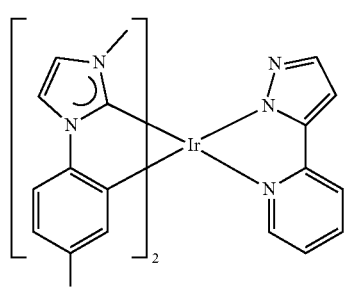
M-a25
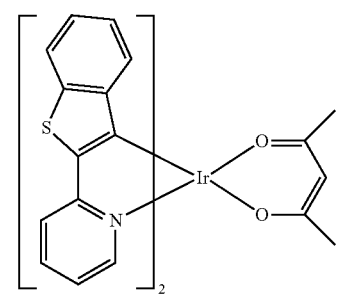
Compound M-a1 and Compound M-a2 may be used as a red dopant material, and Compound M-a3 and Compound M-a4 may be used as a green dopant material.

[Formula M-b]

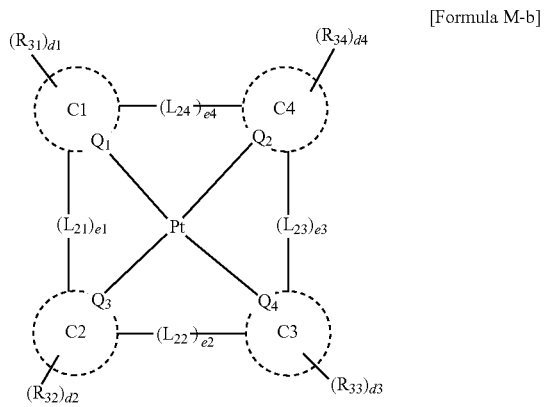

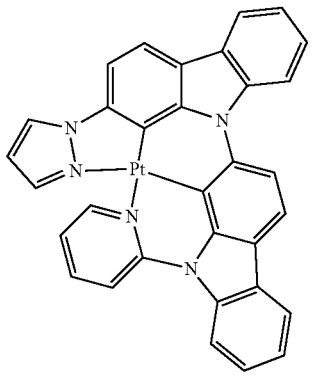

M-b-1

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

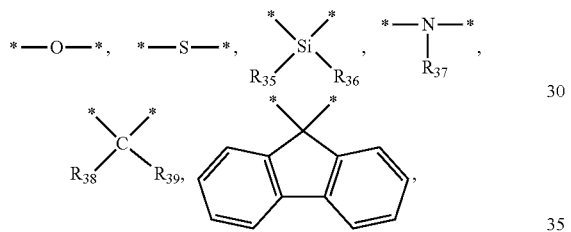

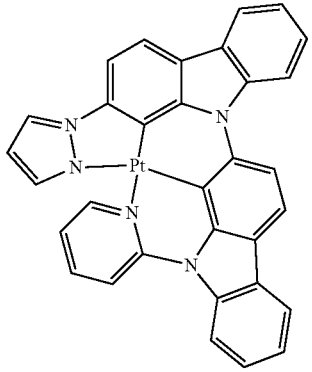

M-b-2 a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

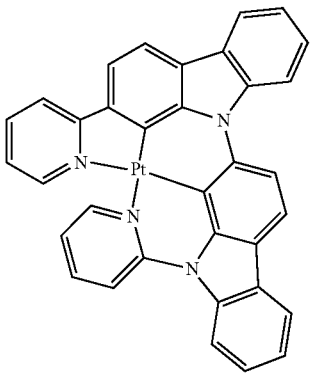

M-b-3

The compound represented by Formula M-b may be used as a blue phosphorescence dopant or a green phosphorescence dopant.

The compound represented by Formula M-b may be any one selected from Compounds M-b-1 to M-b-12. However, Compounds M-b-1 to M-b-12 are examples, and the compound represented by Formula M-b is not limited to Compounds M-b-1 to M-b-12.

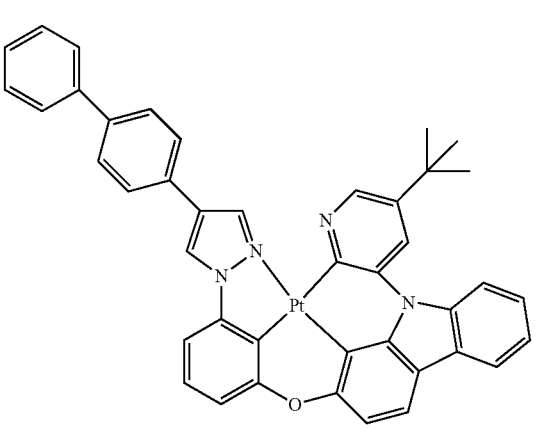

M-b-4

M-b-5
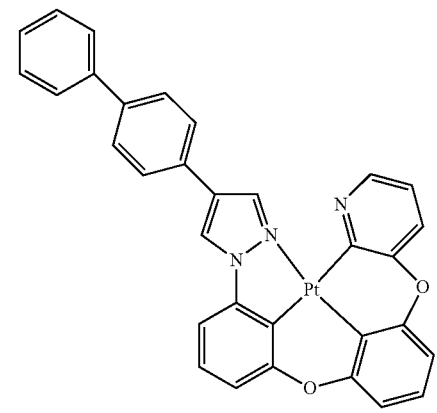

M-b-6
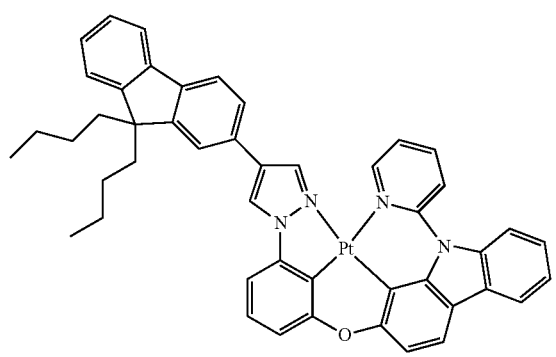

M-b-7
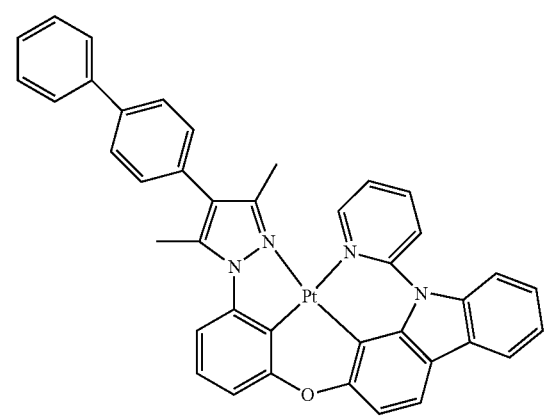

M-b-8
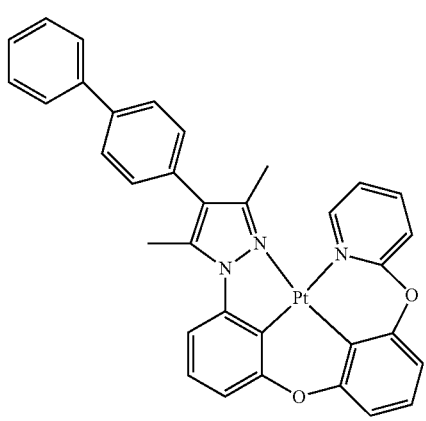

M-b-9
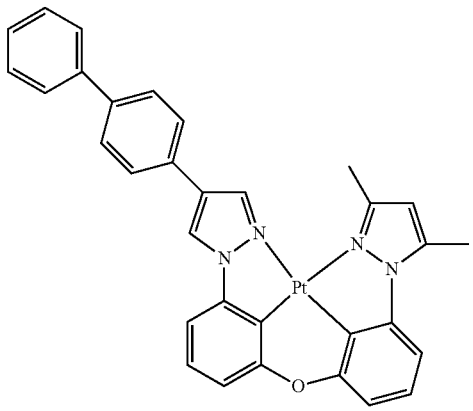

M-b-10
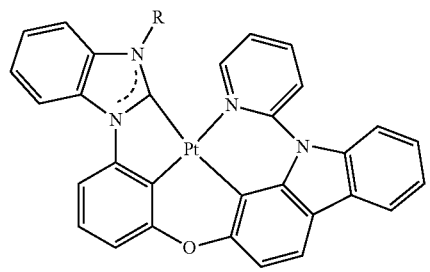

M-b-11
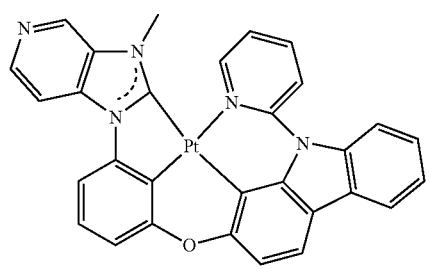

M-b-12
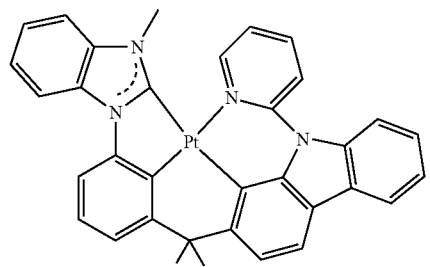

In Compounds M-b-1 to M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c. The compound represented by Formula F-a to Formula F-c may be used as a fluorescence dopant material.

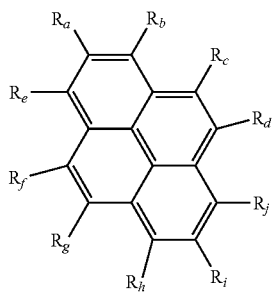

[Formula F-a]

In Formula F-a, two selected from $R_a$ to $R_R$ may each independently be substituted with *—$NAr_1Ar_2$. The remainder of $R_a$ to $R_j$ which are not substituted with *—$NAr_1Ar_2$, may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

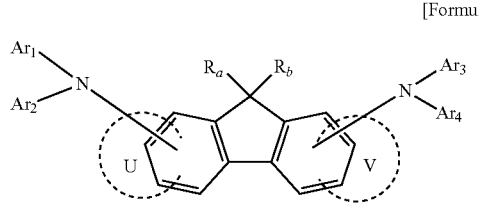

[Formula F-b]

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be 0 or 1. In Formula F-b, U indicates the number of rings bonded at the position of U, and V indicates the number of rings bonded at the position of V. For example, when U or V is 1, a condensed ring may be present at the position indicated by U or V, and when U or V is 0, a ring may not be present at the position indicated by U or V. When U is 0 and V is 1, or when U is 1 and V is 0, a condensed ring having a fluorene core of Formula F-b may be a cyclic compound having four rings. When both U and V are 0, a condensed ring having a fluorene core of Formula F-b may be a cyclic compound having three rings. When both U and V are 1, a condensed ring having a fluorene core of Formula F-b may be a cyclic compound having five rings.

In Formula F-b, when U or V is 1, U and V may be each independently a substituted or unsubstituted hydrocarbon ring having 5 to 30 ring-forming carbon atoms, or a substituted or unsubstituted heterocycle having 2 to 30 ring-forming carbon atoms.

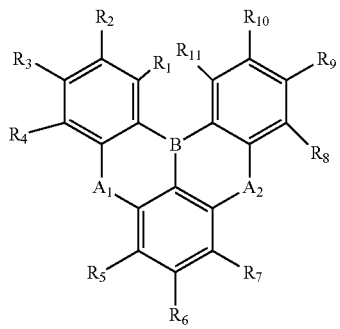

[Formula F-c]

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the emission layer EML may include, as a dopant material, a styryl derivative (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi), perylene and a derivative thereof (e.g., 2,5,8,11-tetra-t-butylperylene (TBP)), pyrene and a derivative thereof (e.g., 1,1-dipyrene, 1,4-dipyrenylbenzene, 1,4-bis(N,N-diphenylamino)pyrene), etc.

The emission layer EML may include a phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2')picolinate (FIrpic), bis(2,4-difluorophenylpyridinato)-tetrakis(1-pyrazolyl)borate iridium(III) (FIr6), or platinum octaethyl porphyrin (PtOEP) may be used as a phosphorescence dopant. However, embodiments are not limited thereto.

In each organic electroluminescence device ED of embodiments illustrated in FIGS. 3 to 6, an electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may be a layer formed of a single material, a layer formed of different materials, or a multilayer structure including layers formed of different materials.

For example, the electron transport region ETR may have a single layer structure of the electron injection layer EIL or the electron transport layer ETL, and may have a single layer structure formed of an electron injection material and an electron transport material. The electron transport region ETR may have a single layer structure formed of different materials, or may have a structure in which an electron transport layer ETL/electron injection layer EIL, a hole blocking layer HBL/electron transport layer ETL/electron injection layer EIL are stacked in its respective stated order from the emission layer EML, but embodiments are not limited thereto. The electron transport region ETR may have a thickness, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport layer ETL may include a compound represented by Formula ET-1 below:

[Formula ET-1]

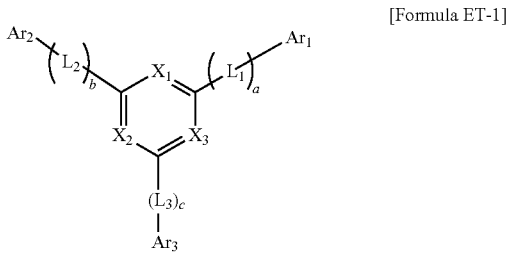

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, diphenyl[4-(triphenylsilyl)phenyl] phosphine oxide (TSPO1), tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazol e (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include at least one of Compound ET1 to Compound ET36:

ET1

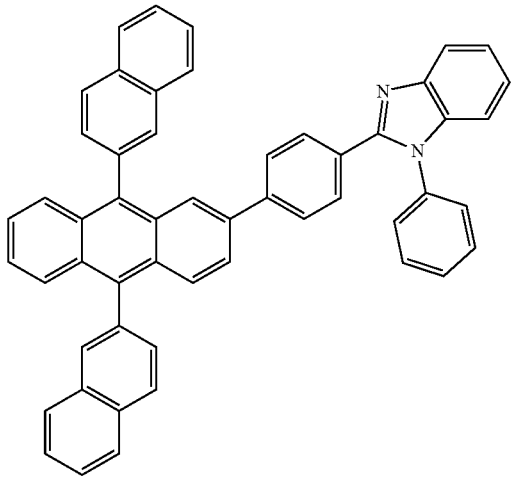

ET2

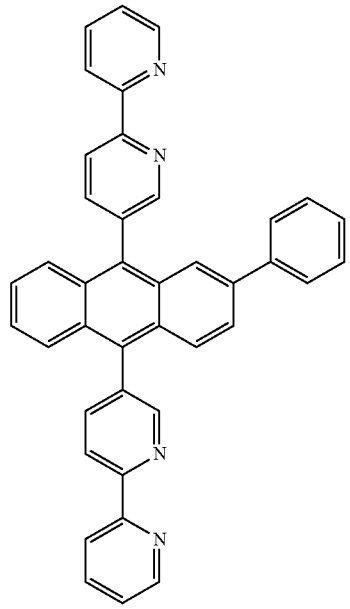

ET3
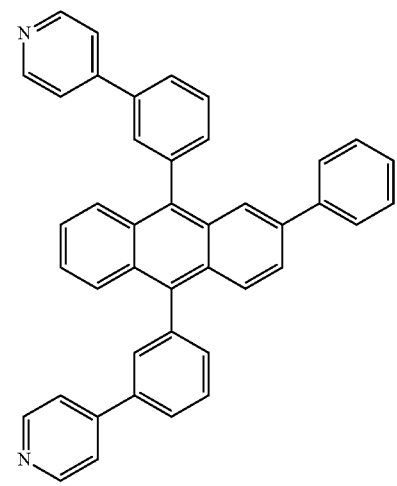
ET4
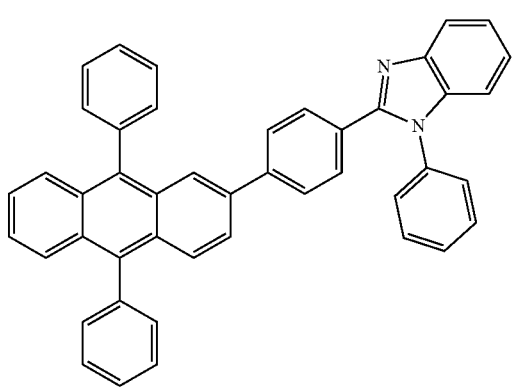
ET5
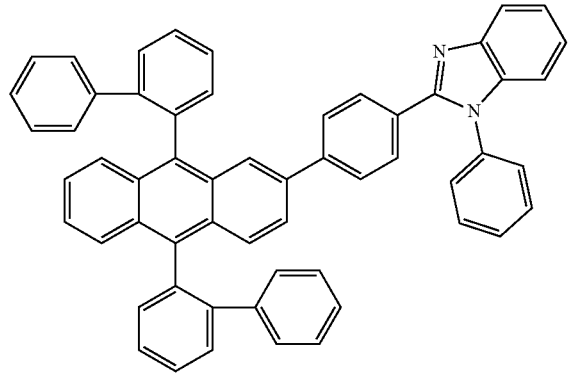
ET6
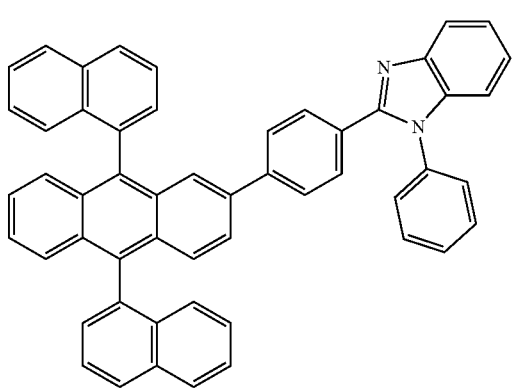
ET7
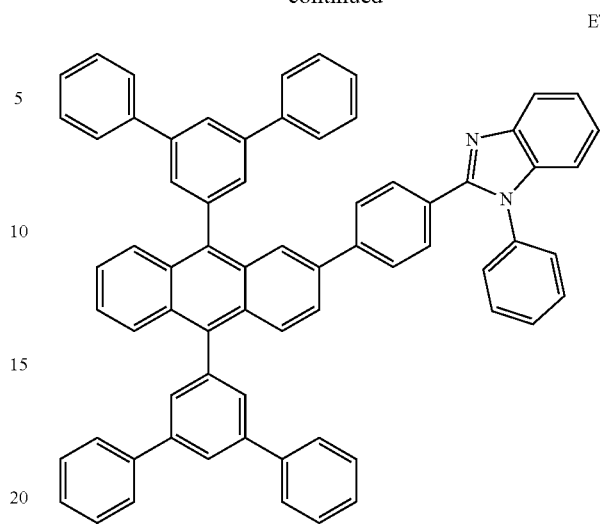
ET8
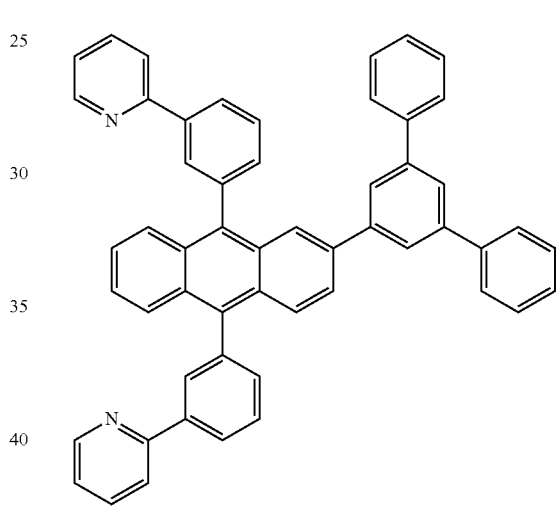
ET9
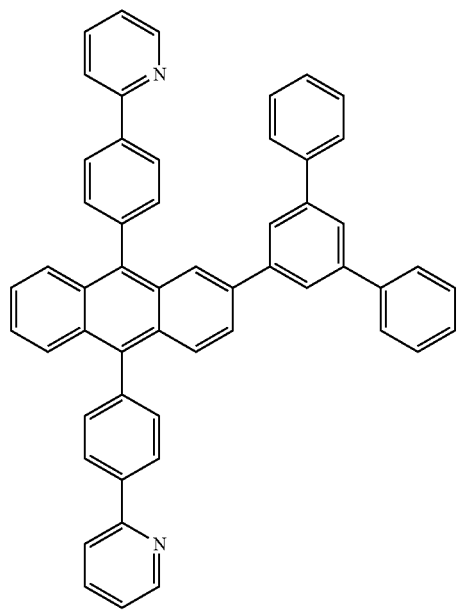

ET10
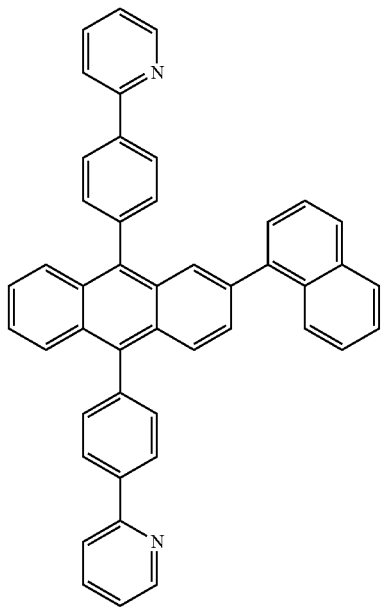
ET11
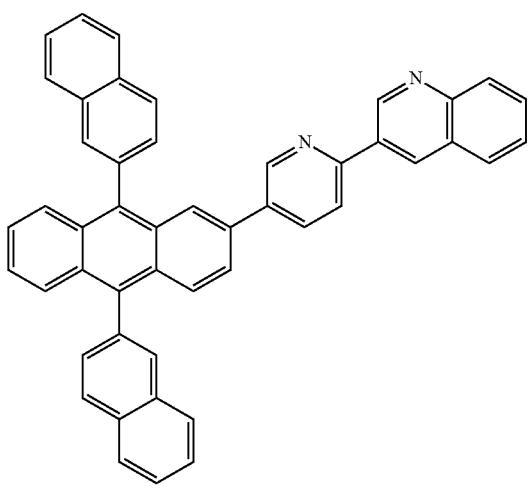
ET12
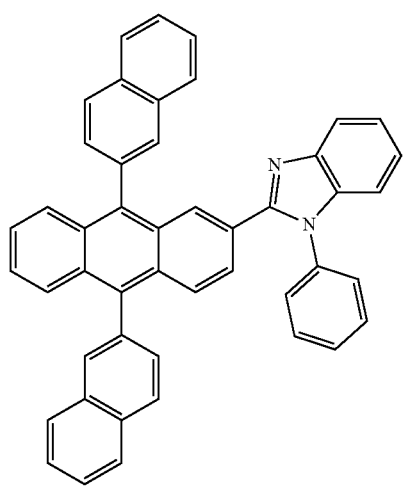
ET13
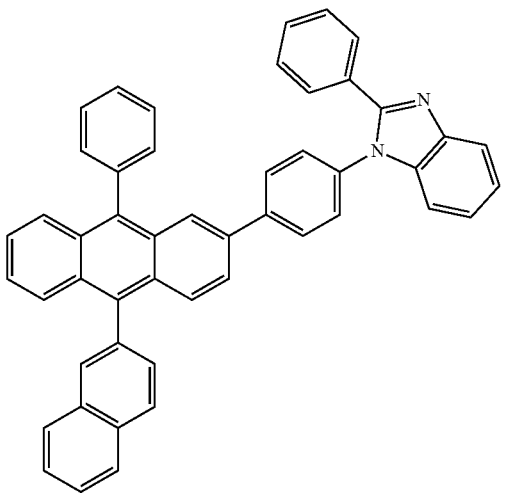
ET14
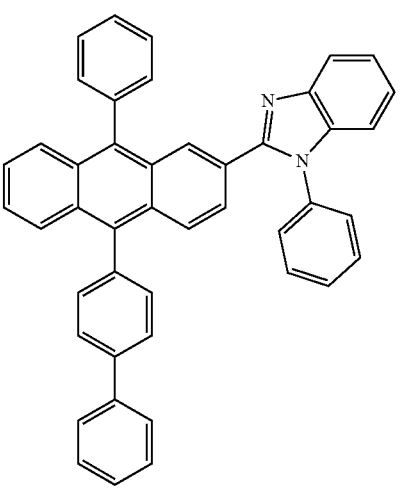
ET15
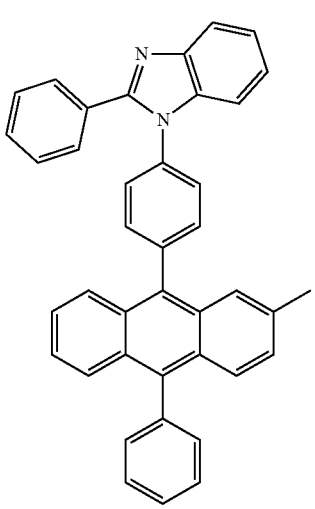

ET16
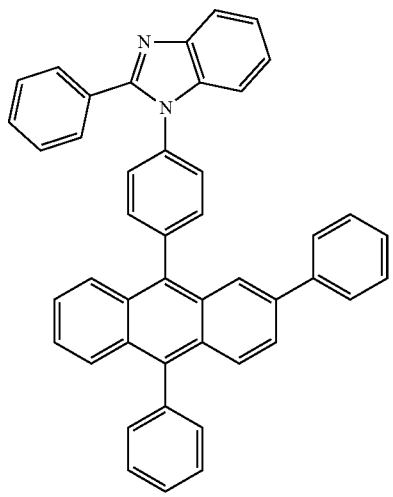
ET17
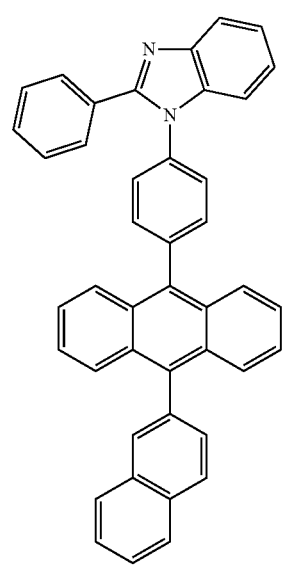
ET18
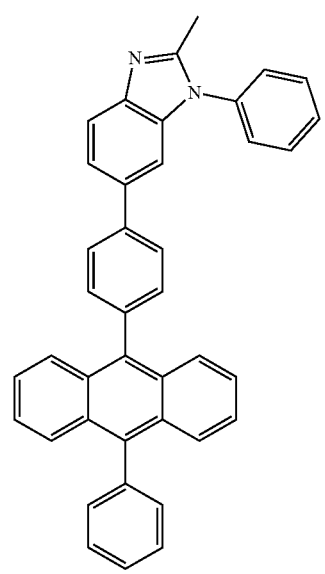
ET19
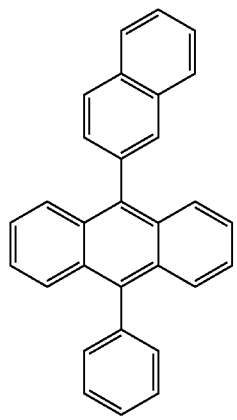
ET20
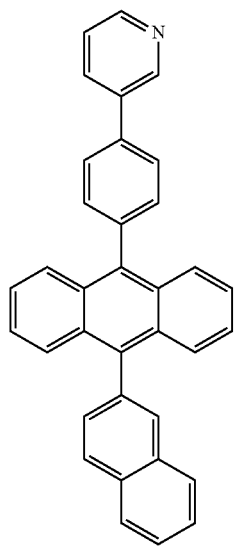
ET21
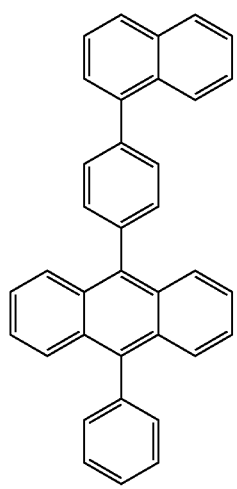

ET22
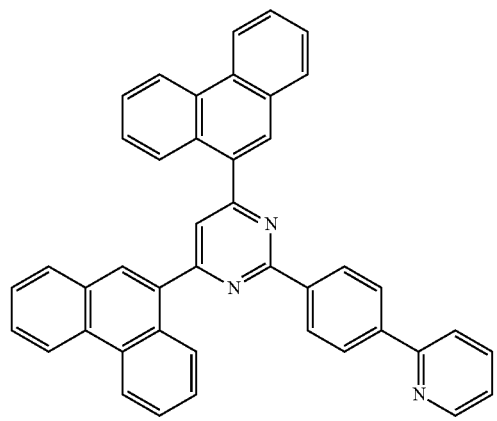
ET23
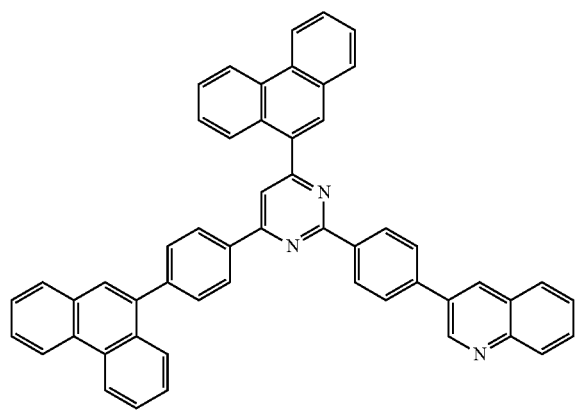
ET24
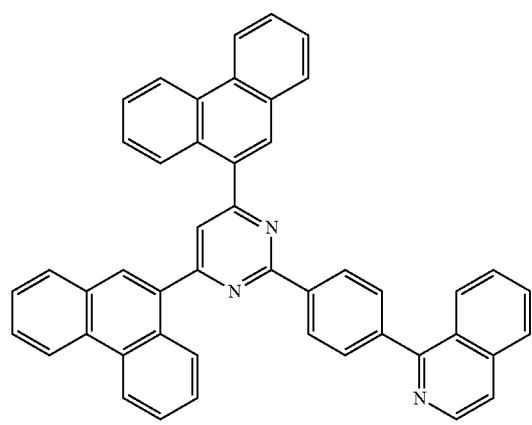
ET25
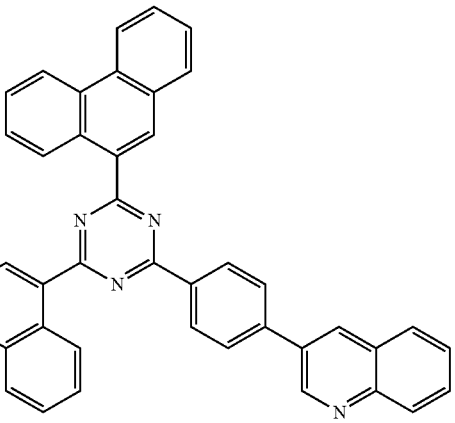
ET26
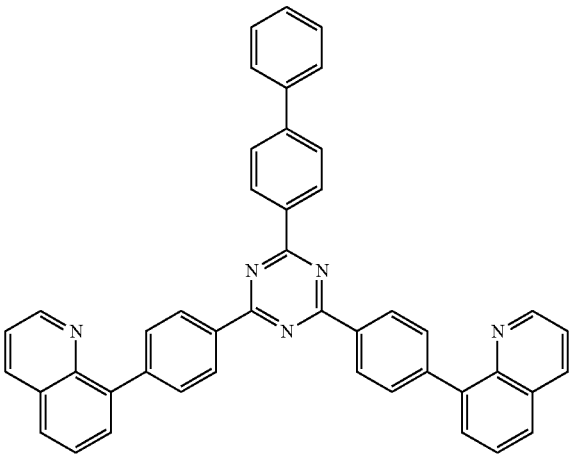
ET27
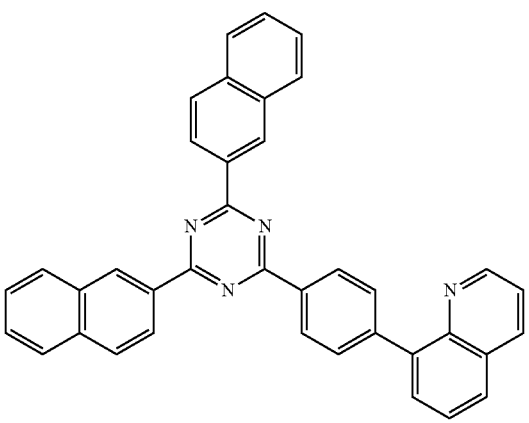

-continued
ET28
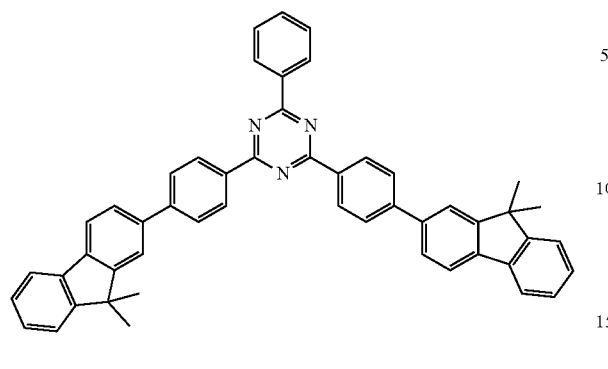
ET29
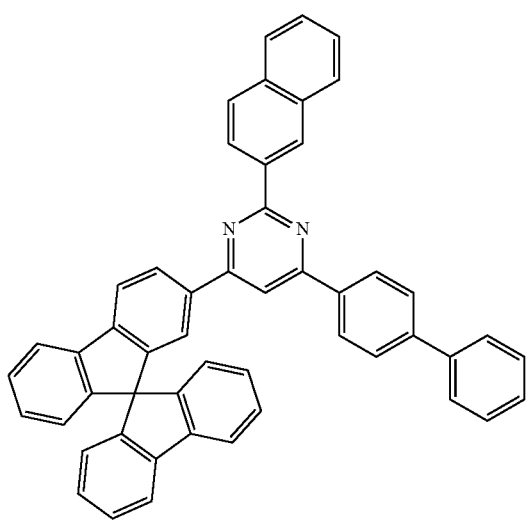
ET30
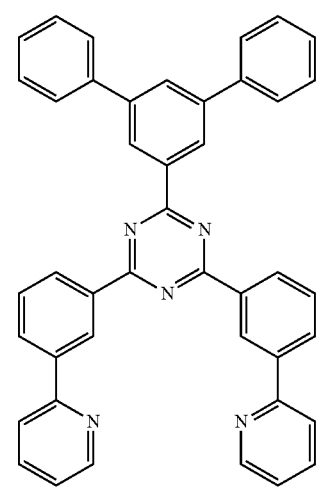
ET31
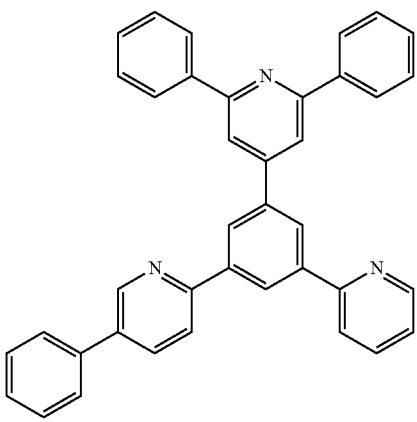
ET32
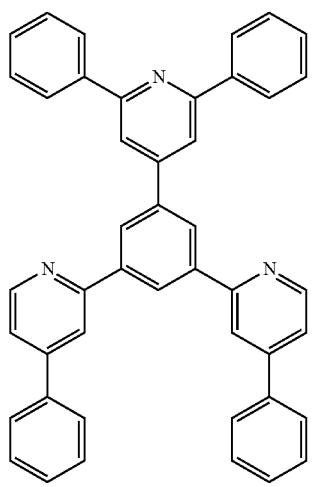
ET33
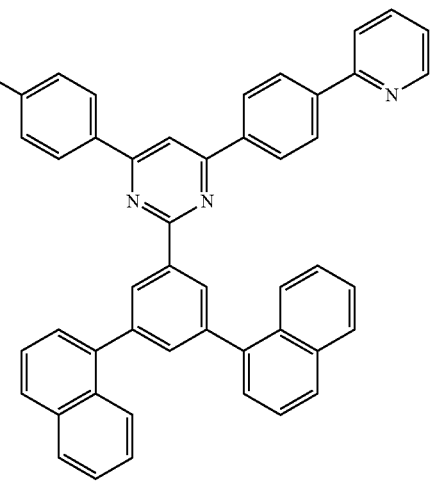

-continued

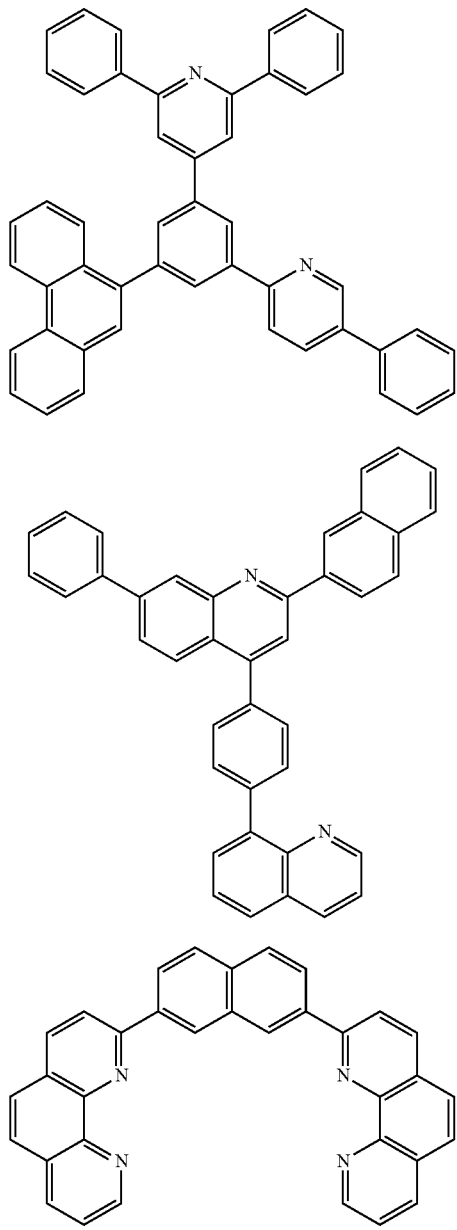

ET34

ET35

ET36

The electron transport regions ETR may include a metal halide such as LiF, NaCl, CsF, RbCl, RbI, CuI, or KI, a lanthanide metal such as Yb, or a co-deposited material of the metal halide and the lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments are not limited thereto.

The electron transport region ETR may include the above-described compounds of the hole transport region in at least one of the electron injection layer EIL, the electron transport layer ETL, or the hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multi-layer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the organic electroluminescence device ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL contains an inorganic material, the inorganic material may include an alkaline metal compound (for example, LiF), an alkaline earth metal compound (for example, MgF$_2$), SiON, SiN$_x$, SiOy, etc.

For example, when the capping layer CPL contains an organic material, the organic material may include α-NPD, NPB, TPD, m-MTDATA, Alq$_3$, CuPc, N4,N4,N4',N4'-tetra (biphenyl-4-yl)biphenyl-4,4'-diamine (TPD15), 4,4',4"-tris (carbazol sol-9-yl)triphenylamine (TCTA), etc., or may include an epoxy resin, or an acrylate such as a methacrylate. However, embodiments are not limited thereto, and the capping layer CPL may include at least one of Compounds P1 to P5:

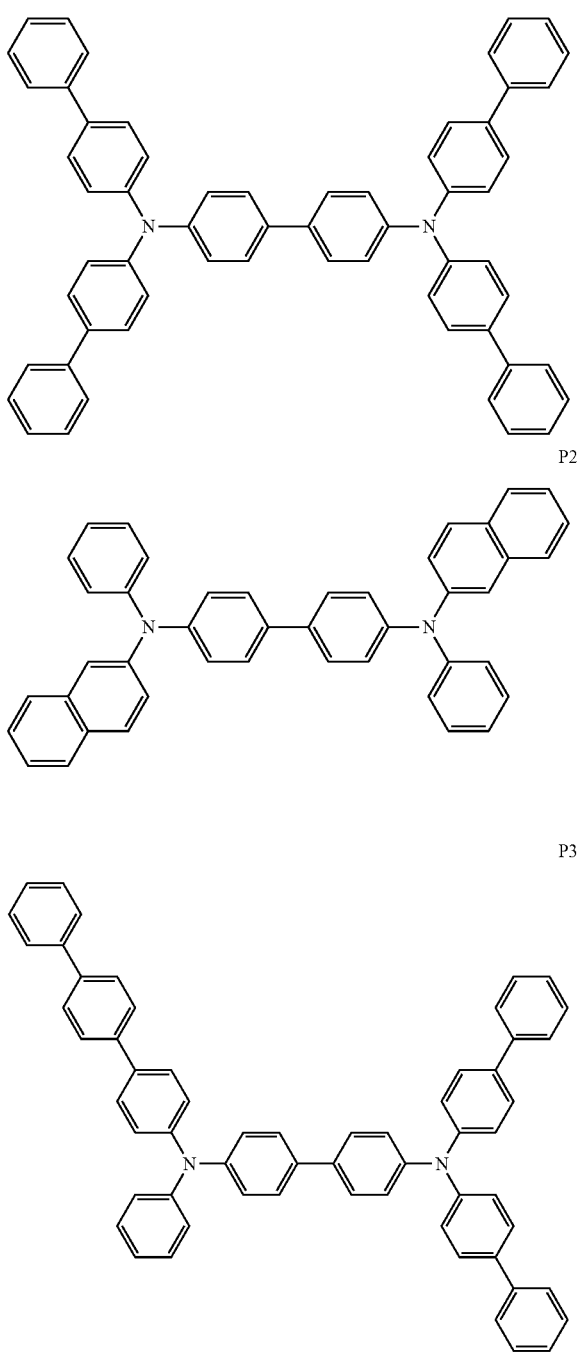

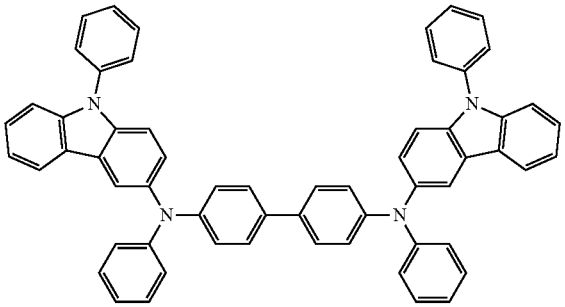

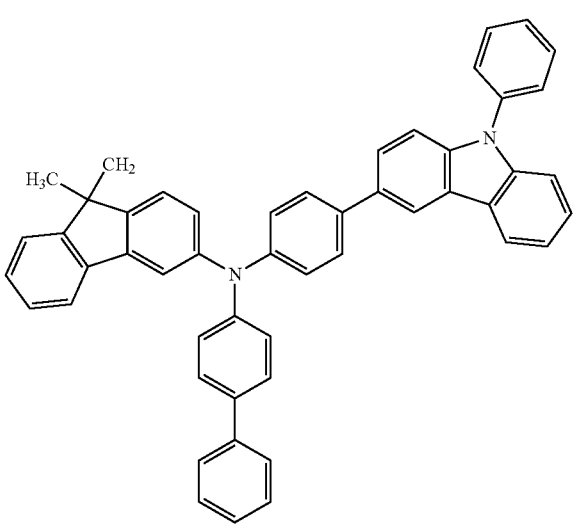

A refractive index of the capping layer CPL may be equal to or greater than about 1.6. For example, the capping layer CPL may have a refractive index equal to or greater than about 1.6 with respect to light in a wavelength range of about 550 nm to about 660 nm.

Figure 7:
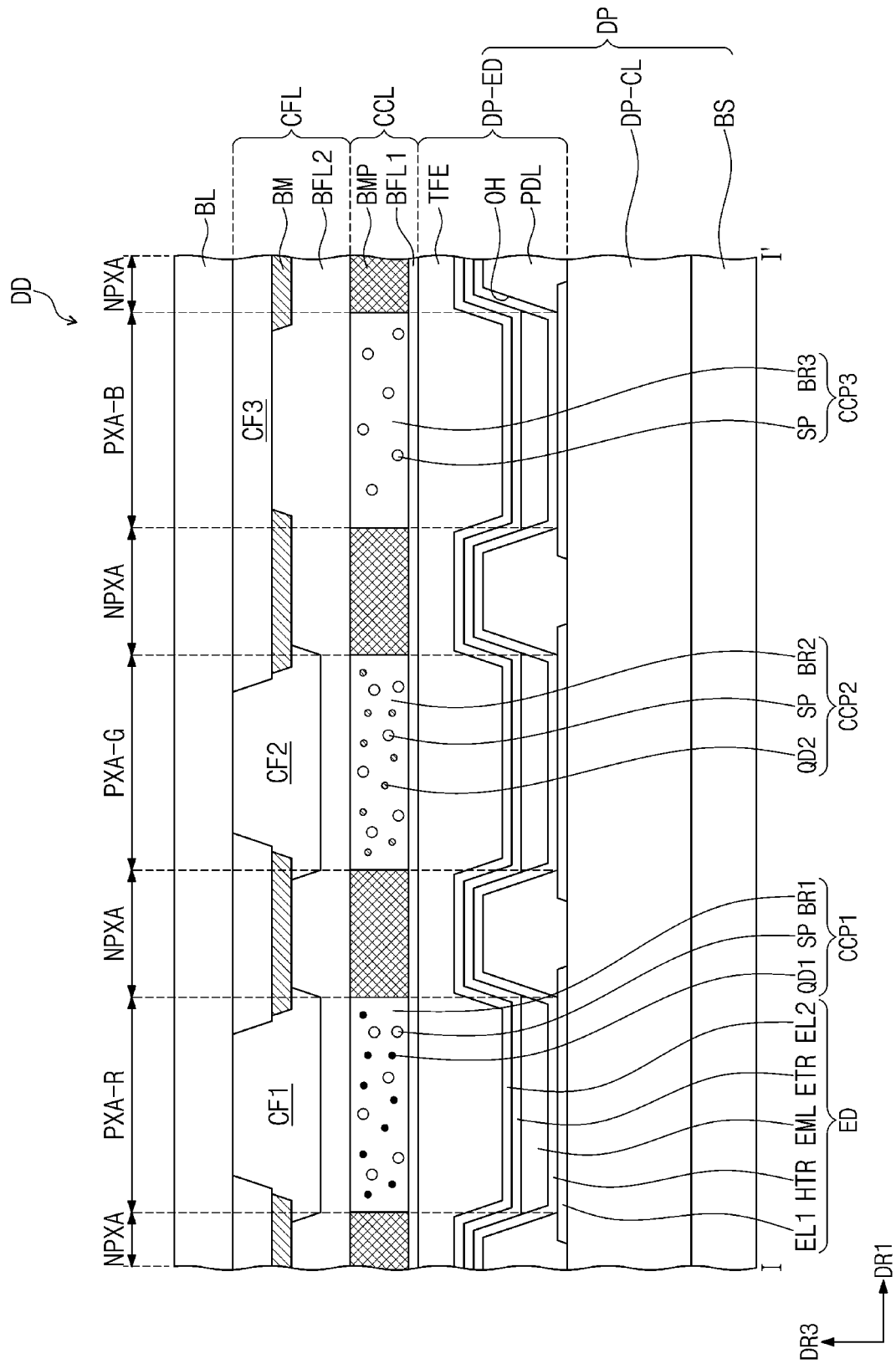
FIG. 7 is a schematic cross-sectional view illustrating a display apparatus according to an embodiment.
Figure 8:
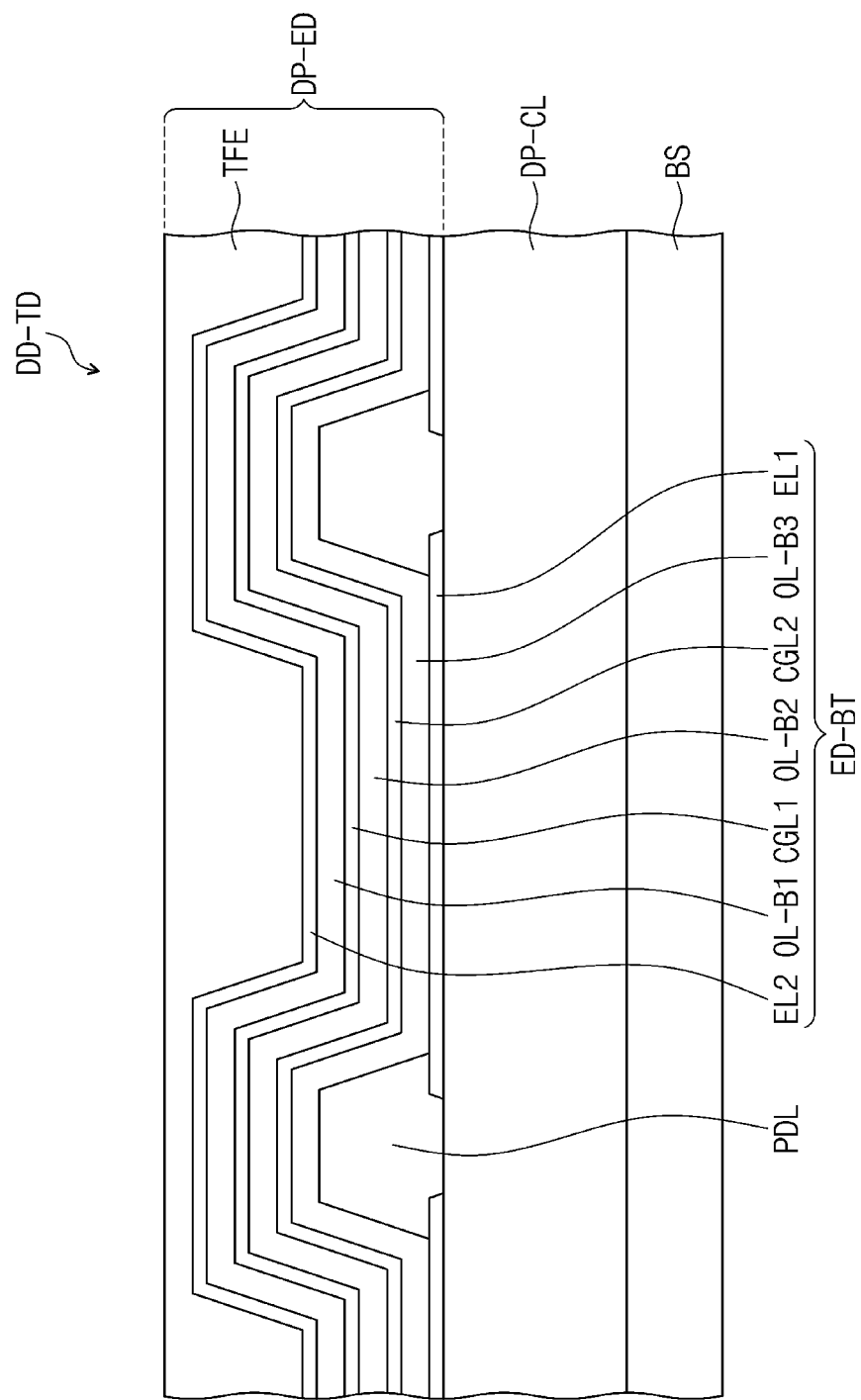
FIG. 8 is a schematic cross-sectional view illustrating a display apparatus according to an embodiment.

FIGS. 7 and 8 are each a schematic cross-sectional view of a display apparatus according to an embodiment. Hereinafter, in describing the display apparatuses of embodiments with reference to FIGS. 7 and 8, the features which have been described with respect to FIGS. 1 to 6 will not be described again, and the differences will be described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include an organic electroluminescence device ED.

The organic electroluminescence device ED may include a first electrode ELL a hole transport region HTR disposed on the first electrode ELL an emission layer EML disposed on the hole transport region HTR, an electron transport region ETR disposed on the emission layer EML, and a second electrode EL2 disposed on the electron transport region ETR. A structure of the organic electroluminescence device of FIGS. 3 to 6 as described above may be applied to the structure of the organic electroluminescence device ED shown in FIG. 7.

Referring to FIG. 7, the emission layer EML may be disposed in openings OH defined in a pixel defining film PDL. For example, the emission layer EML which is divided by the pixel defining film PDL and provided corresponding to each of the light emitting regions PXA-R, PXA-G, and PXA-B may emit light in a same wavelength range. In the display apparatus DD of an embodiment, the emission layer EML may emit blue light. Although not shown in the drawings, in an embodiment, the emission layer EML may be provided as a common layer for all of the light emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may convert the wavelength of a provided light and may emit the converted light. For example, the light control layer CCL may be a layer containing a quantum dot or a layer containing a phosphor.

The quantum dot may be a Group II-VI compound, a Group III-VI compound, a Group compound, a Group III-V compound, a Group III-II-V compound, a Group IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof; or any combination thereof.

The Group III-VI compound may be a binary compound such as $In_2S_3$ and $In_2Se_3$; a ternary compound such as $InGaS_3$ and $InGaSe_3$; or any combination thereof.

The Group compound may be a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof; a quaternary compound such as $AgInGaS_2$ and $CuInGaS_2$; or any combination thereof.

The Group III-V compound may be a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; a quaternary compound selected from the group consisting of SnPbSSe, SnPbSeTe, SnPbSTe, and a mixture thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in a particle at a partially different concentration distribution. In an embodiment, the quantum dot may have a core/shell structure in which one quantum dot surrounds another quantum dot. The core/shell structure may have a concentration gradient in which the concentration of an element that is present in the shell decreases toward the core.

In embodiments, a quantum dot may have a core-shell structure including a core containing nanocrystals and a shell surrounding the core. The shell of the quantum dot may be a protection layer that prevents chemical deformation of the core so as to maintain semiconductor properties, and/or may be a charging layer that imparts electrophoresis properties to the quantum dot. The shell may be a single layer or a multilayer. An example of the shell of the quantum dot may include a metal oxide, a non-metal oxide, a semiconductor compound, or a combination thereof.

For example, the metal oxide or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be improved in the above ranges. Light emitted through the quantum dot may be emitted in all directions, and thus, a wide viewing angle may be improved.

The form of a quantum dot is not particularly limited, as long as it is a form commonly used in the art. For example, a quantum dot may have a spherical shape, a pyramidal shape, a multi-arm shape, or a cubic shape, or the quantum dot may be in the form of nanoparticles, nanotubes, nanowires, nanofibers, nanoparticles, etc.

The quantum dot may control the color of emitted light according to a particle size thereof, and accordingly, the quantum dot may have various emission colors such as blue, red, and green.

The light control layer CCL may include light control parts CCP1, CCP2, and CCP3. The light control parts CCP1, CCP2, and CCP3 may be spaced apart from one another.

Referring to FIG. 7, divided patterns BMP may be disposed between the light control parts CCP1, CCP2, and CCP3, which are spaced apart from each other, but embodiments are not limited thereto. FIG. 7 illustrates that the divided patterns BMP do not overlap the light control parts CCP1, CCP2, and CCP3, but at least a portion of the edges of the light control parts CCP1, CCP2, and CCP3 may overlap the divided patterns BMP.

The light control layer CCL may include a first light control unit CCP1 containing a first quantum dot QD1 that converts first color light provided from the organic electroluminescence device ED into second color light, a second light control unit CCP2 containing a second quantum dot QD2 that converts the first color light into third color light, and a third light control unit CCP3 that transmits the first color light.

In an embodiment, the first light control part CCP1 may provide red light which is the second color light, and the second light control part CCP2 may provide green light which is the third color light. The third light control unit CCP3 may provide blue light by transmitting the blue light which is the first color light provided in the organic electroluminescence device ED. For example, the first quantum dot QD1 may be a red quantum dot, and the second quantum dot QD2 may be a green quantum dot. The same descriptions as provided above with respect to quantum dots may be applied to the quantum dots QD1 and QD2.

The light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include any quantum dot but may include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one of $TiO_2$, ZnO, $Al_2O_3$, $SiO_2$, or hollow silica, or may be a mixture of at least two materials selected from $TiO_2$, ZnO, $Al_2O_3$, $SiO_2$, and hollow silica.

The first light control part CCP1, the second light control part CCP2, and the third light control part CCP3 may each include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 may each be a medium in which the quantum dots QD1 and QD2 and the scatterer SP are dispersed, and may be formed of various resin compositions, which may be generally referred to as a binder. For example, the base resins BR1, BR2, and BR3 may each independently be acrylic-based resins, urethane-based resins, silicone-based resins, epoxy-based resins, etc. The base resins BR1, BR2, and BR3 may each be a transparent resin. In an embodiment, the first base resin BR1, the second base resin BR2, and the third base resin BR3 may each be the same as or different from each other.

The light control layer CCL may include a barrier layer BFL1. The barrier layer BFL1 may prevent penetration of moisture and/or oxygen (hereinafter, referred to as 'moisture/oxygen'). The barrier layer BFL1 may be disposed on the light control parts CCP1, CCP2, and CCP3 to prevent the light control parts CCP1, CCP2 and CCP3 from being exposed to moisture/oxygen. The barrier layer BFL1 may cover the light control parts CCP1, CCP2, and CCP3. The barrier layer BFL2 may be provided between the light control parts CCP1, CCP2, and CCP3 and the color filter layer CFL.

The barrier layers BFL1 and BFL2 may each include at least one inorganic layer. For example, the barrier layers BFL1 and BFL2 may each include an inorganic material. For example, the barrier layers BFL1 and BFL2 may each independently include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may each further include an organic film. The barrier layers BFL1 and BFL2 may each be formed of a single layer or of multiple layers.

In the display apparatus DD of an embodiment, the color filter layer CFL may be disposed on the light control layer CCL. In an embodiment, the color filter layer CFL may be directly disposed on the light control layer CCL. For example, the barrier layer BFL2 may be omitted.

The color filter layer CFL may include a light shielding unit BM and filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may not be separated but may be provided as one filter.

The light shielding part BM may be a black matrix. The light shielding part BM may include an organic light shielding material or an inorganic light shielding material containing a black pigment or dye. The light shielding part BM may prevent light leakage, and may separate boundaries between the adjacent filters CF1, CF2, and CF3. In an embodiment, the light shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may provide a base surface on which the color filter layer CFL, the light control layer CCL, and the like are disposed. The base substrate BL may be a glass substrate, a metal substrate, a plastic substrate, etc. However, embodiments are not limited thereto, and the base substrate BL may include an inorganic layer, an organic layer, or a composite material layer. Although not illustrated in the drawings, in an embodiment, the base substrate BL may be omitted.

FIG. 8 is a schematic cross-sectional view illustrating a part of a display apparatus according to an embodiment. FIG. 8 illustrates a schematic cross-sectional view of a part corresponding to the display panel DP of FIG. 7. In the display apparatus DD-TD of an embodiment, the organic electroluminescence device ED-BT may include light emitting structures OL-B1, OL-B2, and OL-B3. The organic electroluminescence device ED-BT may include a first electrode EL1 and a second electrode EL2 facing each other, and the light emitting structures OL-B1, OL-B2, and OL-B3 stacked in a thickness direction between the first electrode EL1 and the second electrode EL2. The light emitting structures OL-B1, OL-B2, and OL-B3 may each include an emission layer EML (FIG. 7) and a hole transport region HTR and an electron transport region ETR disposed with the emission layer EML (FIG. 7) therebetween.

For example, the organic electroluminescence device ED-BT included in the display apparatus DD-TD of an embodiment may be an organic electroluminescence device having a tandem structure and including multiple emission layers.

In an embodiment illustrated in FIG. 8, light respectively emitted from the light emitting structures OL-B1, OL-B2, and OL-B3 may all be blue light. However, embodiments are not limited thereto, and the light respectively emitted from the light emitting structures OL-B1, OL-B2, and OL-B3 may have wavelength ranges that are different from each other. For example, the organic electroluminescence device ED-BT including the light emitting structures OL-B1, OL-B2, and OL-B3 which emit light having wavelength ranges different from each other may emit white light.

Charge generation layers CGL1 and CGL2 may be disposed between neighboring light emitting structures OL-B1, OL-B2, and OL-B3. The charge generation layers CGL1 and CGL2 may each independently include a p-type charge generation layer and/or an n-type charge generation layer.

Hereinafter, embodiments will be described in more detail through specific Examples and Comparative Examples. The Examples below are only illustrations for assisting the understanding of the disclosure, and the scope thereof is not limited thereto.

EXAMPLES

1. Synthesis of Fused Polycyclic Compound

A synthesis method of the fused polycyclic compound according to an embodiment will be explained by illustrating the synthesis methods of Compounds 8, 15, 21, 28, 58, 61, and 61D. The synthesis methods of the fused polycyclic compounds explained below are only examples, and a synthesis method of the fused polycyclic compound according to an embodiment is not limited to the following examples.

(1) Synthesis of Compound 8

Compound 8 according to an example may be synthesized by, for example, the reaction below.

[Reaction Scheme 1]

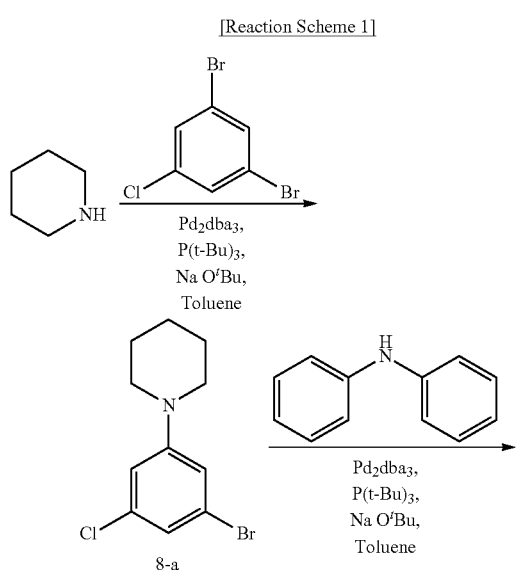

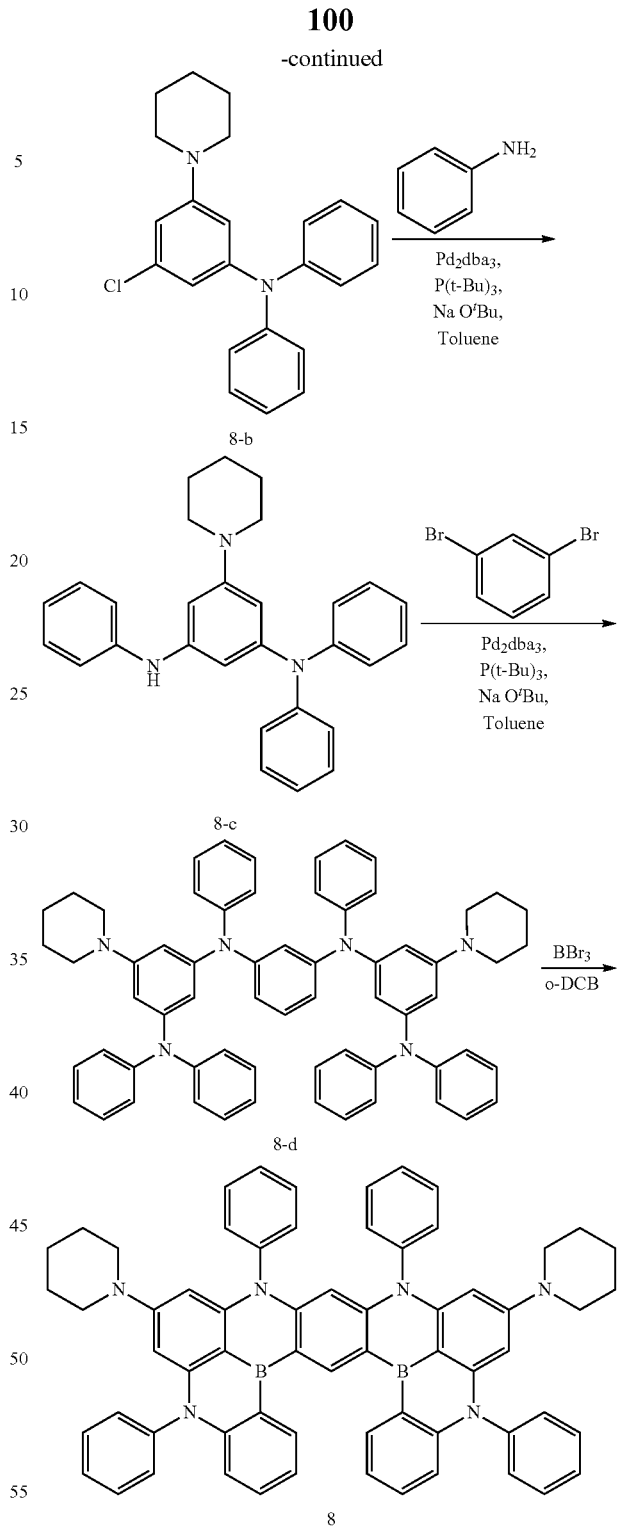

(Synthesis of Intermediate Compound 8-a)

In an argon atmosphere, in a 2 L flask, piperidine (10 g, 117 mmol), 1,3-dibromo-5-chlorobenzene (32 g, 117 mmol), sodium tert-butoxide (34 g, 351 mmol), tris-tert-butyl phosphine (5.5 mL, 12.0 mmol), and $Pd_2dba_3$ (5.4 g, 5.9 mmol) were added and dissolved in 1 L of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 8-a (white solid, 14.7 g, yield: 46%). The obtained white solid was confirmed as Intermediate Compound 8-a through $^1$H-NMR and ESI-LCMS.

$^1$H-NMR (400 MHz, CDCl$_3$): d=7.06 (s, 1H), 6.88 (s, 2H), 3.46 (m, 4H), 1.63 (m, 6H).

ESI-LCMS: [M]$^+$: C$_{11}$H$_{13}$NBrCl. 272.9901.

(Synthesis of Intermediate Compound 8-b)

In an argon atmosphere, in a 2 L flask, Compound 8-a (14 g, 51 mmol), diphenylamine (8.6 g, 51 mmol), sodium tert-butoxide (15 g, 153 mmol), tris-tert-butyl phosphine (2.3 mL, 5.2 mmol), and Pd$_2$dba$_3$ (2.3 g, 2.6 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 8-b (white solid, 14 g, yield: 76%). The obtained white solid was confirmed as Intermediate Compound 8-b through ESI-LCMS.

ESI-LCMS: [M]+: C$_{23}$H$_{23}$N$_2$Cl. 362.1514.

(Synthesis of Intermediate Compound 8-c)

In an argon atmosphere, in a 2 L flask, Compound 8-b (14 g, 39 mmol), diphenylamine (3.7 g, 39 mmol), sodium tert-butoxide (10.3 g, 108 mmol), tris-tert-butyl phosphine (1.7 mL, 3.8 mmol), and Pd$_2$dba$_3$ (1.7 g, 1.9 mmol) were added and dissolved in 400 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 8-c (white solid, 11 g, yield: 68%). The obtained white solid was confirmed as Intermediate Compound 8-c through ESI-LCMS.

ESI-LCMS: [M]+: C$_{29}$H$_{29}$N$_3$. 419.2434.

(Synthesis of Intermediate Compound 8-d)

In an argon atmosphere, in a 2 L flask, Compound 8-c (11 g, 26 mmol), 1,3-dibromobenzene (6.2 g, 26 mmol), sodium tert-butoxide (7.5 g, 78 mmol), tris-tert-butyl phosphine (1.2 mL, 2.6 mmol), and Pd$_2$dba$_3$ (1.2 g, 1.3 mmol) were added and dissolved in 250 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 8-d (white solid, 14 g, yield: 62%). The obtained white solid was confirmed as Intermediate Compound 8-d through ESI-LCMS.

ESI-LCMS: [M]+: C$_{64}$H$_{60}$N$_6$. 912.4865.

(Synthesis of Compound 8)

In an argon atmosphere, in a 1 L flask, Compound 8-d (14 g, 15 mmol) was added and dissolved in 500 mL of 1,2-dichlorobenzene and cooled to about 0° C. BBr$_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using CH$_2$Cl$_2$ and hexane as eluent to obtain Compound 8 (yellow solid, 1.5 g, yield: 11%). The obtained yellow solid was confirmed as Compound 8 through $^1$H-NMR and ESI-LCMS.

$^1$H-NMR (400 MHz, CDCl$_3$): d=10.32 (s, 1H), 9.62 (d, 2H), 7.24 (m, 10H, 7.18 (d, 2H), 7.08 (m, 12H), 6.83 (s, 1H), 6.04 (s, 4H), 3.46 (m, 4H), 1.63 (m, 6H).

ESI-LCMS: [M]+: C$_{64}$H$_{54}$N$_6$B$_2$. 928.3347.

2. Synthesis of Compound 15

Compound 15 according to an example may be synthesized by, for example, the reaction below.

[Reaction Scheme 2]

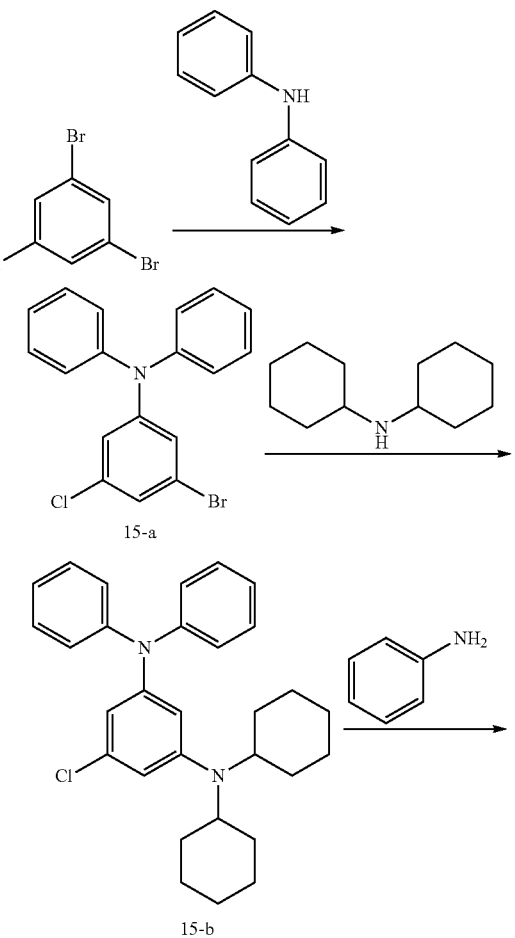

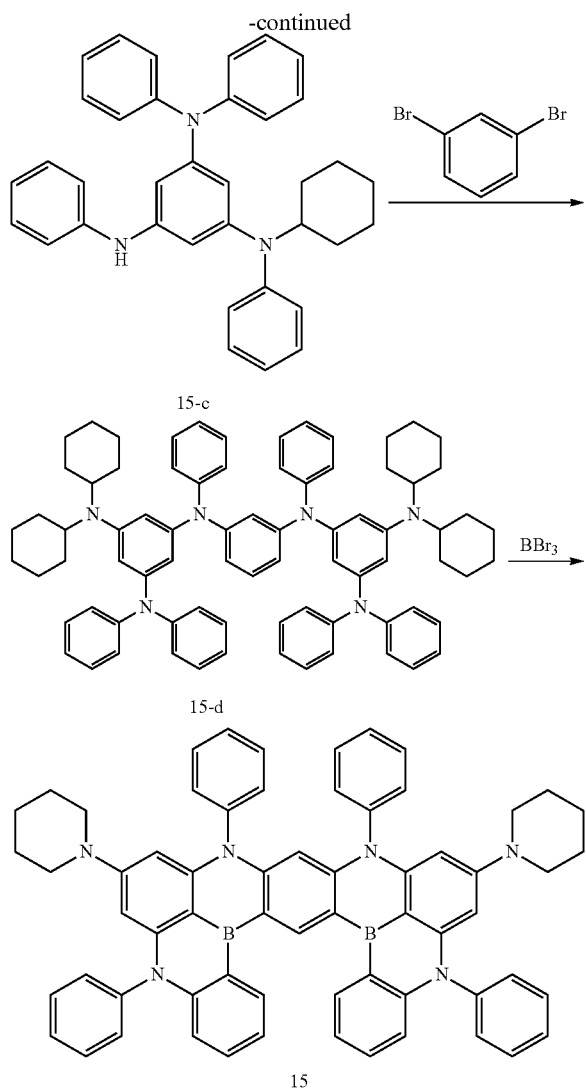

(Synthesis of Intermediate Compound 15-a)

In an argon atmosphere, in a 2 L flask, 1,3-dibromo-5-chlorobenzene (30 g, 111 mmol), dicyclohexylamine (20 g, 111 mmol), sodium tert-butoxide (32 g, 333 mmol), tris-tert-butyl phosphine (5 mL, 11 mmol), and $Pd_2dba_3$ (5 g, 5.5 mmol) were added and dissolved in 1 L of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 15-a (white solid, 17 g, yield: 42%). The obtained white solid was confirmed as Intermediate Compound 15-a through $^1$H-NMR and ESI-LCMS.

$^1$H-NMR (400 MHz, $CDCl_3$): d=7.06 (s, 1H), 6.77 (s, 2H), 2.57 (m, 2H), 1.71 (m, 8H), 1.11 (m, 8H).

ESI-LCMS: [M]+: $C_{18}H_{25}NBrCl$. 369.0014.

(Synthesis of Intermediate Compound 15-b)

In an argon atmosphere, in a 2 L flask, Compound 15-a (17 g, 46 mmol), diphenylamine (7.7 g, 46 mmol), sodium tert-butoxide (13 g, 138 mmol), tris-tert-butyl phosphine (2.1 mL, 4.6 mmol), and $Pd_2dba_3$ (2.1 g, 2.3 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 15-b (white solid, 15 g, yield: 72%). The obtained white solid was confirmed as Intermediate Compound 15-b through ESI-LCMS.

ESI-LCMS: [M]+: $C_{30}H_{35}N_2Cl$. 458.2449.

(Synthesis of Intermediate Compound 15-c)

In an argon atmosphere, in a 2 L flask, Compound 15-b (15 g, 32 mmol), aniline (3.1 g, 32 mmol), sodium tert-butoxide (9.4 g, 96 mmol), tris-tert-butyl phosphine (1.5 mL, 3.2 mmol), and $Pd_2dba_3$ (1.5 g, 1.6 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 15-c (white solid, 11 g, yield: 68%). The obtained white solid was confirmed as Intermediate Compound 15-c through ESI-LCMS.

ESI-LCMS: [M]+: $C_{36}H_{41}N_3$. 515.3336.

(Synthesis of Intermediate Compound 15-d)

In an argon atmosphere, in a 2 L flask, Compound 15-c (11 g, 21 mmol), 1,3-dibromobenzene (5.0 g, 21 mmol), sodium tert-butoxide (6 g, 63 mmol), tris-tert-butyl phosphine (1 mL, 2 mmol), and $Pd_2dba_3$ (0.96 g, 1.0 mmol) were added and dissolved in 200 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 15-d (white solid, 15 g, yield: 66%). The obtained white solid was confirmed as Intermediate Compound 15-d through ESI-LCMS.

ESI-LCMS: [M]+: $C_{78}H_{84}N_6$. 1104.6874.

(Synthesis of Compound 15)

In an argon atmosphere, in a 1 L flask, Compound 15-d (15 g, 14 mmol) was added and dissolved in 500 mL of 1,2-dichlorobenzene and cooled to about 0° C. $BBr_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using $CH_2Cl_2$ and hexane as eluent to obtain Compound 15 (yellow solid, 1.2 g, yield:

11%). The obtained yellow solid was confirmed as Compound 15 through $^1$H-NMR and ESI-LCMS.

$^1$H-NMR (400 MHz, CDCl$_3$): d=10.46 (s, 1H), 9.43 (d, 2H), 7.21 (m, 10H), 7.15 (d, 2H), 7.03 (m, 12H), 6.81 (s, 1H), 6.14 (s, 4H), 2.57 (m, 4H), 1.63 (m, 16H), 1.21 (m, 16H).

ESI-LCMS: [M]+: C$_{78}$H$_{78}$N$_6$B$_2$. 1120.6544.

3. Synthesis of Compound 21

Compound 21 according to an example may be synthesized by, for example, the reaction below.

[Reaction Scheme 3]

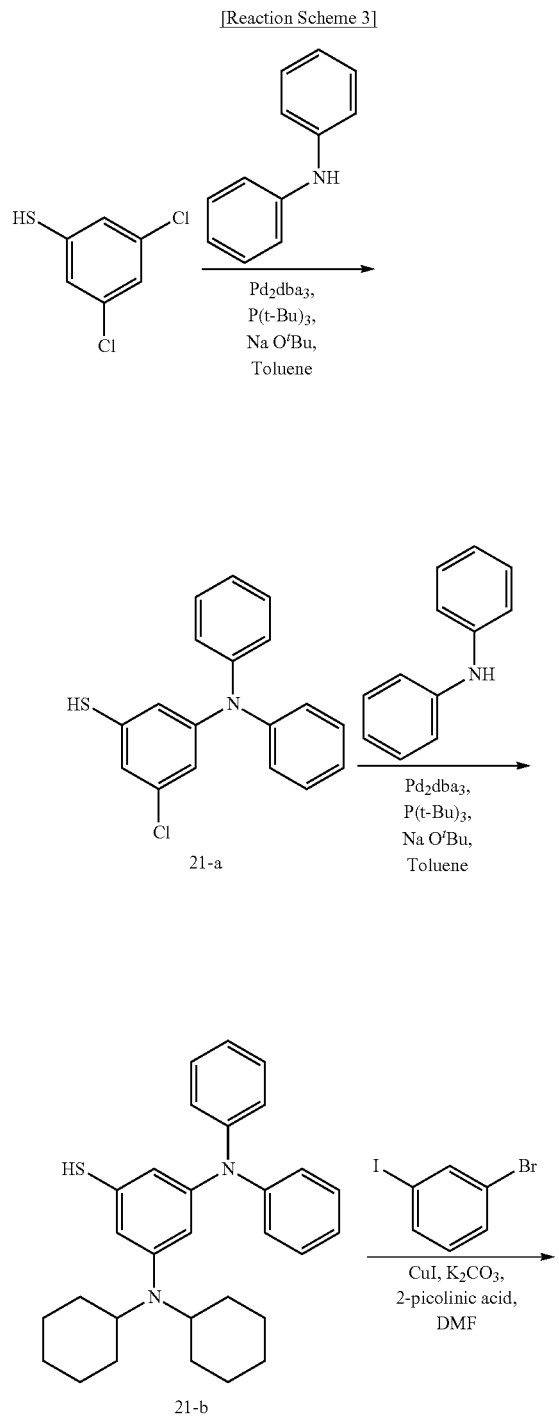

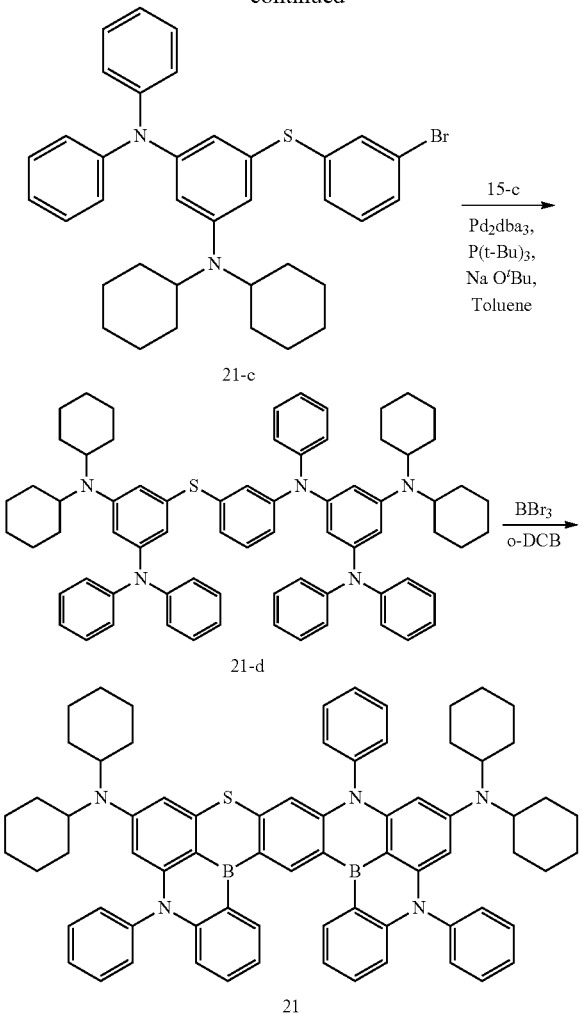

(Synthesis of Intermediate Compound 21-a)

In an argon atmosphere, in a 2 L flask, 3,5-dichloro-thiol (20 g, 111 mmol), diphenylamine (19 g, 111 mmol), sodium tert-butoxide (32 g, 333 mmol), tris-tert-butyl phosphine (5 mL, 11.2 mmol), and Pd$_2$dba$_3$ (5 g, 5.6 mmol) were added and dissolved in 1 L of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 21-a (white solid, 21 g, yield: 63%). The obtained white solid was confirmed as Intermediate Compound 21-a through ESI-LCMS.

ESI-LCMS: [M]+: C$_{18}$H$_{14}$NClS. 311.0501.

(Synthesis of Intermediate Compound 21-b)

In an argon atmosphere, in a 2 L flask, Compound 21-a (20 g, 67 mmol), diphenylamine (12 g, 67 mmol), sodium tert-butoxide (19 g, 201 mmol), tris-tert-butyl phosphine (3 mL, 6.8 mmol), and Pd$_2$dba$_3$ (3 g, 3.4 mmol) were added and dissolved in 700 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 21-b (white solid, 22 g, yield: 73%). The obtained white solid was confirmed as Intermediate Compound 21-b through ESI-LCMS.

ESI-LCMS: [M]+: C$_{30}$H$_{36}$N$_2$S. 456.2439.
(Synthesis of Intermediate Compound 21-c)

In an argon atmosphere, in a 2 L flask, Compound 21-b (20 g, 44 mmol), 1-bromo-3-iodobenzene (12.4 g, 44 mmol), CuI (8.3 g, 44 mmol), K$_2$CO$_3$ (18 g, 132 mmol), and 2-picolinic acid (5.4 g, 44 mmol) were added and dissolved in 500 mL of DMF, and the reaction solution was stirred at about 160° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 21-c (white solid, 17 g, yield: 65%). The obtained white solid was confirmed as Intermediate Compound 21-c through ESI-LCMS.

ESI-LCMS: [M]+: C$_{36}$H$_{39}$N$_2$SBr. 610.1986.
(Synthesis of Intermediate Compound 21-d)

In an argon atmosphere, in a 2 L flask, Compound 21-c (17 g, 28 mmol), Compound 15-c (14 g, 28 mmol), sodium tert-butoxide (8.0 g, 84 mmol), tris-tert-butyl phosphine (1.3 mL, 2.8 mmol), and Pd$_2$dba$_3$ (1.3 g, 1.4 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 21-d (white solid, 22 g, yield: 68%). The obtained white solid was confirmed as Intermediate Compound 21-d through ESI-LCMS.

ESI-LCMS: [M]+: C$_{72}$H$_{79}$N$_5$S. 1045.6007.
(Synthesis of Compound 21)

In an argon atmosphere, in a 1 L flask, Compound 21-d (20 g, 19 mmol) was added and dissolved in 500 mL of 1,2-dichlorobenzene and cooled to about 0° C. BBr$_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using CH$_2$Cl$_2$ and hexane as eluent to obtain Compound 21 (yellow solid, 1.8 g, yield: 9%). The obtained yellow solid was confirmed as Compound 21 through $^1$H-NMR and ESI-LCMS.

$^1$H-NMR (400 MHz, CDCl$_3$): d=10.36 (s, 1H), 9.22 (d, 2H), 7.76 (s, 1H), 7.29 (m, 10H), 7.09 (m, 6H), 7.00 (m, 4H), 6.12 (s, 1H), 6.04 (s, 2H), 2.57 (q, 4H), 1.71 (m, 16H), 1.34 (m, 16H).

ESI-LCMS: [M]+: C$_{72}$H$_{73}$N$_5$B$_2$S. 1061.5733.

4. Synthesis of Compound 28

Compound 28 according to an example may be synthesized by, for example, the reaction below.

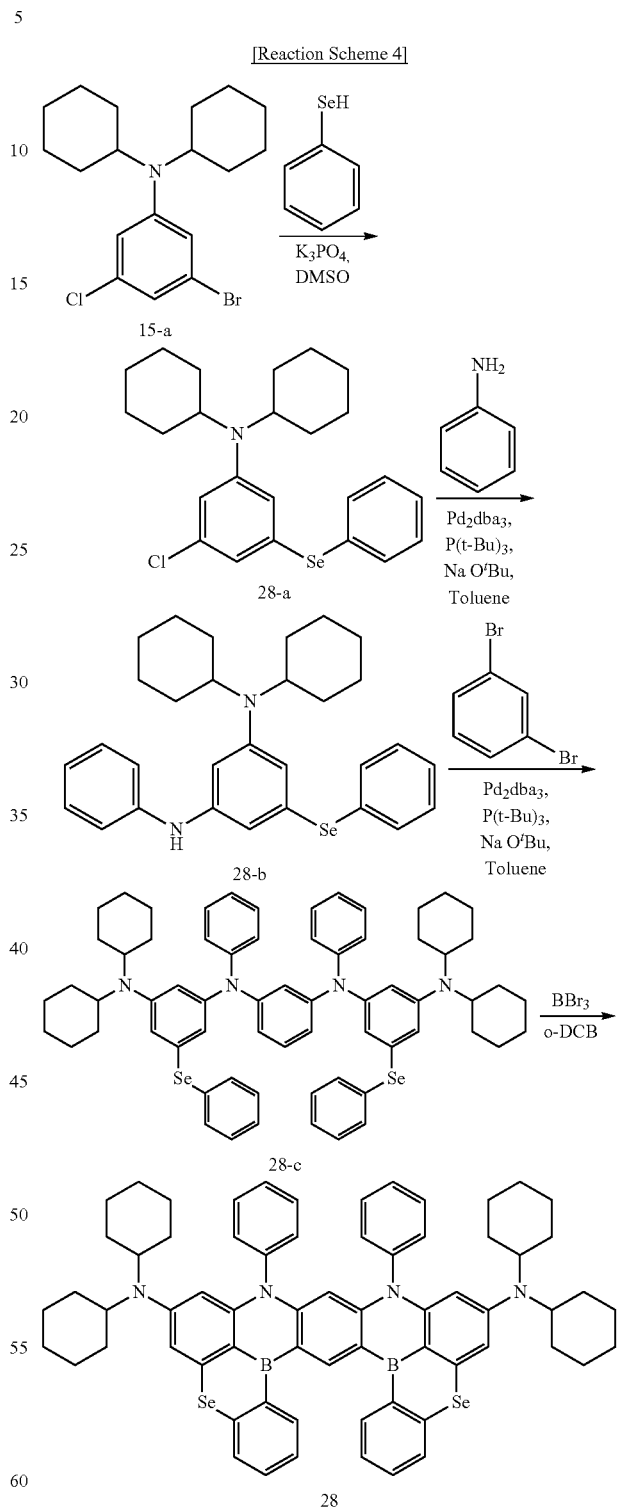

[Reaction Scheme 4]

(Synthesis of Intermediate Compound 28-a)

In an argon atmosphere, in a 2 L flask, Compound 15-a (20 g, 54 mmol), benzene-selenol (8.5 g, 54 mmol), and K$_3$PO$_4$ (35 g, 162 mmol) were added and dissolved in 500 mL of DMSO, and the reaction solution was stirred at about 180° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 28-a (white solid, 13 g, yield: 54%). The obtained white solid was confirmed as Intermediate Compound 28-a through ESI-LCMS.

ESI-LCMS: [M]+: C$_{24}$H$_{30}$NSeCl. 447.1202.

(Synthesis of Intermediate Compound 28-b)

In an argon atmosphere, in a 2 L flask, Compound 28-a (13 g, 29 mmol), aniline (2.8 g, 29 mmol), sodium tert-butoxide (8.4 g, 87 mmol), tris-tert-butyl phosphine (1.3 mL, 2.8 mmol), and Pd$_2$dba$_3$ (1.3 g, 1.4 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 28-b (white solid, 10 g, yield: 71%). The obtained white solid was confirmed as Intermediate Compound 28-b through ESI-LCMS.

ESI-LCMS: [M]+: C$_{30}$H$_{36}$N$_2$Se. 504.2001.

(Synthesis of Intermediate Compound 28-c)

In an argon atmosphere, in a 2 L flask, Compound 28-b (10 g, 20 mmol), 1,3-dibromobenzene (2.4 g, 10 mmol), sodium tert-butoxide (2.8 g, 30 mmol), tris-tert-butyl phosphine (0.5 mL, 1.0 mmol), and Pd$_2$dba$_3$ (0.5 g, 0.5 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 28-c (white solid, 7.3 g, yield: 68%). The obtained white solid was confirmed as Intermediate Compound 28-c through ESI-LCMS.

ESI-LCMS: [M]+: C$_{66}$H$_{74}$N$_4$Se$_2$. 1082.4207.

(Synthesis of Compound 28)

In an argon atmosphere, in a 1 L flask, Compound 28-c (20 g, 18 mmol) was added and dissolved in 500 mL of 1,2-dichlorobenzene and cooled to about 0° C. BBr$_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using CH$_2$Cl$_2$ and hexane as eluent to obtain Compound 28 (yellow solid, 1.2 g, yield: 6%). The obtained yellow solid was confirmed as Compound 28 through $^1$H-NMR and ESI-LCMS.

$^1$H-NMR (400 MHz, CDCl$_3$): d=10.12 (s, 1H), 9.31 (d, 2H), 7.35 (m, 6H), 7.24 (m, 4H), 7.00 (m, 6H), 6.83 (s, 1H), 6.38 (s, 2H), 6.34 (s, 2H), 2.62 (q, 4H), 1.66 (m, 16H), 1.11 (m, 16H).

ESI-LCMS: [M]+: C$_{66}$H$_{68}$N$_4$B$_2$Se$_2$. 1097.8403.

5. Synthesis of Compound 58

Compound 58 according to an example may be synthesized by, for example, the reaction below.

[Reaction Scheme 5]

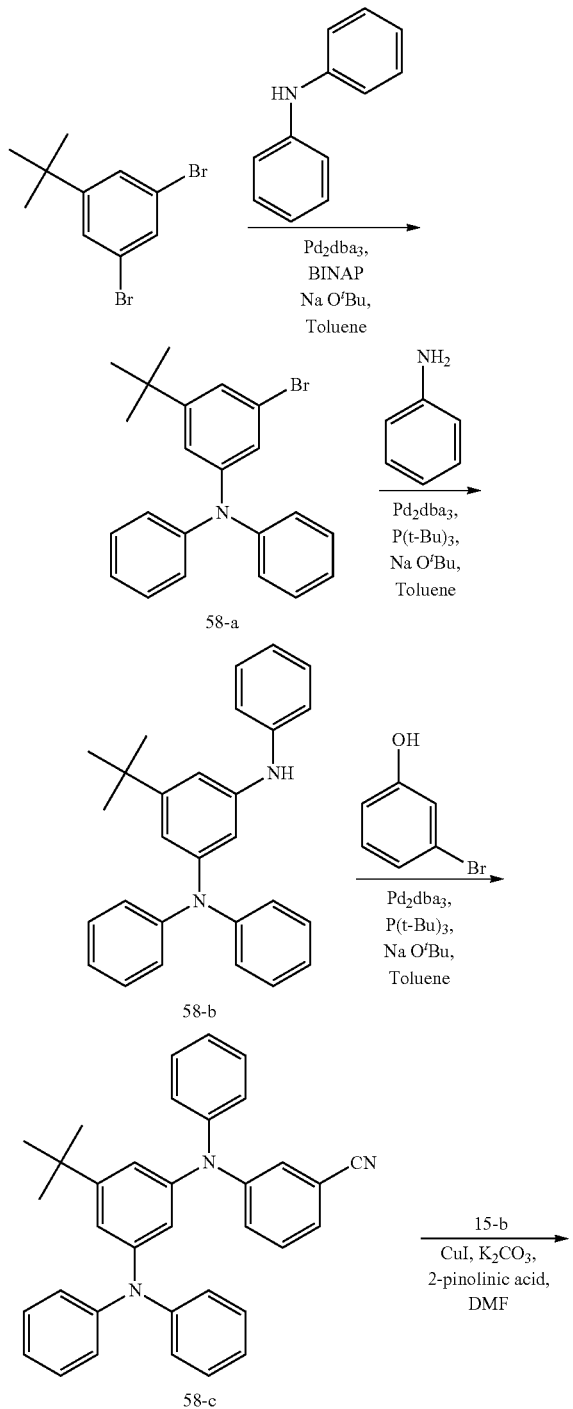

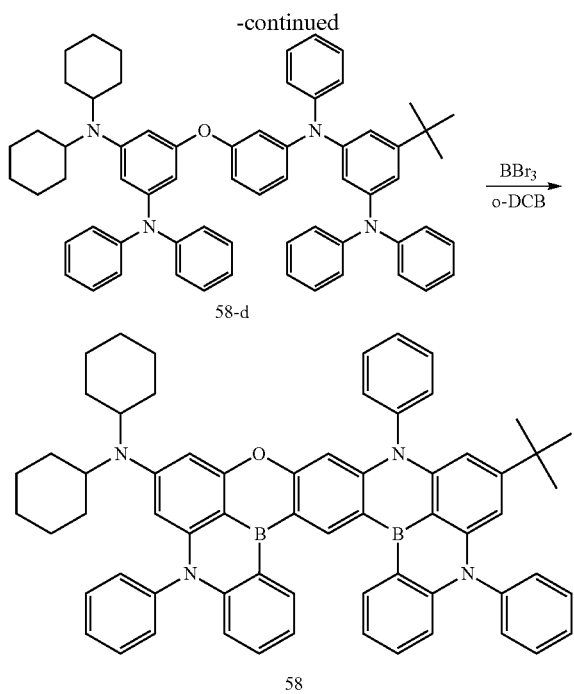

58-d

58

(Synthesis of Intermediate Compound 58-a)

In an argon atmosphere, in a 2 L flask, 1,3-dibromo-5-(tert-butyl)benzene (20 g, 68 mmol), diphenylamine (11.5 g, 68 mmol), sodium tert-butoxide (19.5 g, 204 mmol), BINAP (4.2 mL, 6.8 mmol), and $Pd_2dba_3$ (3.1 g, 3.4 mmol) were added and dissolved in 700 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 58-a (white solid, 17 g, yield: 67%). The obtained white solid was confirmed as Intermediate Compound 58-a through $^1$H-NMR and ESI-LCMS.

$^1$H-NMR (400 MHz, $CDCl_3$): d=7.34 (s, 1H), 7.24 (m, 5H), 7.08 (d, 4H), 7.02 (m, 3H), 1.32 (s, 9H).

ESI-LCMS: $[M]^+$: $C_{22}H_{22}BrN$. 379.0910.

(Synthesis of Intermediate Compound 58-b)

In an argon atmosphere, in a 2 L flask, Compound 58-a (17 g, 45 mmol), aniline (4.3 g, 45 mmol), sodium tert-butoxide (13 g, 135 mmol), tris-tert-butyl phosphine (2.0 mL, 4.6 mmol), and $Pd_2dba_3$ (2.0 g, 2.3 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 58-b (white solid, 13 g, yield: 73%). The obtained white solid was confirmed as Intermediate Compound 58-b through ESI-LCMS.

ESI-LCMS: $[M]^+$: $C_{28}H_{28}N_2$. 392.2301.

(Synthesis of Intermediate Compound 58-c)

In an argon atmosphere, in a 2 L flask, Compound 58-b (17 g, 33 mmol), 3-bromophenol (5.7 g, 33 mmol), sodium tert-butoxide (9.5 g, 99 mmol), tris-tert-butyl phosphine (1.5 mL, 3.4 mmol), and $Pd_2dba_3$ (1.5 g, 1.7 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 58-c (white solid, 9.1 g, yield: 57%). The obtained white solid was confirmed as Intermediate Compound 58-c through ESI-LCMS.

ESI-LCMS: $[M]^+$: $C_{34}H_{32}N_2O$. 484.2521.

(Synthesis of Intermediate Compound 58-d)

In an argon atmosphere, in a 1 L flask, Compound 58-c (9 g, 18 mmol), Compound 15-b (8.2 g, 18 mmol), CuI (3.4 g, 56 mmol), $K_2CO_3$ (7.5 g, 54 mmol), and $Pd_2dba_3$ (0.83 g, 0.9 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 58-d (white solid, 10.7 g, yield: 66%). The obtained white solid was confirmed as Intermediate Compound 58-d through ESI-LCMS.

ESI-LCMS: $[M]^+$: $C_{64}H_{66}N_4O$. 906.5221.

(Synthesis of Compound 58)

In an argon atmosphere, in a 1 L flask, Compound 58-d (9 g, 18 mmol) was added and dissolved in 500 mL of 1,2-dichlorobenzene and cooled to about 0° C. $BBr_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using $CH_2Cl_2$ and hexane as eluent to obtain Compound 58 (yellow solid, 1.3 g, yield: 8%). The obtained yellow solid was confirmed as Compound 58 through $^1$H-NMR and ESI-LCMS.

$^1$H-NMR (400 MHz, $CDCl_3$): d=10.34 (s, 1H), 9.27 (d, 2H), 7.28 (m, 8H), 7.08 (m, 6H), 7.00 (m, 5H), 6.90 (s, 1H), 6.07 (s, 2H), 2.55 (q, 2H), 1.46 (m, 8H), 1.33 (s, 9H), 1.11 (m, 12H).

ESI-LCMS: $[M]^+$: $C_{64}H_{60}N_4B_2O$. 922.4938.

6. Synthesis of Compound 61

Compound 61 according to an example may be synthesized by, for example, the reaction below.

[Reaction Scheme 6]
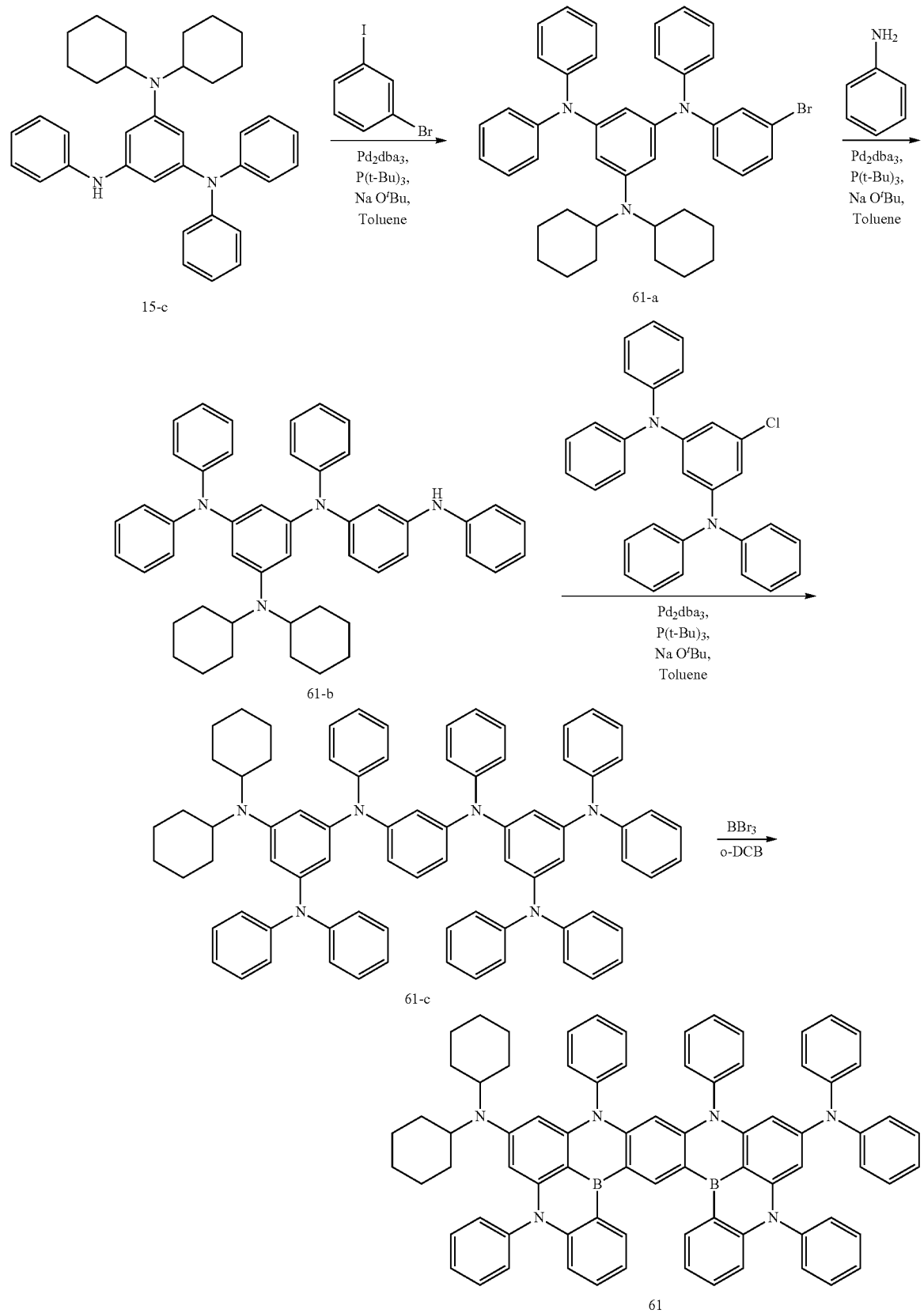

(Synthesis of Intermediate Compound 61-a)

In an argon atmosphere, in a 2 L flask, Compound 15-c (30 g, 58 mmol), 1-bromo-3-iodobenzene (11 g, 58 mmol), sodium tert-butoxide (16 g, 174 mmol), tris-tert-butyl phosphine (2.6 mL, 5.8 mmol), and $Pd_2dba_3$ (2.6 g, 2.9 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61-a (white solid, 27 g, yield: 68%). The obtained white solid was confirmed as Intermediate Compound 61-a through ESI-LCMS.

ESI-LCMS: $[M]^+$: $C_{42}H_{44}N_3Br$. 669.2731.

(Synthesis of Intermediate Compound 61-b)

In an argon atmosphere, in a 2 L flask, Compound 61-a (27 g, 40 mmol), aniline (3.9 g, 40 mmol), sodium tert-butoxide (11.5 g, 120 mmol), tris-tert-butyl phosphine (1.8 mL, 4.0 mmol), and $Pd_2dba_3$ (1.8 g, 2.0 mmol) were added and dissolved in 400 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61-b (white solid, 20 g, yield: 76%). The obtained white solid was confirmed as Intermediate Compound 61-b through ESI-LCMS.

ESI-LCMS: $[M]^+$: $C_{48}H_{50}N_4$. 682.4003.

(Synthesis of Intermediate Compound 61-c)

In an argon atmosphere, in a 2 L flask, Compound 61-b (20 g, 29 mmol), 5-chloro-N1,N1,N3,N3-tetraphenylbenzene-1,3-diamine (13 g, 29 mmol), sodium tert-butoxide (8.3 g, 87 mmol), tris-tert-butyl phosphine (1.3 mL, 3.0 mmol), and $Pd_2dba_3$ (1.3 g, 1.5 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61-c (white solid, 18 g, yield: 57%). The obtained white solid was confirmed as Intermediate Compound 61-c through ESI-LCMS.

ESI-LCMS: $[M]^+$: $C_{78}H_{72}N_6$. 1092.5800.

(Synthesis of Compound 61)

In an argon atmosphere, in a 1 L flask, Compound 61-c (18 g, 16 mmol) was added and dissolved in 500 mL of 1,2-dichlorobenzene and cooled to about 0° C. $BBr_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using $CH_2Cl_2$ and hexane as eluent to obtain Compound 61 (yellow solid, 1.2 g, yield: 7%). The obtained yellow solid was confirmed as Compound 61 through $^1$H-NMR and ESI-LCMS.

$^1$H-NMR (400 MHz, $CDCl_3$): d=10.21 (s, 1H), 9.46 (d, 2H), 7.24 (m, 16H), 7.08 (m, 12H), 7.00 (m, 8H), 6.77 (s, 1H), 6.45 (s, 2H), 6.05 (s, 2H), 2.59 (q, 2H), 1.46 (m, 12H), 1.26 (m, 8H).

ESI-LCMS: $[M]^+$: $C_{78}H_{66}N_6B_2$. 1108.5541.

7. Synthesis of Compound 61D

Compound 61D according to an example may be synthesized by, for example, the reaction below.

[Reaction Scheme 7]

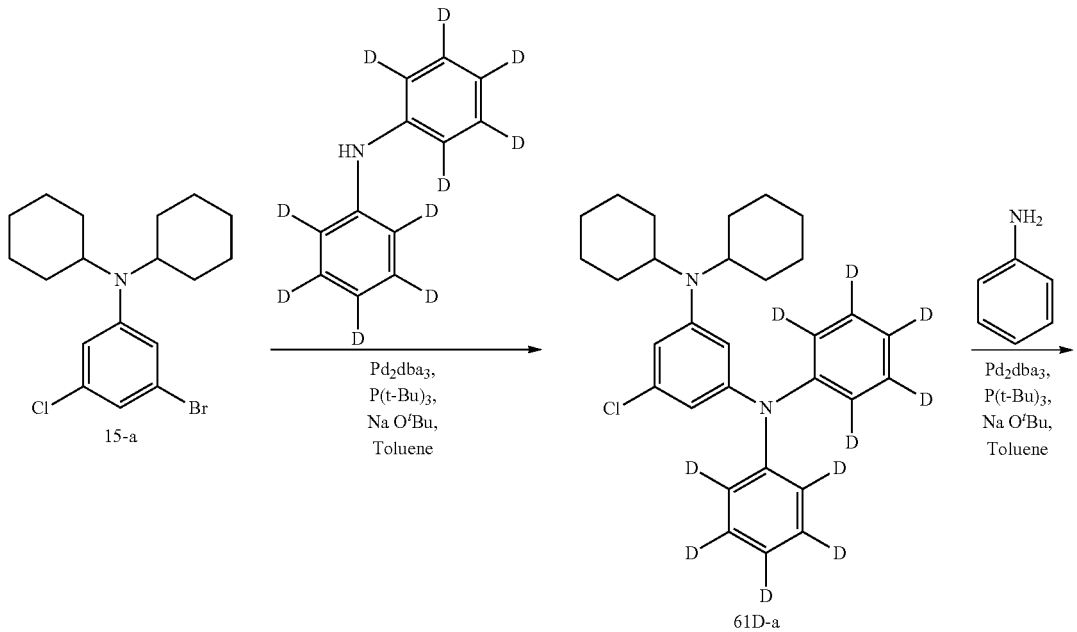

-continued
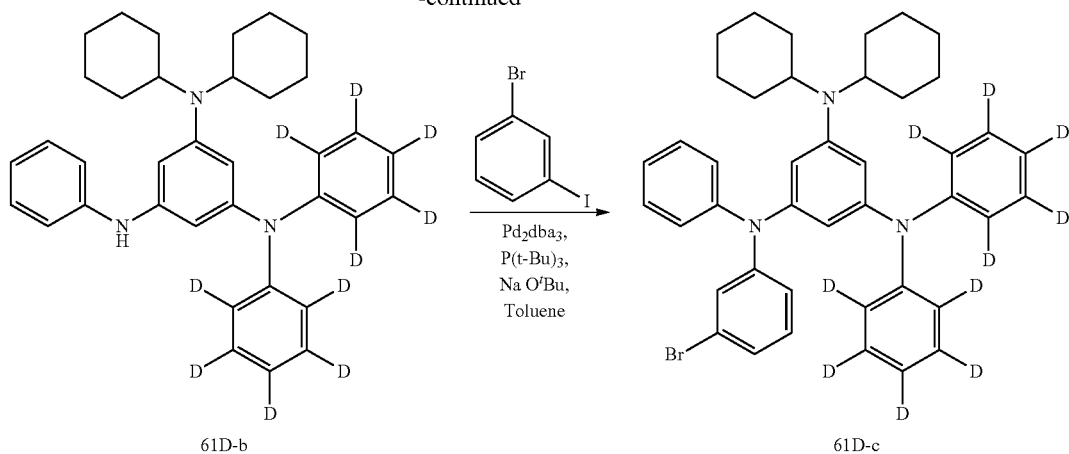
61D-b
61D-c
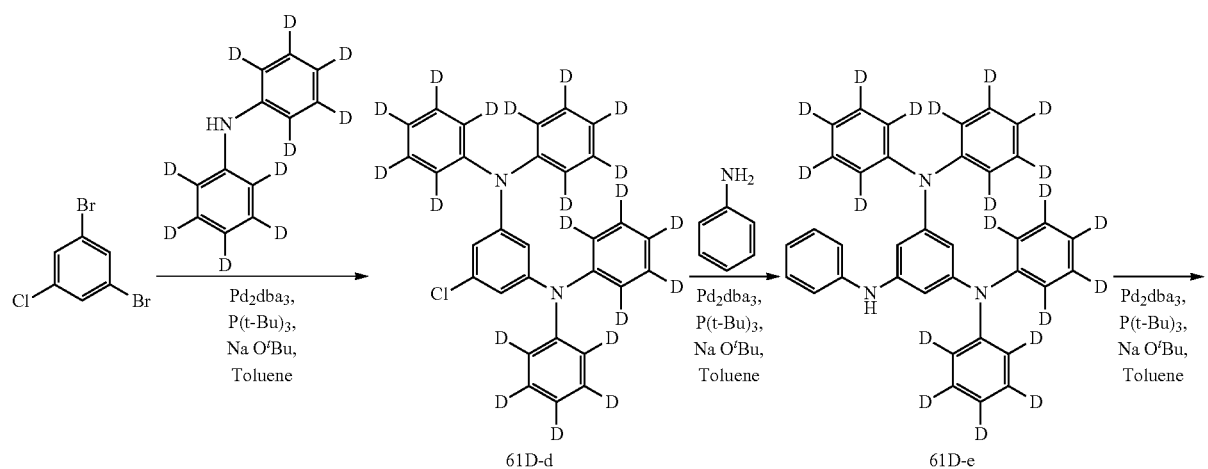
61D-d                    61D-e
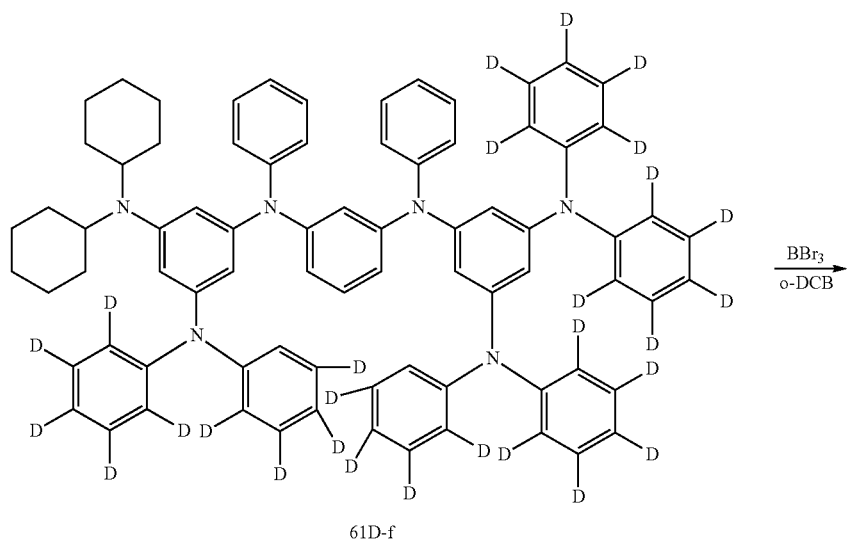
61D-f

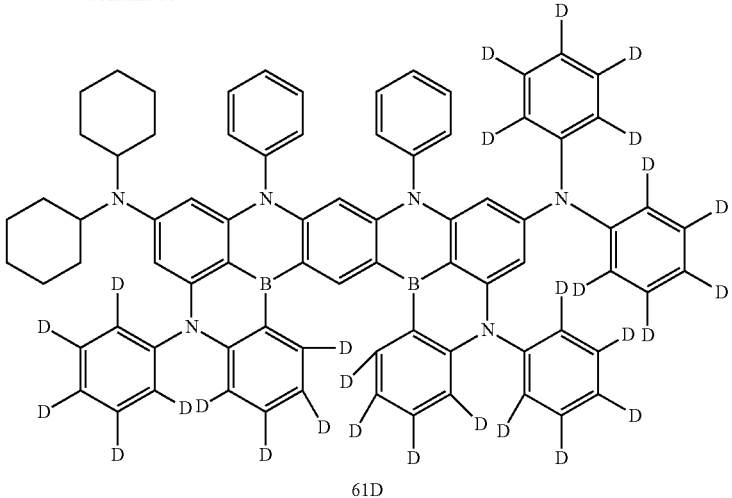

61D (Synthesis of Intermediate Compound 61D-a)

In an argon atmosphere, in a 2 L flask, Compound 15-a (20 g, 54 mmol), bis(phenyl-$d_5$)amine (9.7 g, 54 mmol), sodium tert-butoxide (15.5 g, 162 mmol), tris-tert-butyl phosphine (2.5 mL, 5.4 mmol), and $Pd_2dba_3$ (2.5 g, 2.7 mmol) were added and dissolved in 600 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61D-a (white solid, 18 g, yield: 71%). The obtained white solid was confirmed as Intermediate Compound 61D-a through $^1$H-NMR and ESI-LCMS.

$^1$H-NMR (400 MHz, $CDCl_3$): d=6.71 (s, 1H), 6.61 (s, 1H), 6.26 (s, 1H), 2.57 (q, 2H), 1.71 (m, 4H), 1.46 (m, 4H), 1.21 (m, 8H).

ESI-LCMS: $[M]^+$: $C_{30}H_{25}D_{10}N_2Cl$. 468.3111.

(Synthesis of Intermediate Compound 61D-b)

In an argon atmosphere, in a 2 L flask, Compound 61D-a (18 g, 38 mmol), aniline (3.6 g, 38 mmol), sodium tert-butoxide (11 g, 114 mmol), tris-tert-butyl phosphine (1.8 mL, 3.8 mmol), and $Pd_2dba_3$ (1.8 g, 1.9 mmol) were added and dissolved in 400 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61D-b (white solid, 14.5 g, yield: 73%). The obtained white solid was confirmed as Intermediate Compound 61D-b through ESI-LCMS.

ESI-LCMS: $[M]^+$: $C_{36}H_{31}D_{10}N_3$. 545.3893.

(Synthesis of Intermediate Compound 61D-c)

In an argon atmosphere, in a 2 L flask, Compound 61D-b (14 g, 26 mmol), 1-bromo-3-iodobenzene (7.5 g, 26 mmol), sodium tert-butoxide (7.5 g, 78 mmol), tris-tert-butyl phosphine (1.2 mL, 2.6 mmol), and $Pd_2dba_3$ (1.2 g, 1.3 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61D-c (white solid, 10 g, yield: 58%). The obtained white solid was confirmed as Intermediate Compound 61D-c through ESI-LCMS.

ESI-LCMS: $[M]^+$: $C_{42}H_{34}D_{10}N_3Br$. 679.3331.

(Synthesis of Intermediate Compound 61D-d)

In an argon atmosphere, in a 2 L flask, 1,3-dibromo-5-chlorobenzene (20 g, 74 mmol), bis(phenyl-$d_5$)amine (26 g, 148 mmol), sodium tert-butoxide (21 g, 222 mmol), tris-tert-butyl phosphine (3.4 mL, 7.4 mmol), and $Pd_2dba_3$ (3.4 g, 3.7 mmol) were added and dissolved in 700 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using $CH_2Cl_2$ and hexane as eluent to obtain Intermediate Compound 61D-d (white solid, 24 g, yield: 69%). The obtained white solid was confirmed as Intermediate Compound 61D-d through ESI-LCMS.

ESI-LCMS: $[M]^+$: $C_{30}H_3D_{10}N_2Cl$. 466.2838.

(Synthesis of Intermediate Compound 61D-e)

In an argon atmosphere, in a 2 L flask, Compound 61D-d (24 g, 51 mmol), aniline (5 g, 51 mmol), sodium tert-butoxide (14.7 g, 153 mmol), tris-tert-butyl phosphine (2.3 mL, 5.2 mmol), and $Pd_2dba_3$ (2.3 g, 2.6 mmol) were added and dissolved in 500 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over $MgSO_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 61D-e (white solid, 17 g, yield: 65%). The obtained white solid was confirmed as Intermediate Compound 61D-e through ESI-LCMS.

ESI-LCMS: [M]$^+$: C$_{36}$H$_9$D$_{20}$N$_3$. 523.3637.

(Synthesis of Intermediate Compound 61D-f)

In an argon atmosphere, in a 2 L flask, Compound 61D-e (17 g, 32 mmol), Compound 61D-c (22 g, 32 mmol), sodium tert-butoxide (9.2 g, 96 mmol), tris-tert-butyl phosphine (1.4 mL, 3.2 mmol), and Pd$_2$dba$_3$ (1.4 g, 1.6 mmol) were added and dissolved in 300 mL of toluene, and the reaction solution was stirred at about 100° C. for about 12 hours. After cooling, the reaction solution was extracted by adding water (1 L) and ethyl acetate (300 mL) to collect organic layers, and the organic layers were dried over MgSO$_4$ and filtered. In the filtrate, the solvent was removed under reduced pressure to obtain a solid. The solid thus obtained was purified and separated by silica gel column chromatography using CH$_2$Cl$_2$ and hexane as eluent to obtain Intermediate Compound 61D-f (white solid, 20 g, yield: 56%). The obtained white solid was confirmed as Intermediate Compound 61D-f through ESI-LCMS.

ESI-LCMS: [M]$^+$: C$_{78}$H$_{44}$D$_{28}$N$_6$. 1120.7667.

(Synthesis of Compound 61D)

In an argon atmosphere, in a 1 L flask, Compound 61-f (20 g, 18 mmol) was added and dissolved in 500 mL of 1,2-dichlorobenzene and cooled to about 0° C. BBr$_3$ (5 equiv.) was slowly dropped thereto, and the reaction solution was stirred at the same temperature for about 20 minutes, and was heated to about 180° C. and further stirred for about 12 hours. After the reaction solution was cooled, triethylamine (10 equiv.) was slowly added thereto to terminate the reaction, and the reaction solution was extracted by adding water (1 L) and dichloromethane (300 mL) to collect organic layers, and the solvent was removed under reduced pressure. The solid thus obtained was purified and separated by silica gel column chromatography using CH$_2$Cl$_2$ and hexane as eluent to obtain Compound 61D (yellow solid, 1.2 g, yield: 6%). The obtained yellow solid was confirmed as Compound 61D through 41-NMR and ESI-LCMS.

$^1$H-NMR (400 MHz, CDCl$_3$): d=10.33 (s, 1H), 9.51 (d, 2H), 7.24 (m, 4H), 7.05 (m, 4H), 7.00 (t, 2H), 6.83 (s, 1H), 6.49 (s, 2H), 6.01 (s, 2H), 2.44 (q, 2H), 1.46 (m, 8H), 1.44 (m, 4H), 1.26 (m, 8H).

ESI-LCMS: [M]$^+$: C$_{78}$H$_{38}$D$_{28}$B$_2$N$_6$. 1136.7437.

2. Manufacture and Evaluation of Organic Electroluminescence Device Including Fused Polycyclic Compound The organic electroluminescence device of an example including Example Compounds and Comparative Example Compounds in the emission layer was manufactured as follows.

(Example Compound)

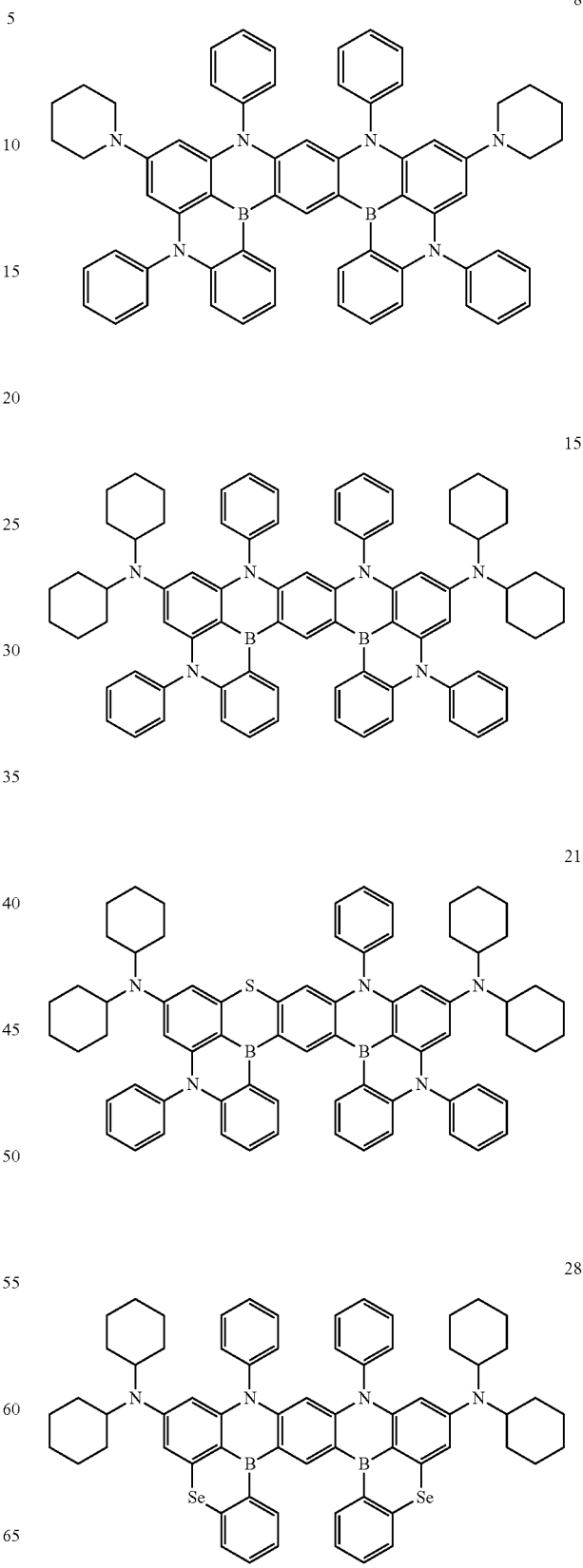

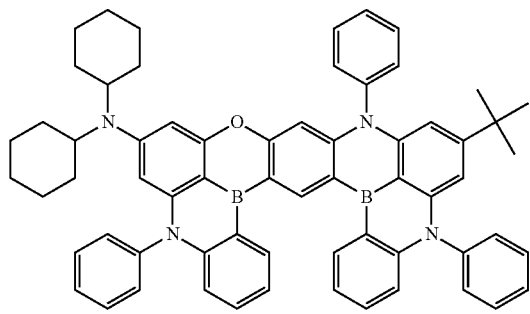

58

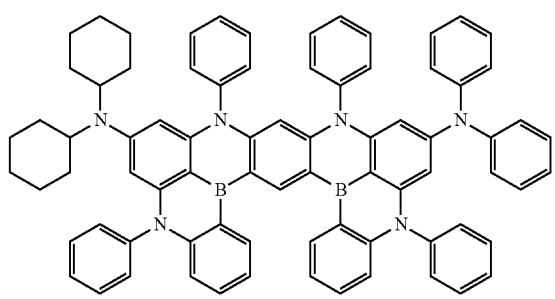

61

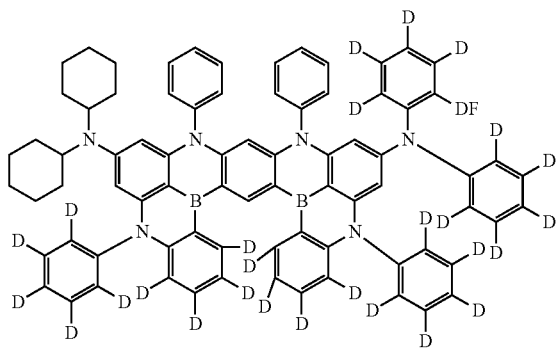

61D

Comparative Example Compound

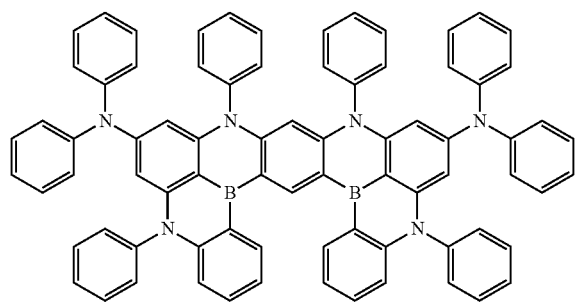

C-1

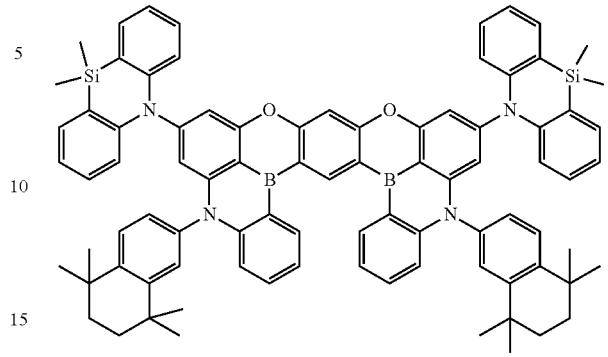

C-2

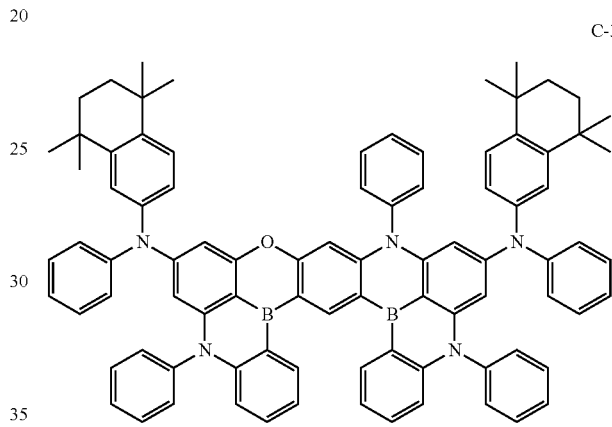

C-3

(Manufacture of Organic Electroluminescence Device)

NPD was deposited in vacuum on the upper portion of the ITO anode formed on the glass substrate to form a 300 Å-thick hole injection layer, and H-1-19 was deposited in vacuum on the upper portion of the hole injection layer to form a 200 Å-thick hole transport layer.

CzSi was deposited in vacuum on the upper portion of the hole transport layer to form a 100 Å-thick electron blocking layer.

Compound E-2-20 and Example Compound or Comparative Example Compound as Table 1 below were co-deposited on the upper portion of the electron blocking layer at a weight ratio of 99:1 to form a 200 Å-thick emission layer.

TSPO1 was deposited on the upper portion of the emission layer to form a 200 Å-thick electron transport layer, and TPBi as an electron injection layer compound was deposited on the upper portion of the electron transport layer to be a thickness of about 300 Å.

LiF as a halogenated alkali metal was deposited on the upper portion of the electron transport layer to form a 10 Å-thick electron injection layer, and Al was deposited in vacuum to form a 3,000 Å-thick LiF/Al electrode (negative electrode). Compound P4 was deposited in vacuum on the upper portion of the electrode to form a 700 Å-thick capping layer, thereby manufacturing a light emitting device.

Compounds used for manufacturing the organic electroluminescence devices are disclosed below.

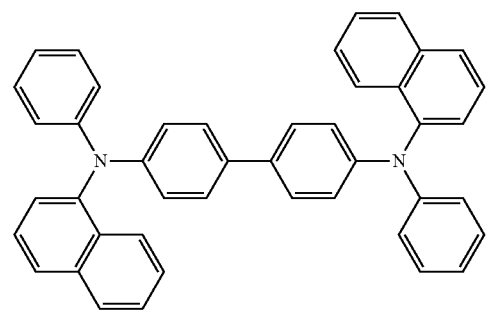

NPD

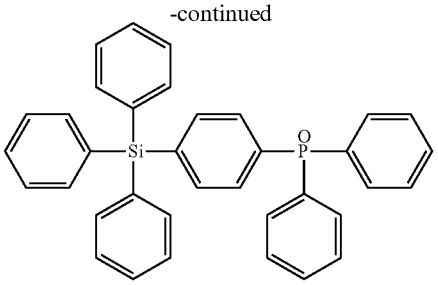

TSPO1

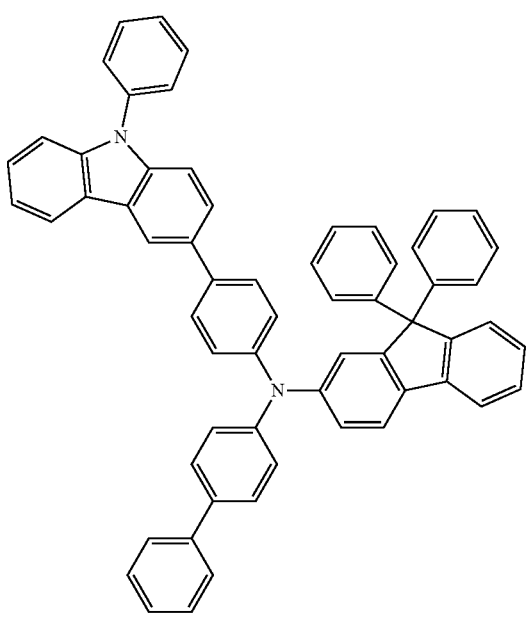

H-1-19

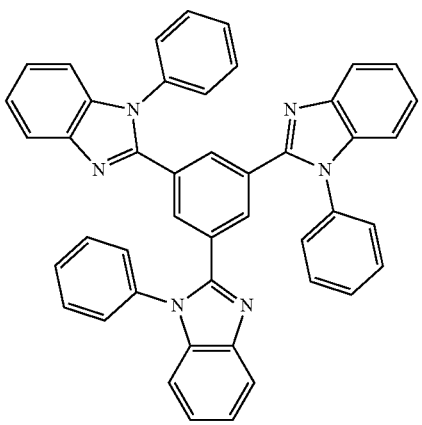

TPBI

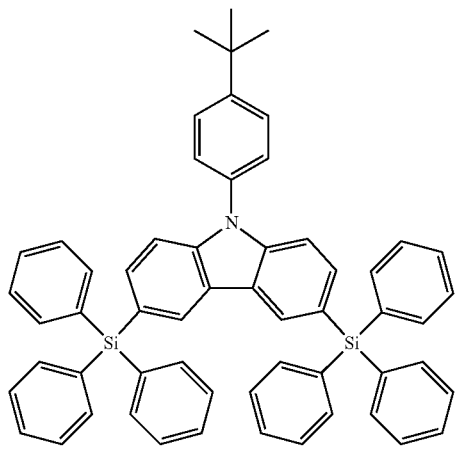

CzSi

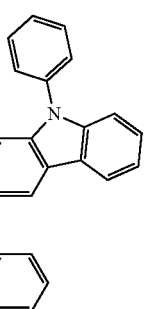

P4

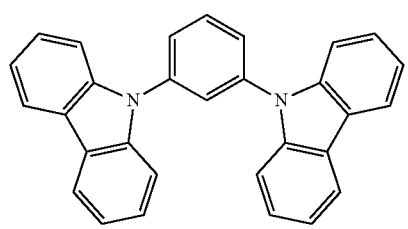

E-2-20

(Evaluation of Organic Electroluminescence Device Characteristics)

Evaluation results of the organic electroluminescence devices of Examples 1 to 7 and Comparative Examples 1 to 3 are listed in Table 1.

In the results of characteristic evaluation with respect to Examples and Comparative Examples shown in Table 1, driving voltages and luminous efficiencies at a current density of 10 mA/cm² were measured. The evaluation was carried out by calculating the relative device service life based on the numerical value in which the deterioration time from an initial value to 50% luminance when the device was continuously operated at 10 mA/cm² was compared to Comparative Example 1.

TABLE 1

|  | Hole transport layer material | Dopant in emission layer | Driving voltage (V) | Luminous efficiency (cd/A) | Emission wavelength (nm) | Service life ratio (T95) |
|---|---|---|---|---|---|---|
| Example 1 | H-1-19 | Compound 8 | 4.4 | 22.5 | 462 | 2.43 |
| Example 2 | H-1-19 | Compound 15 | 4.5 | 23.1 | 459 | 3.11 |
| Example 3 | H-1-19 | Compound 21 | 4.5 | 25.9 | 458 | 1.78 |
| Example 4 | H-1-19 | Compound 28 | 4.6 | 28.7 | 454 | 1.34 |
| Example 5 | H-1-19 | Compound 58 | 4.5 | 21.1 | 461 | 2.15 |
| Example 6 | H-1-19 | Compound 61 | 4.4 | 22.0 | 463 | 2.89 |
| Example 7 | H-1-19 | Compound 61D | 4.3 | 23.0 | 463 | 2.93 |
| Comparative Example 1 | H-1-19 | C-1 | 4.5 | 20.4 | 468 | 1.00 |
| Comparative Example 2 | H-1-19 | C-2 | 4.7 | 16.8 | 450 | 0.37 |
| Comparative Example 3 | H-1-19 | C-3 | 4.6 | 18.1 | 459 | 0.78 |

Referring to the results of Table 1, it may be seen that Examples of the organic luminescence device using the fused polycyclic compound according to embodiments as an emission layer material exhibit low driving voltage values and relatively high luminous efficiencies and service lives compared to Comparative Examples.

The Comparative Example Compounds show weak nucleophilic properties because the Comparative Example Compounds include an amine group containing an aromatic ring, and thus the unshared electron pair of the amine group easily forms a conjugation structure with the π-orbital of the adjacent benzene ring. By comparison, the Example Compounds show stronger nucleophilic properties because the Example Compounds include an amine group having an alkyl group, and thus the unshared electron pair of the amine group does not form a conjugation structure. Thus, the fused polycyclic compound according to an embodiment may enhance a multiple resonance effect on the fused ring containing boron. Accordingly, a difference ($\Delta E_{ST}$) between the triplet exciton energy level (T1 level) and the lowest singlet exciton energy level (S1 level) in the fused polycyclic compound according to an embodiment becomes relatively small, the reverse intersystem crossing from the triplet exciton energy level to the lowest singlet exciton energy level may more easily occur, and thus the organic electroluminescence devices of Examples may have improved efficiency. Because the lift time of the triplet exciton in the fused polycyclic compound according to an embodiment is reduced, the organic electroluminescence devices of Examples may achieve a long service life. Moreover, the fused polycyclic compound according to an embodiment has a full width of half maximum (FWHM) of an emission spectrum which narrows by the enhancement of the multiple resonance effect, and the organic electroluminescence devices of Examples may exhibit excellent color purity.

The organic electroluminescence device of an embodiment may include the fused polycyclic compound of an embodiment, thereby exhibiting improved luminous efficiency. The organic electroluminescence device of an embodiment may implement high luminous efficiency in a blue light wavelength region by including the fused polycyclic compound of an embodiment as an emission layer material.

The organic electroluminescence device according to an embodiment may exhibit improved device characteristics with a low driving voltage and high efficiency.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An organic electroluminescence device comprising:
a first electrode;
a second electrode facing the first electrode; and
a plurality of organic layers disposed between the first electrode and the second electrode, wherein
the plurality of organic layers comprise:
at least one organic layer including a fused polycyclic compound represented by Formula 1; and
at least one organic layer including an amine compound represented by Formula H-1:

[Formula 1]

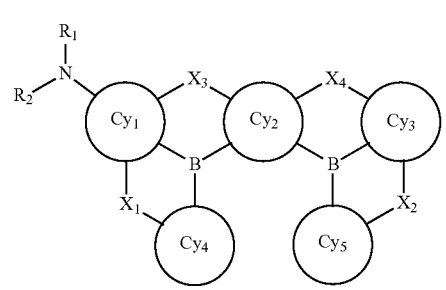

wherein in Formula 1,
$Cy_1$ to $Cy_5$ are each independently a substituted or unsubstituted aromatic hydrocarbon ring, or a substituted or unsubstituted aromatic heterocycle,
$X_1$ to $X_4$ are each independently $C(R_{10})(R_{11})$, $N(R_{12})$, O, S, or Se,
$R_1$ and $R_2$ are each independently a substituted or unsubstituted silyl group, a substituted or unsubstituted alkyl group having 1 to 20 carbon atoms, or a substituted or unsubstituted cycloalkyl group having 3 to 20 ring-forming carbon atoms, or are bonded to an adjacent group to form a ring, and $R_{10}$ to $R_{12}$ are each independently a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, and

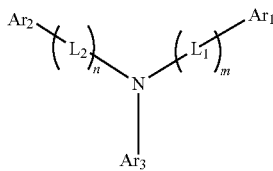

[Formula H-1]

wherein in Formula H-1, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, m and n are each independently an integer from 0 to 10, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, and $Ar_3$ is a substituted or unsubstituted aryl group having 6 to 30 ring-forming carbon atoms.

2. The organic electroluminescence device of claim 1, wherein
the plurality of organic layers comprise:
a hole transport region disposed on the first electrode;
an emission layer disposed on the hole transport region; and
an electron transport region disposed on the emission layer, and
the emission layer comprises the fused polycyclic compound represented by Formula 1.

3. The organic electroluminescence device of claim 2, wherein the emission layer emits delayed fluorescence.

4. The organic electroluminescence device of claim 2, wherein
the emission layer is a delayed fluorescence emission layer comprising a first compound and a second compound, and
the first compound comprises the fused polycyclic compound represented by Formula 1.

5. The organic electroluminescence device of claim 2, wherein
the hole transport region comprises:
a hole injection layer disposed on the first electrode; and
a hole transport layer disposed on the hole injection layer, and
the hole transport layer comprises the amine compound represented by Formula H-1.

6. The organic electroluminescence device of claim 5, wherein the hole transport region further comprises an electron blocking layer disposed on the hole transport layer.

7. The organic electroluminescence device of claim 1, further comprising a capping layer disposed on the second electrode and having a refractive index equal to or greater than about 1.6.

8. The organic electroluminescence device of claim 1, wherein the fused polycyclic compound represented by Formula 1 is represented by Formula 2:

[Formula 2]

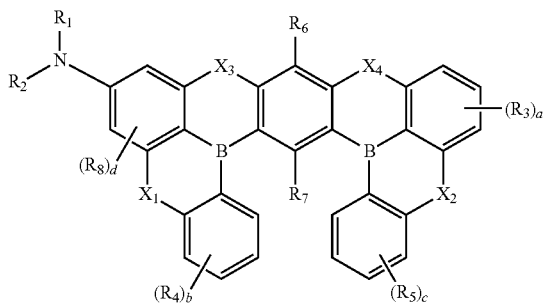

wherein in Formula 2, $R_3$ to $R_8$ are each independently a hydrogen atom, a deuterium atom, a halogen atom, a cyano group, a substituted or unsubstituted oxy group, a substituted or unsubstituted amine group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or are bonded to an adjacent group to form a ring, a is an integer from 0 to 3, b and c are each independently an integer from 0 to 4, d is an integer from 0 to 2, and $X_1$ to $X_4$, $R_1$, and $R_2$ are the same as defined in Formula 1.

9. The organic electroluminescence device of claim 8, wherein the fused polycyclic compound represented by Formula 2 is represented by one of Formula 3-1 to Formula 3-3:

[Formula 3-1]

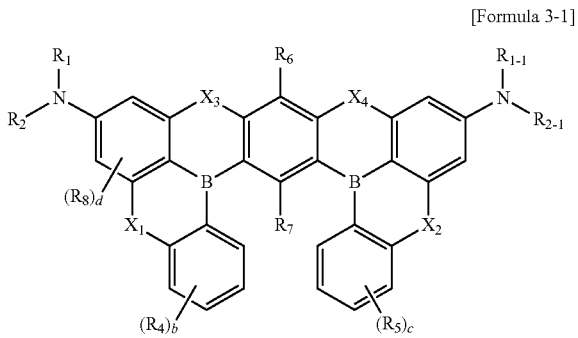

131
-continued

[Formula 3-2]

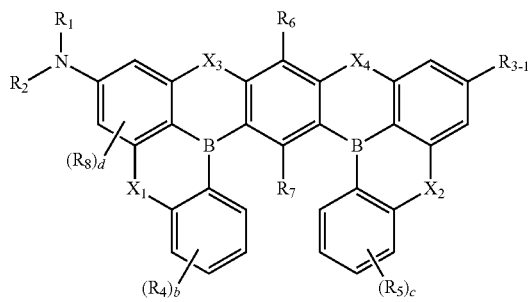

[Formula 3-3]

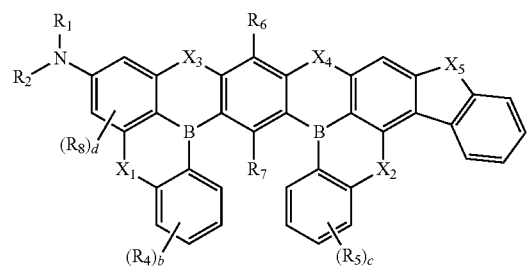

wherein in Formula 3-1 to Formula 3-3, $R_{1-1}$ and $R_{2-1}$ are each independently a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or are bonded to an adjacent group to form a ring, $R_{3-1}$ is a hydrogen atom, a deuterium atom, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, $X_5$ is $N(R_{13})$, O, or S, $R_{13}$ is a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, $R_4$ to $R_8$ are each independently a hydrogen atom, a deuterium atom, a halogen atom, a cyano group, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, and $X_1$ to $X_4$, $R_1$, $R_2$, and b to d are the same as defined in Formula 2.

132

10. The organic electroluminescence device of claim 8, wherein the fused polycyclic compound represented by Formula 2 is represented by Formula 4-1 or Formula 4-2:

[Formula 4-1]

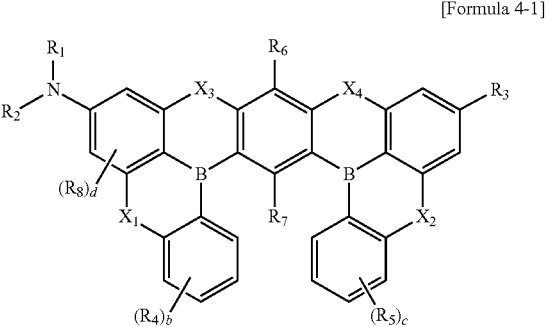

[Formula 4-2]

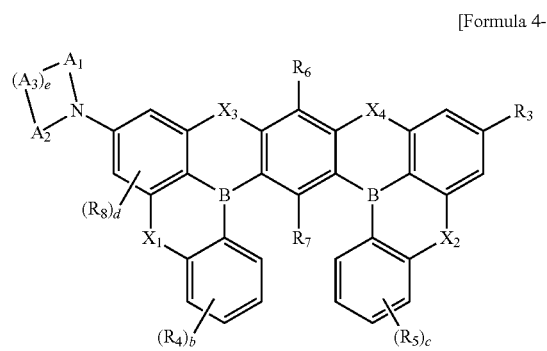

wherein in Formula 4-1 to Formula 4-2, $R_1$ and $R_2$ are each independently a substituted or unsubstituted silyl group, a substituted or unsubstituted alkyl group having 1 to 10 carbon atoms, or a substituted or unsubstituted cycloalkyl group having 3 to 20 ring-forming carbon atoms, $A_1$ to $A_3$ are each independently a substituted or unsubstituted alkylene group having 1 to 20 carbon atoms, e is an integer from 0 to 5, and $X_1$ to $X_4$, $R_3$ to $R_8$, and b to d are the same as defined in Formula 2.

11. The organic electroluminescence device of claim 1, wherein in Formula 1, at least two of $X_1$ to $X_4$ are each independently represented by $N(Ar_4)$, and $Ar_4$ is a substituted or unsubstituted aryl group having 6 to 30 ring-forming carbon atoms.

12. The organic electroluminescence device of claim 8, wherein the fused polycyclic compound represented by Formula 2 is represented by one of Formula 5-1 to Formula 5-4:

[Formula 5-1]

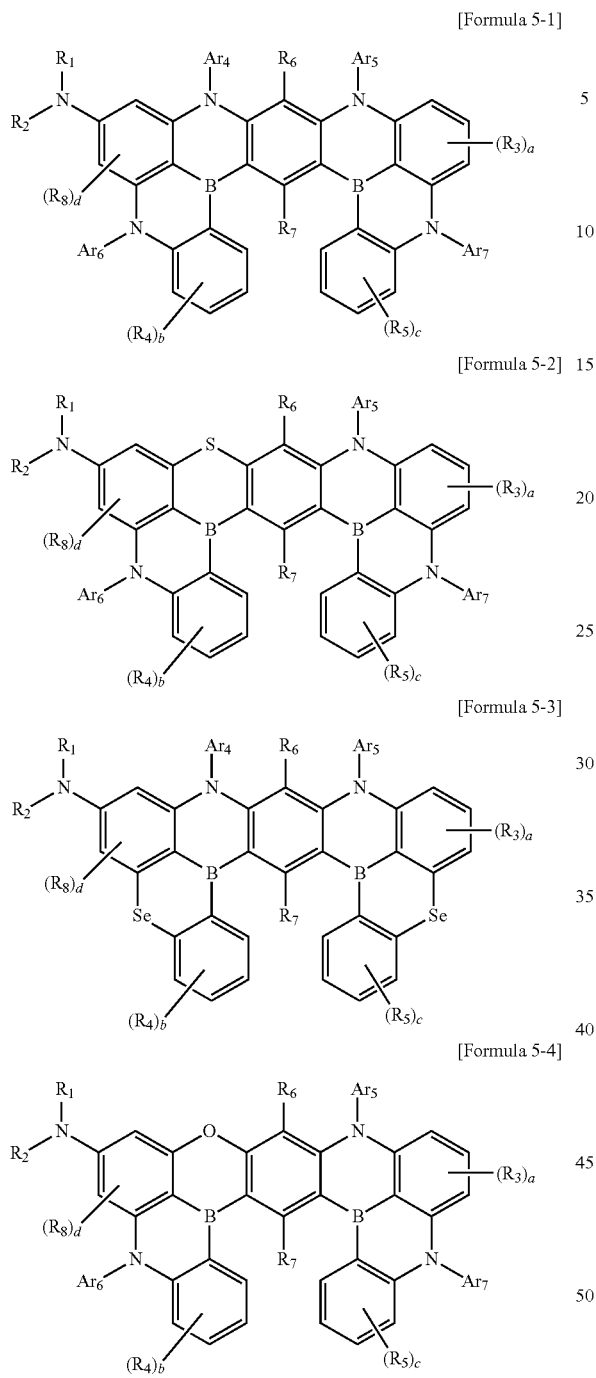

[Formula 5-2]

[Formula 5-3]

[Formula 5-4]

wherein in Formula 5-1 to Formula 5-4,

Ar₄ to Ar₇ are each independently a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, and $R_1$ to $R_8$, and a to d are the same as defined in Formula 2.

13. The organic electroluminescence device of claim 8, wherein the fused polycyclic compound represented by Formula 2 is represented by Formula 6-1 or Formula 6-2:

[Formula 6-1]

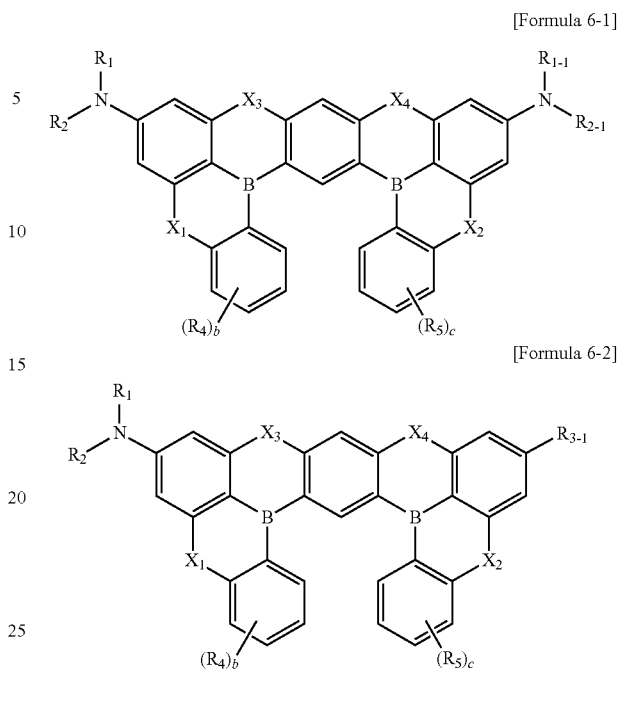

[Formula 6-2]

wherein in Formula 6-1 and Formula 6-2, $R_{1-1}$ and $R_{2-1}$ are each independently a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or are bonded to an adjacent group to form a ring, $R_{3-1}$ is a hydrogen atom, a deuterium atom, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, $R_4$ and $R_5$ are each independently a hydrogen atom, a deuterium atom, a halogen atom, a cyano group, a substituted or unsubstituted oxy group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, and $X_1$ to $X_4$, $R_1$, $R_2$, b, and c are the same as defined in Formula 2.

14. The organic electroluminescence device of claim 1, wherein the fused polycyclic compound represented by Formula 1 is one selected from Compound Group 1:

[Compound Group 1]
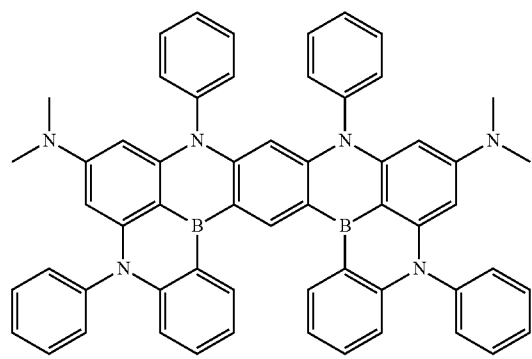
1
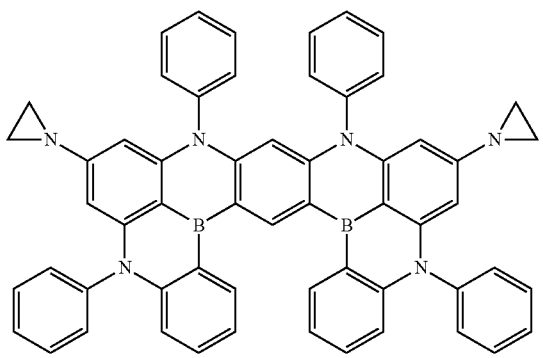
5
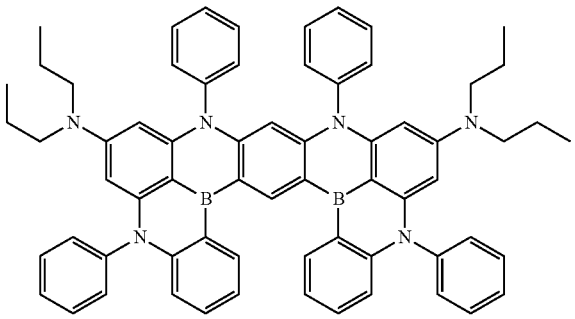
2
6
7
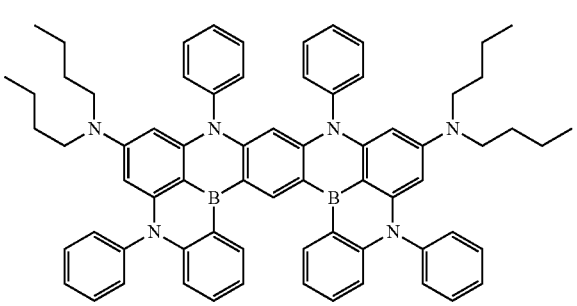
3
4
8

9
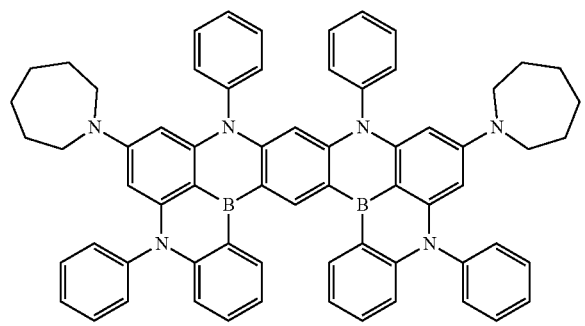
10
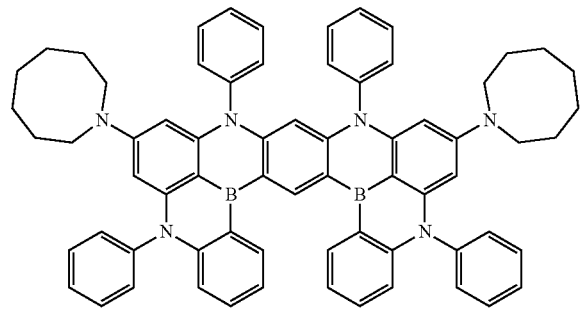
11
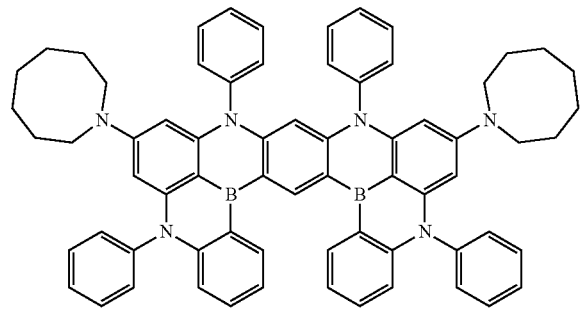
12
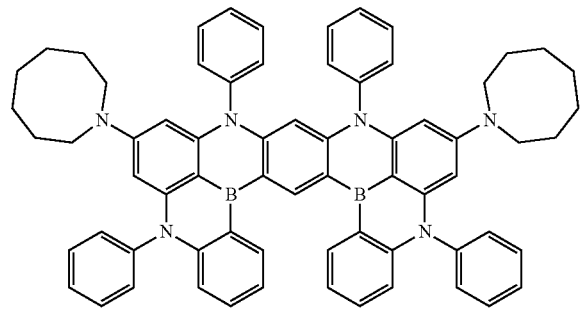
13
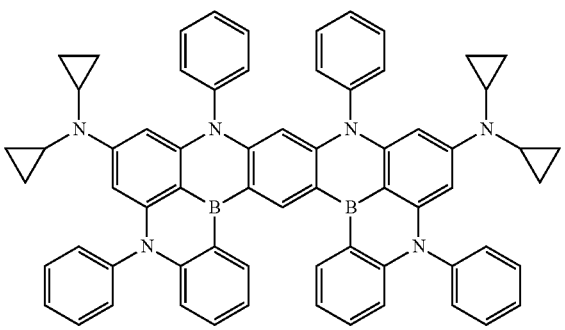
14
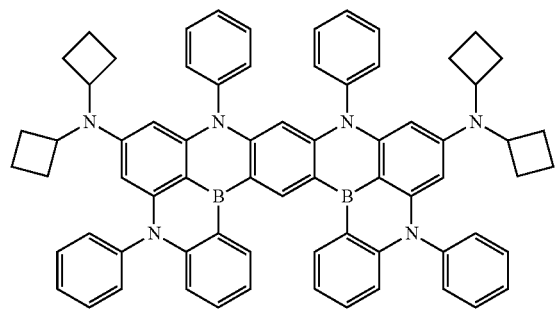
15
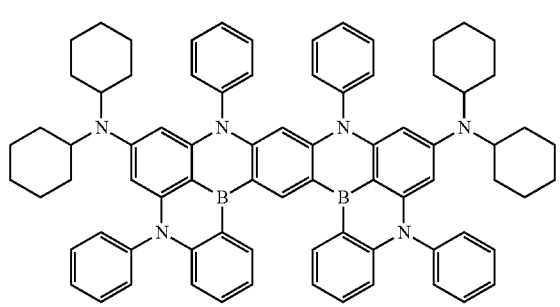
16
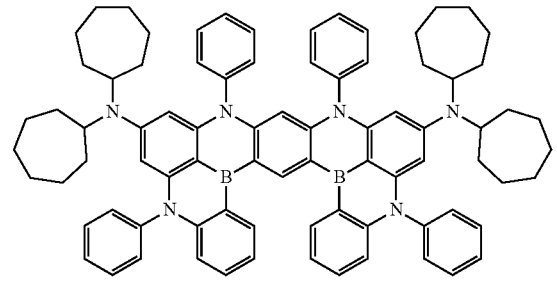
17
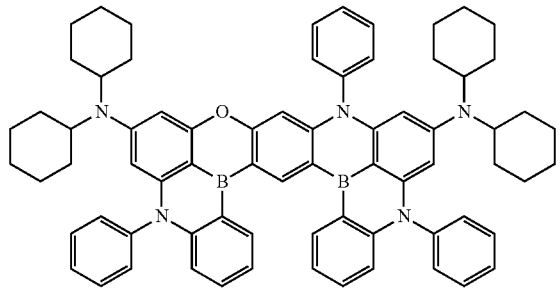

18
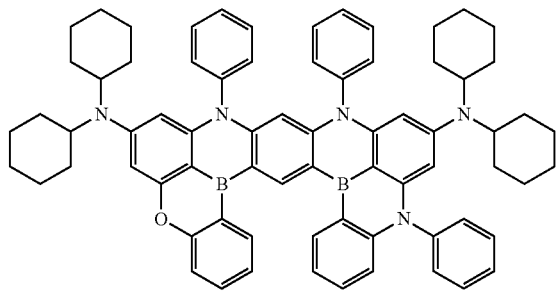
19
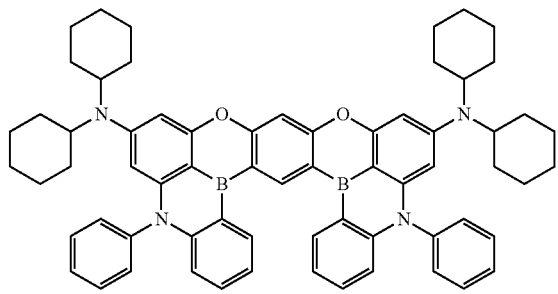
20
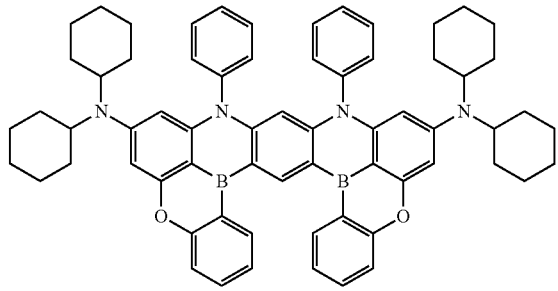
21
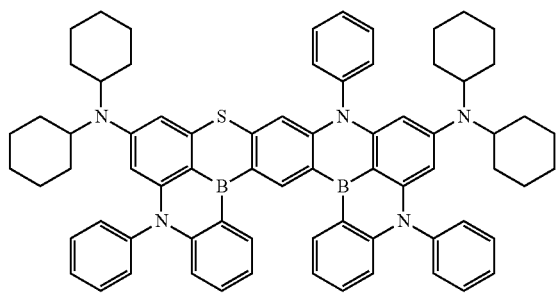
22
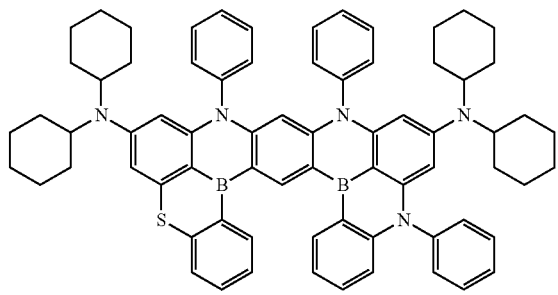
23
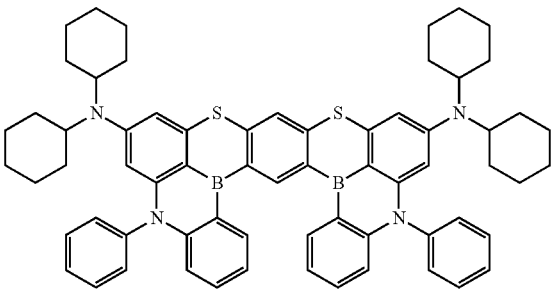
24
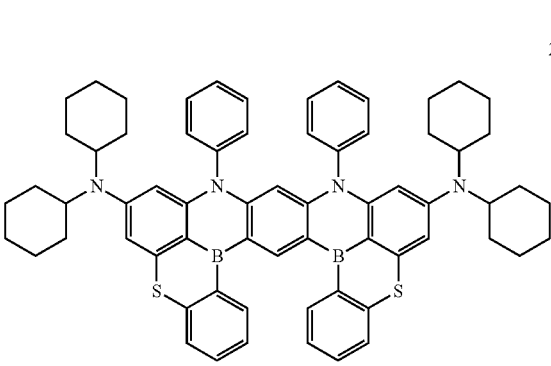
25
26
27
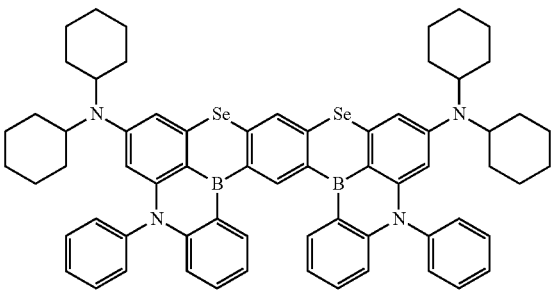

28
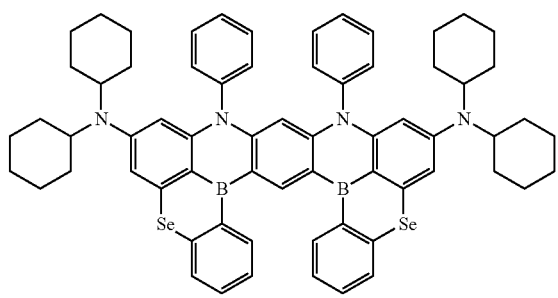
29
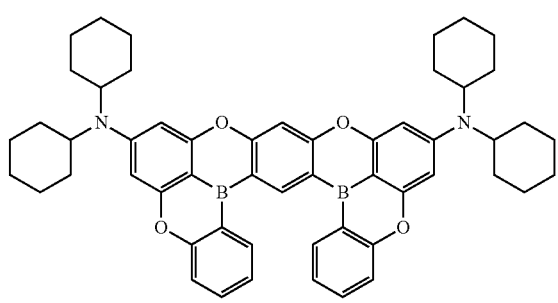
30
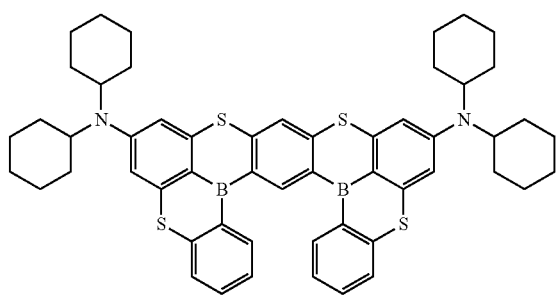
31
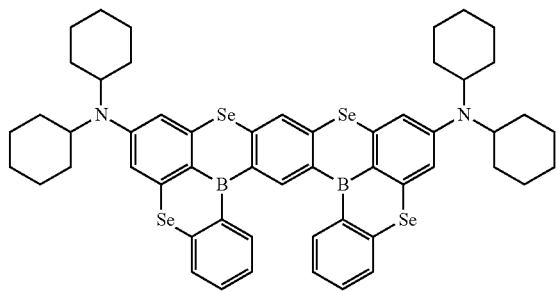
32
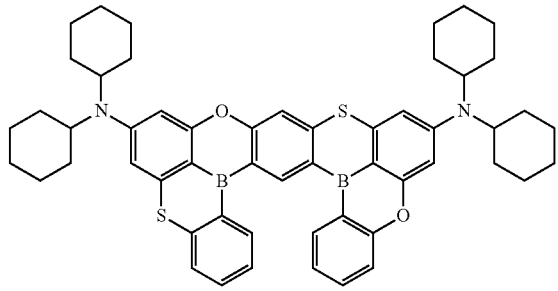
33
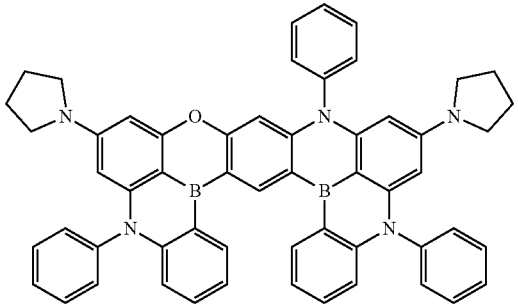
34
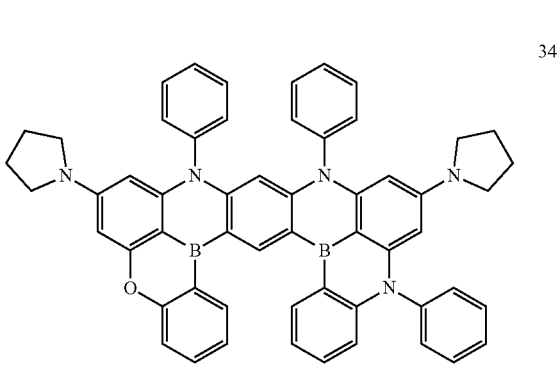
35
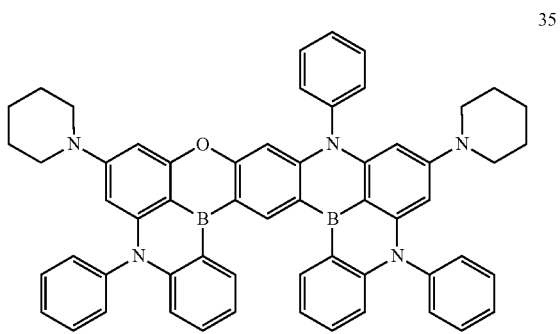
36
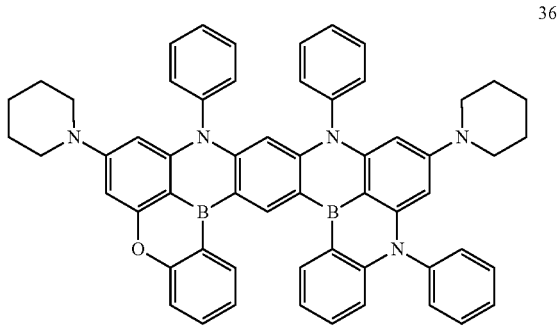
37
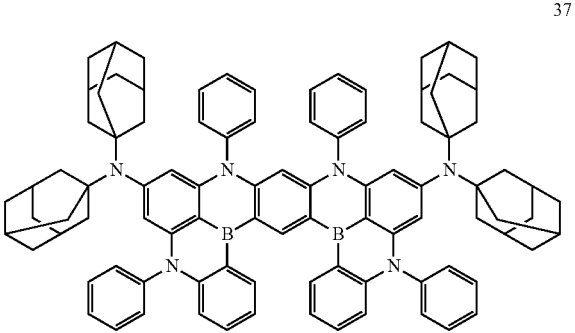

38
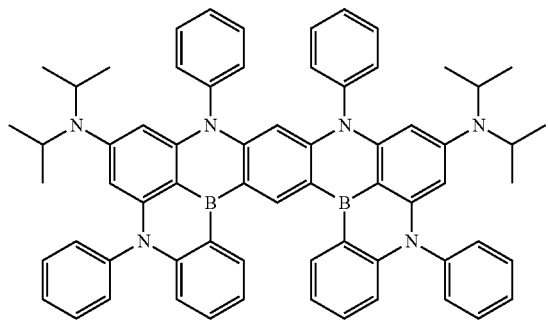
39
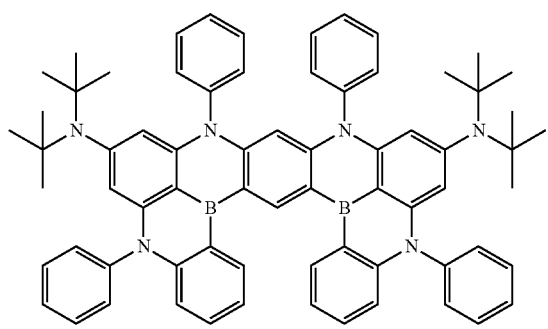
40
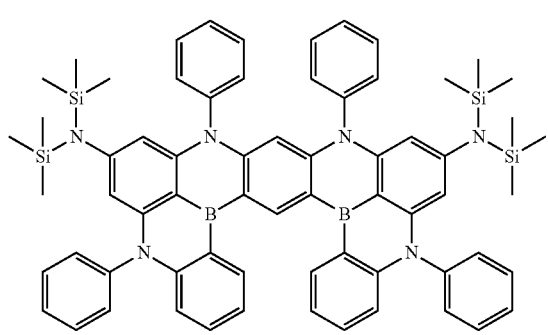
41
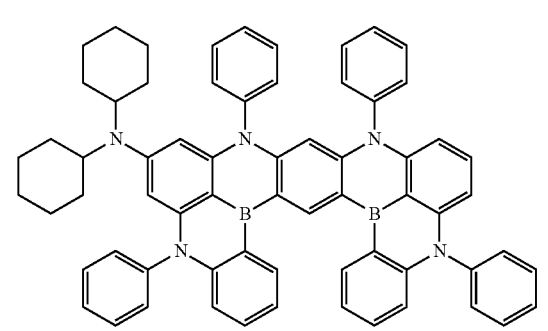
42
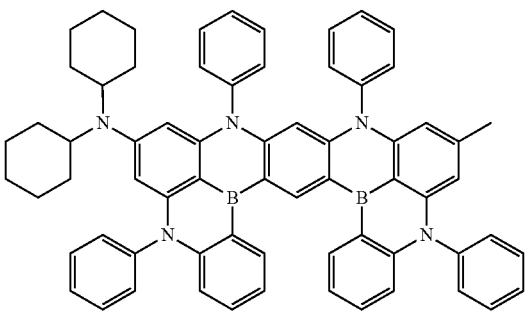
43
44
45
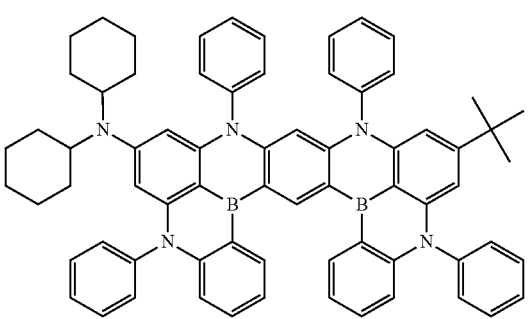
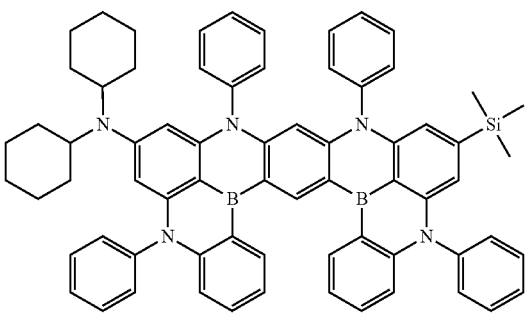
46
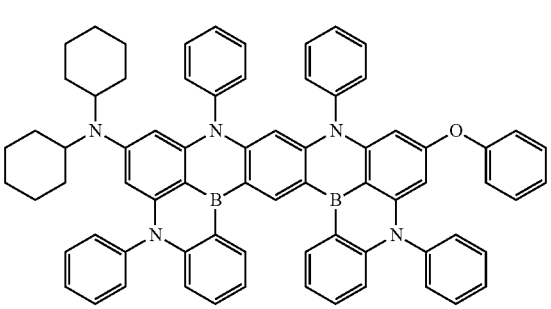

47
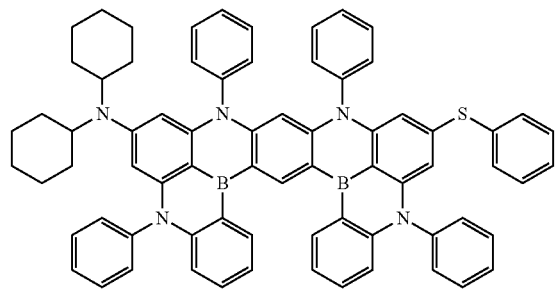
48
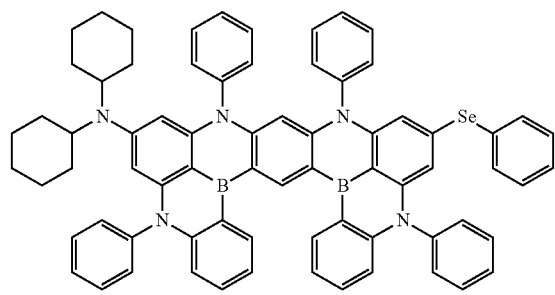
49
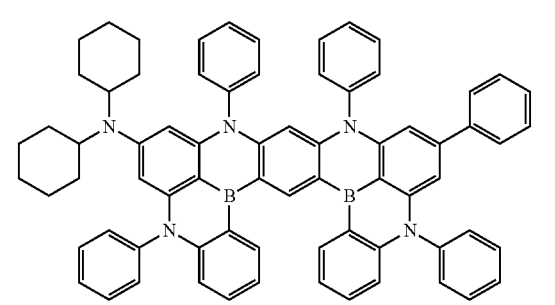
50
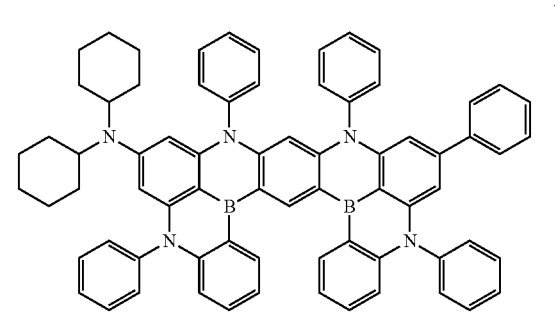
51
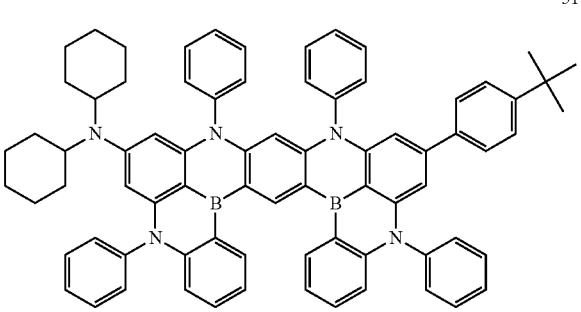
52
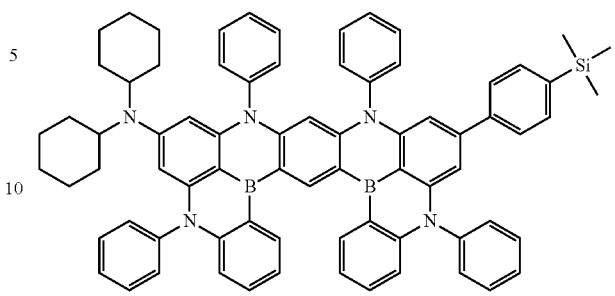
53
54
55

56
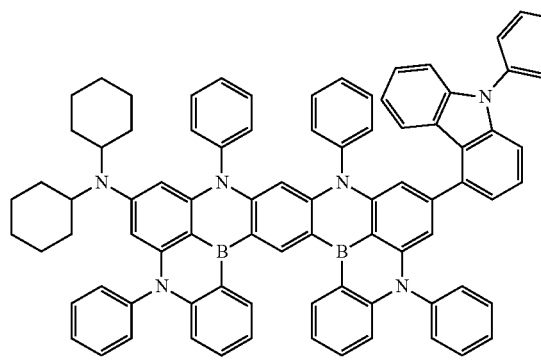
57
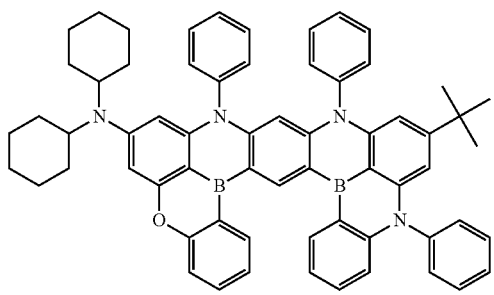
58
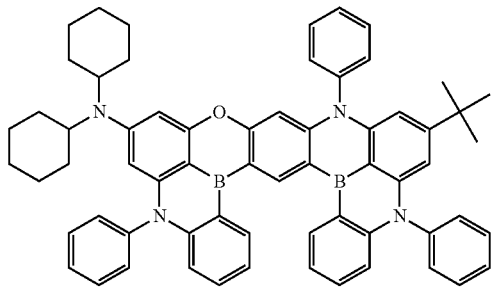
59
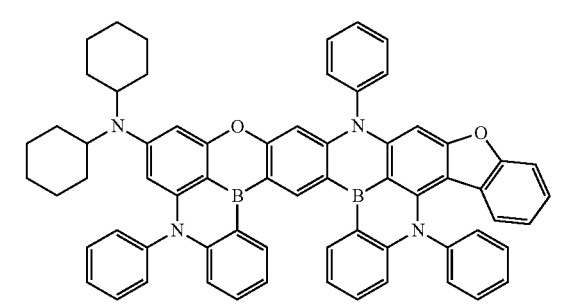
60
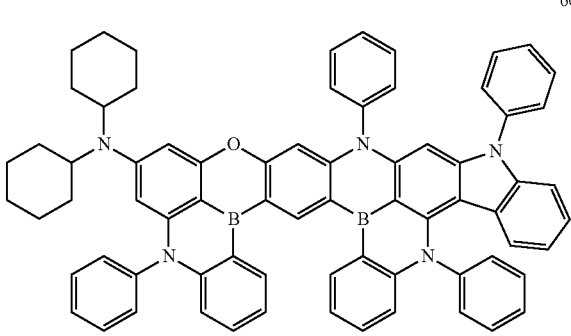
61
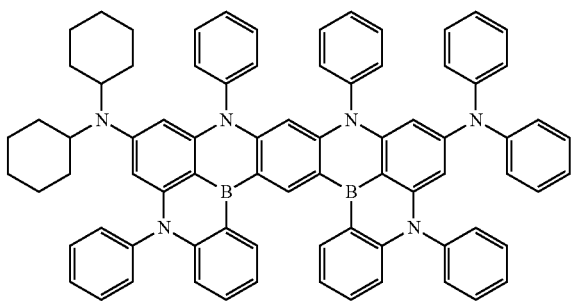
62
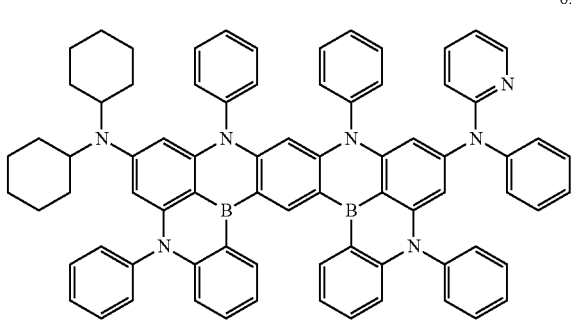
63
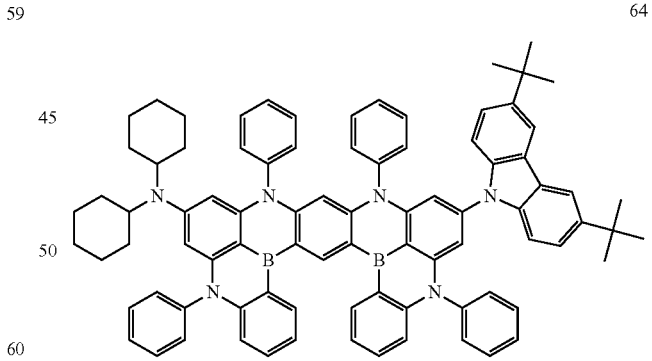
64
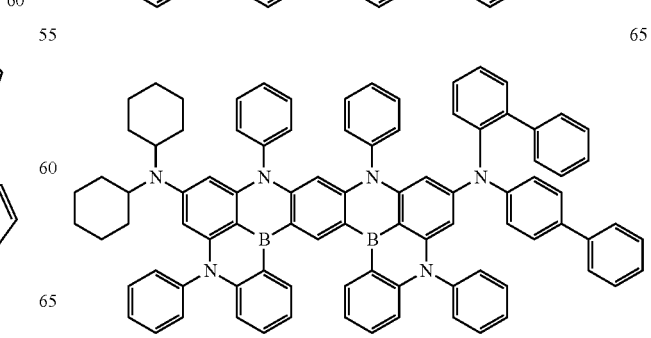
65

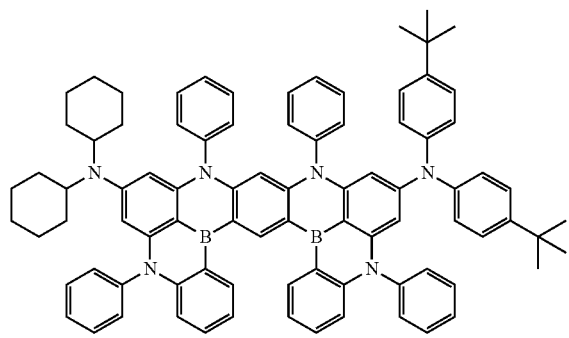
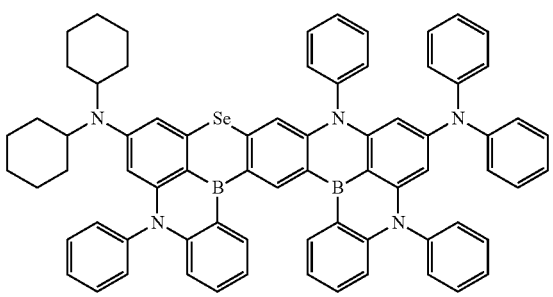
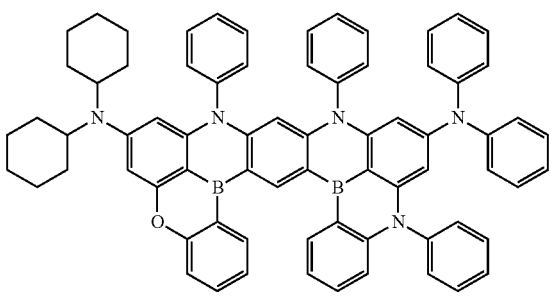
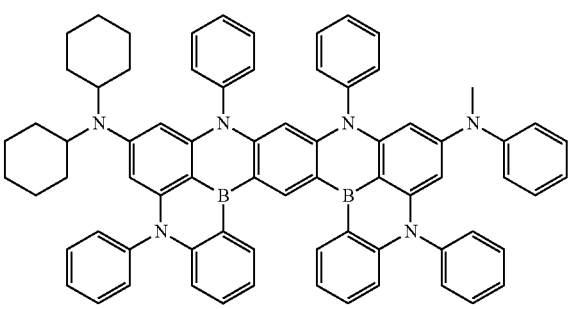
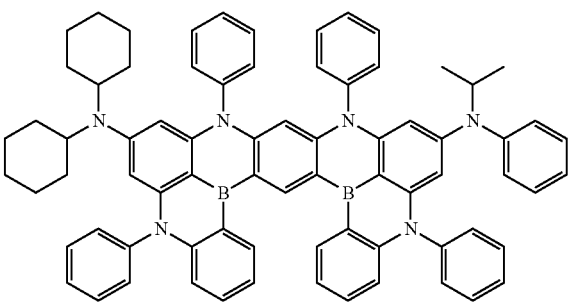
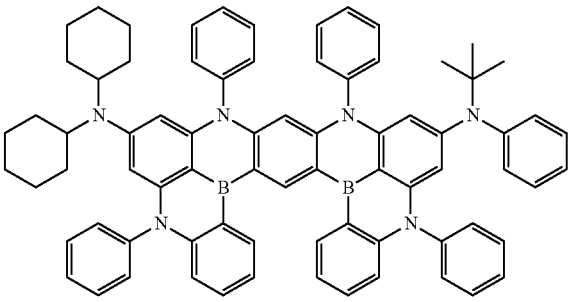

-continued

76
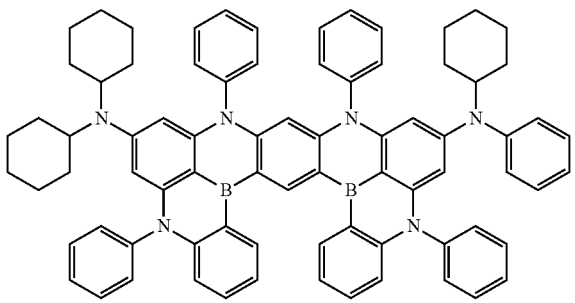

77
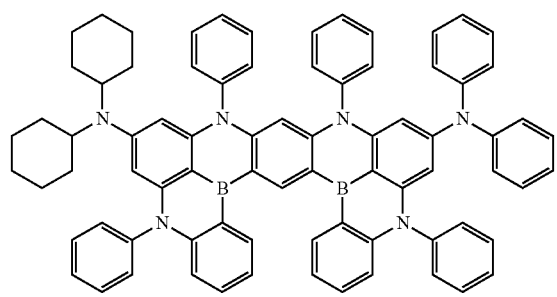

78
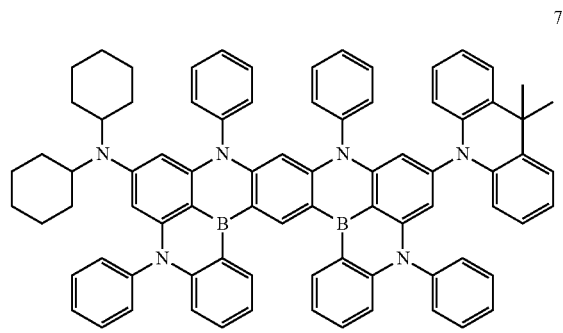

79
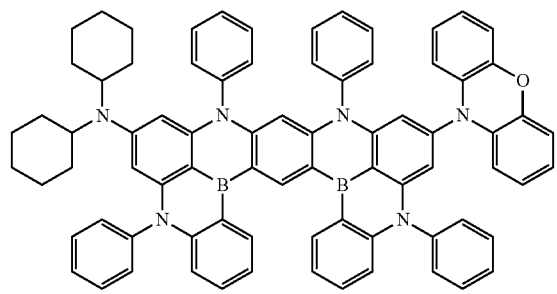

80
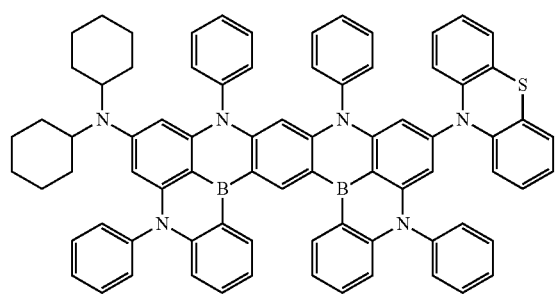

-continued

61D
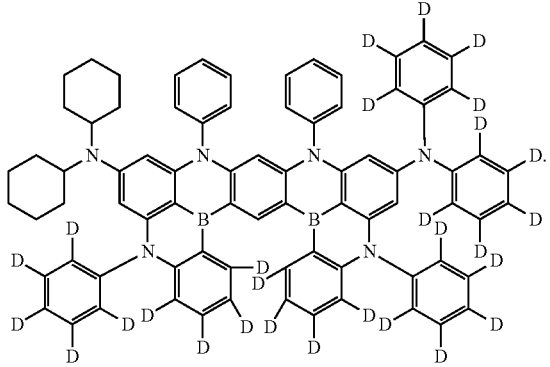

15. An organic electroluminescence device comprising:
a first electrode;
a second electrode facing the first electrode; and
a plurality of organic layers disposed between the first electrode and the second electrode, wherein
at least one organic layer includes:
a fused polycyclic compound represented by Formula 1; and
a polycyclic compound represented by Formula E-2b:

[Formula 1]

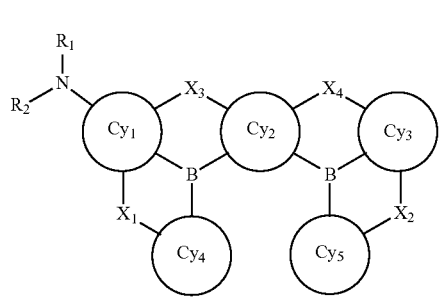

wherein in Formula 1,
Cy$_1$ to Cy$_5$ are each independently a substituted or unsubstituted aromatic hydrocarbon ring, or a substituted or unsubstituted aromatic heterocycle,
X$_1$ to X$_4$ are each independently C(R$_{10}$)(R$_{11}$), N(R$_{12}$), O, S, or Se,
R$_1$ and R$_2$ are each independently a substituted or unsubstituted silyl group, a substituted or unsubstituted alkyl group having 1 to 20 carbon atoms, or a substituted or unsubstituted cycloalkyl group having 3 to 20 ring-forming carbon atoms, or are bonded to an adjacent group to form a ring, and
R$_{10}$ to R$_{12}$ are each independently a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, and

[Formula E-2b]

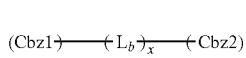

wherein in Formula E-2b,
Cbz1 and Cbz2 are each independently an unsubstituted carbazole group, or a carbazole group substituted with an aryl group having 6 to 30 ring-forming carbon atoms, $L_b$ is a direct linkage, a substituted or unsubstituted arylene group having 6 to 30 ring-forming carbon atoms, or a substituted or unsubstituted heteroarylene group having 2 to 30 ring-forming carbon atoms, and x is an integer from 0 to 10.

16. The organic electroluminescence device of claim 15, wherein the organic layers comprise:

a hole transport region disposed on the first electrode;

an emission layer disposed on the hole transport region; and an electron transport region disposed on the emission layer, and the emission layer comprises the fused polycyclic compound represented by Formula 1; and the polycyclic compound represented by Formula E-2b.

17. The organic electroluminescence device of claim 16, wherein the emission layer is a delayed fluorescence emission layer including a host and a dopant, the host comprises the polycyclic compound represented by Formula E-2b, and the dopant comprises the fused polycyclic compound represented by Formula 1.

18. The organic electroluminescence device of claim 16, wherein a maximum emission wavelength of the emission layer is in a range of about 450 nm to about 470 nm.

19. The organic electroluminescence device of claim 15, wherein the fused polycyclic compound represented by Formula 1 is represented by Formula 2:

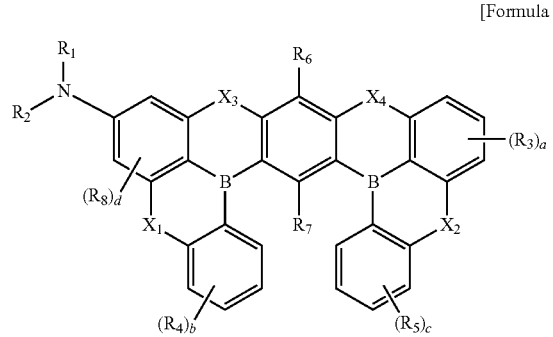

[Formula 2]

wherein in Formula 2, $R_3$ to $R_8$ are each independently a hydrogen atom, a deuterium atom, a halogen atom, a cyano group, a substituted or unsubstituted oxy group, a substituted or unsubstituted amine group, a substituted or unsubstituted silyl group, a substituted or unsubstituted seleno group, a substituted or unsubstituted alkyl group having 1 to 20 carbon atoms, a substituted or unsubstituted cycloalkyl group having 3 to 20 ring-forming carbon atoms, a substituted or unsubstituted aryl group having 6 to 60 ring-forming carbon atoms, or a substituted or unsubstituted heteroaryl group having 2 to 60 ring-forming carbon atoms, or are bonded to an adjacent group to form a ring, a is an integer from 0 to 3, b and c are each independently an integer from 0 to 4, d is an integer from 0 to 2, and $X_1$ to $X_4$, $R_1$, and $R_2$ are the same as defined in Formula 1.

20. The organic electroluminescence device of claim 15, wherein the fused polycyclic compound represented by Formula 1 is one selected from Compound Group 1:

[Compound Group 1]

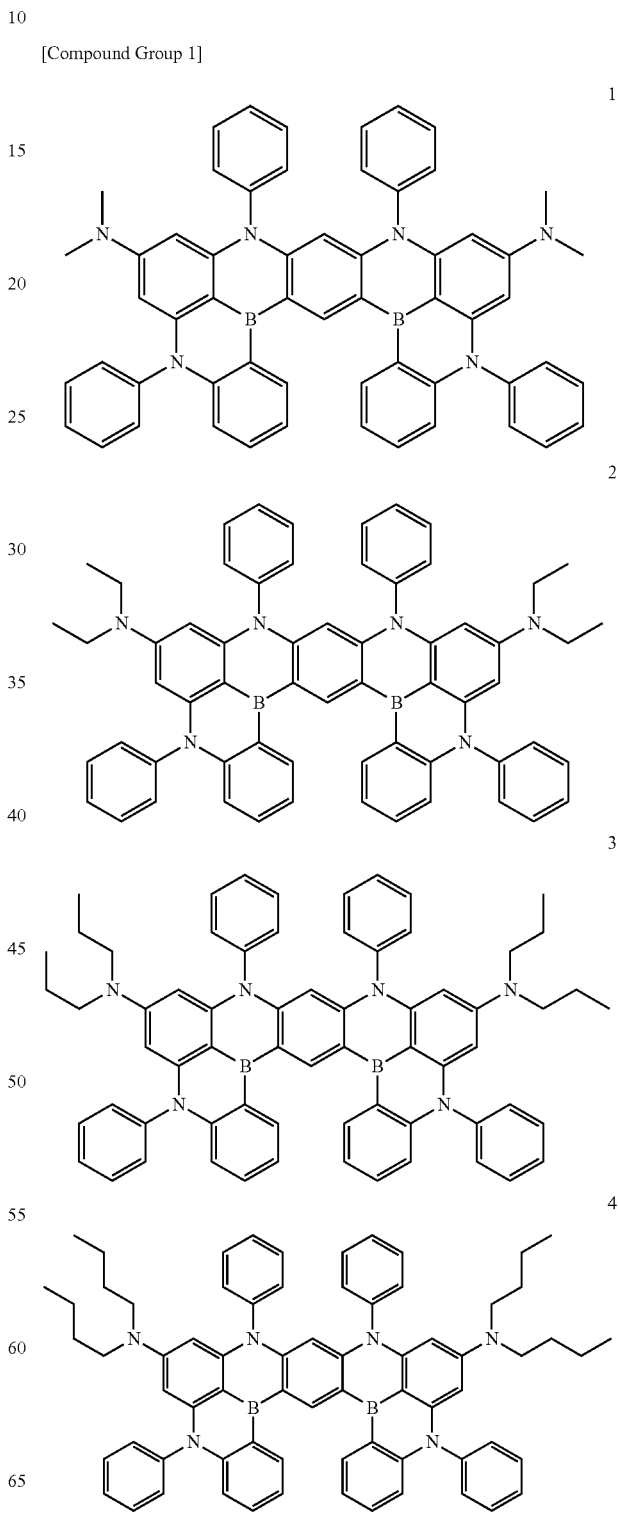

5
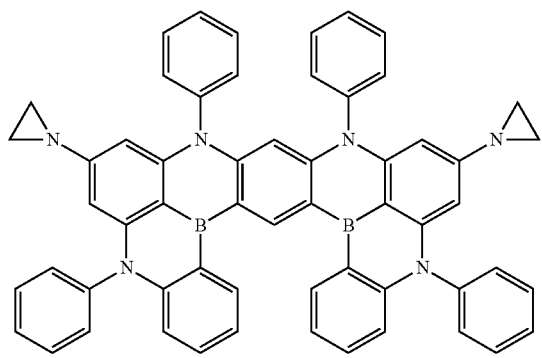
6
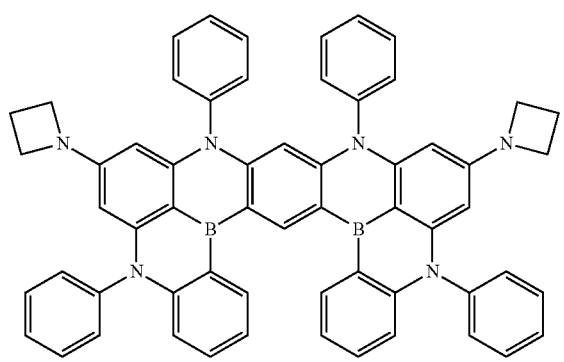
7
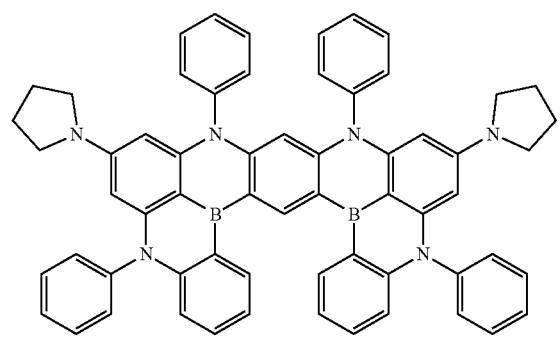
8
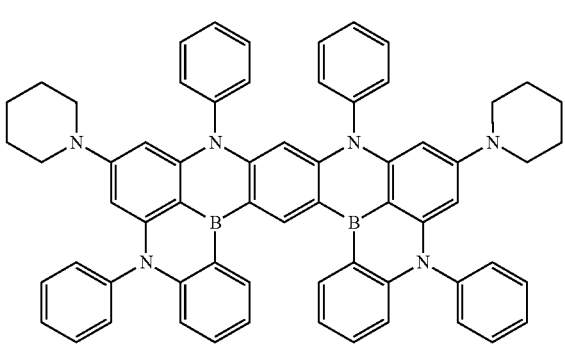
9
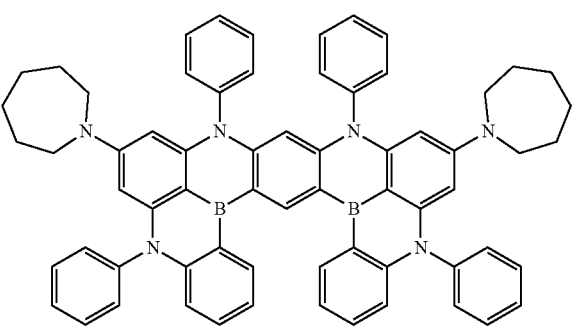
10
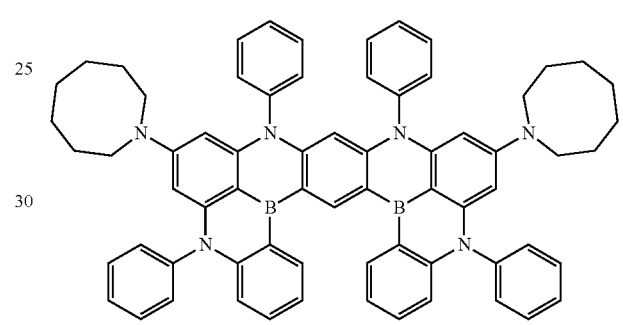
11
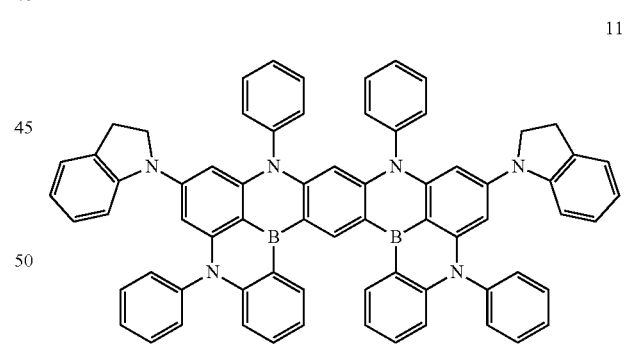
12
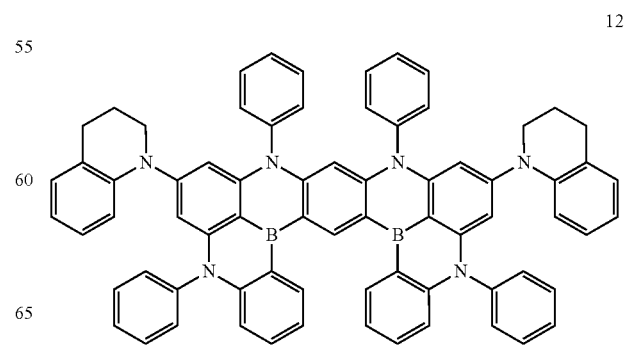

13
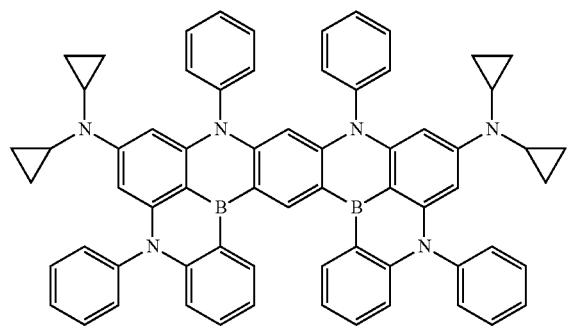
14
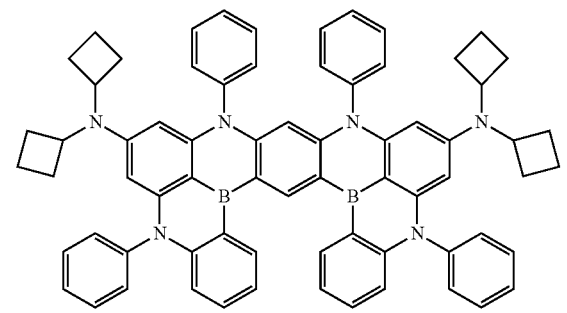
15
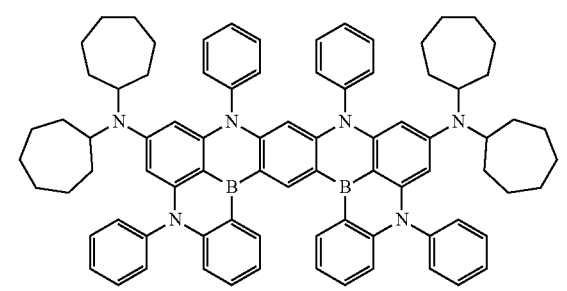
16
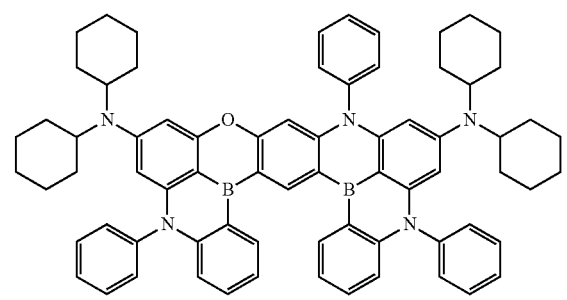
17
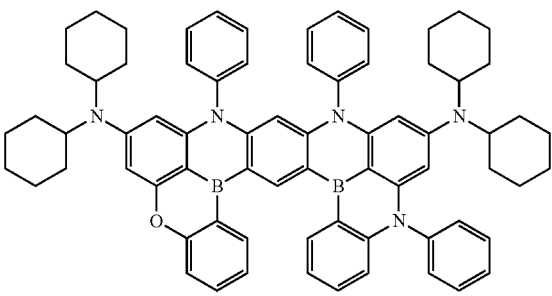
18
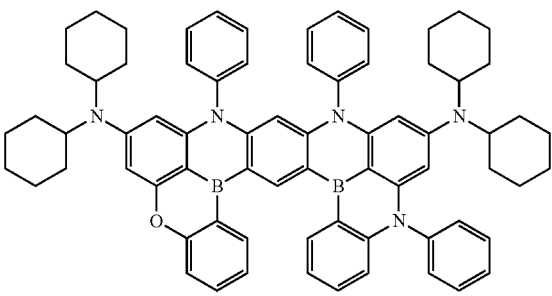
19
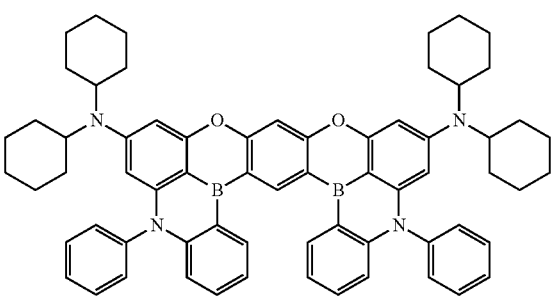
20
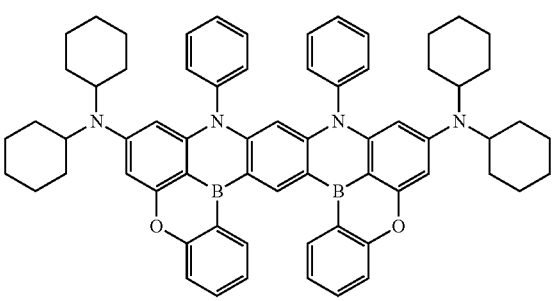
21
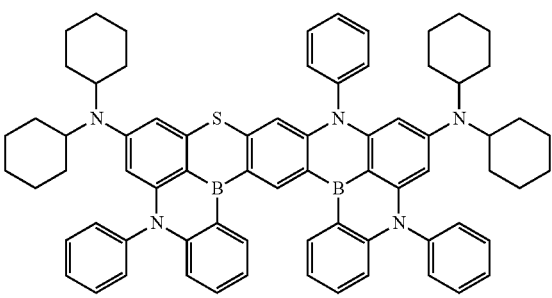
22
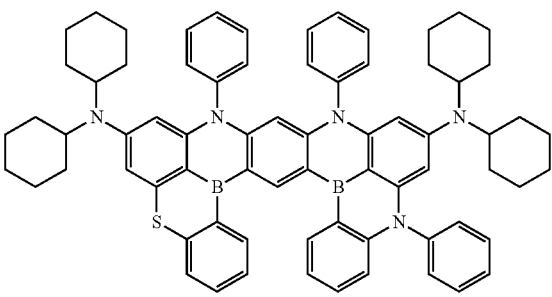

23
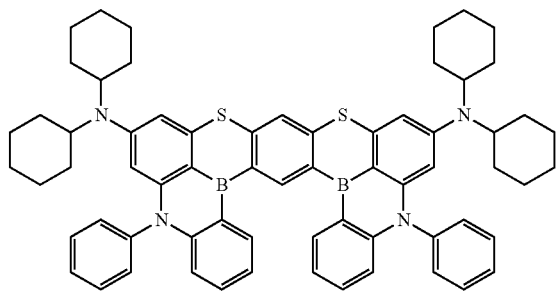
24
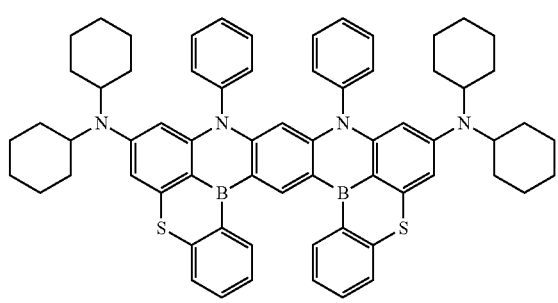
25
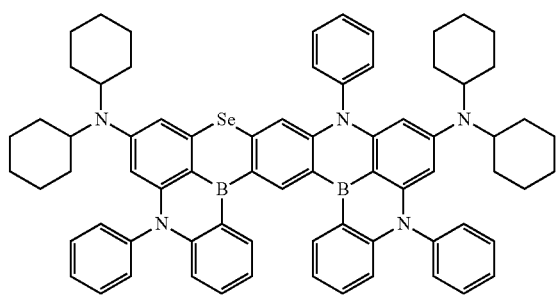
26
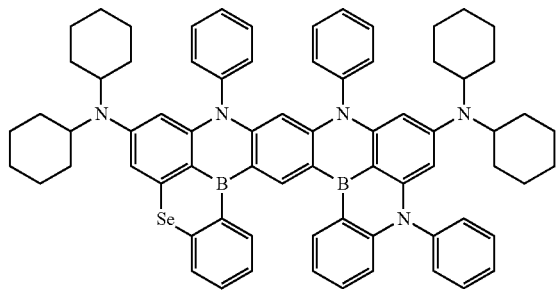
27
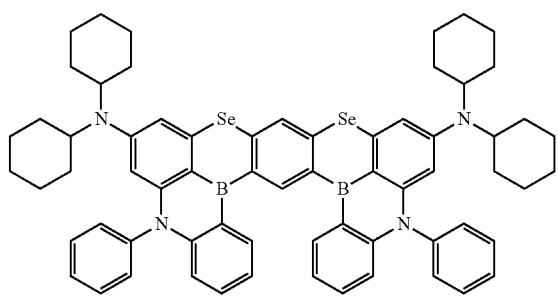
28
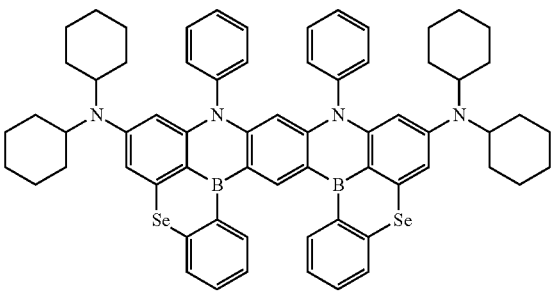
29
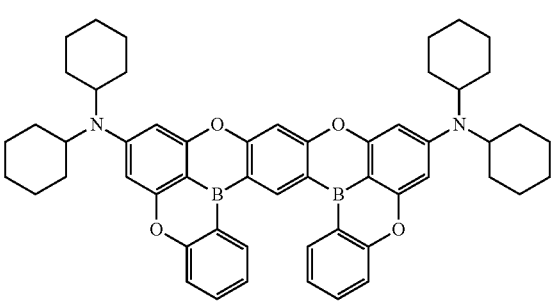
30
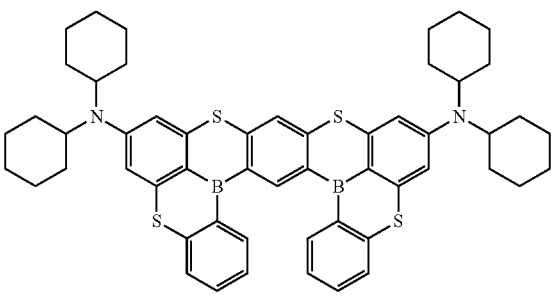
31
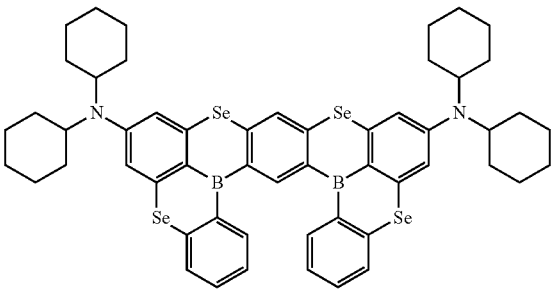
32
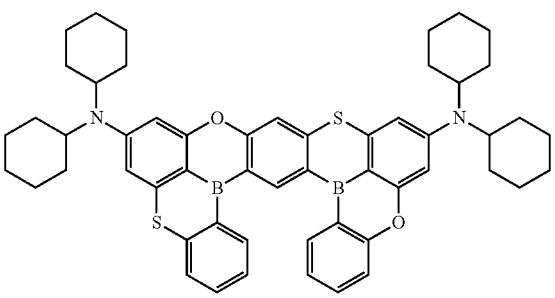

33
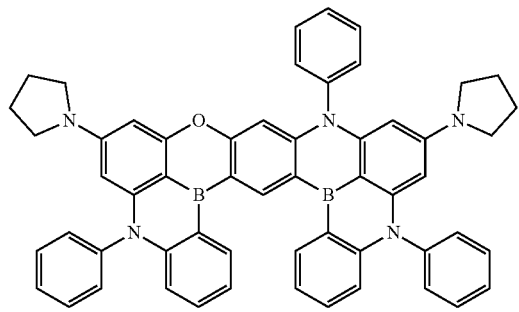
34
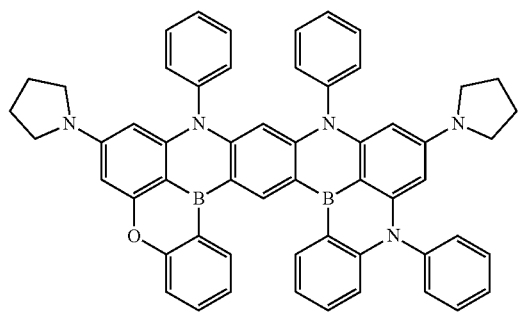
35
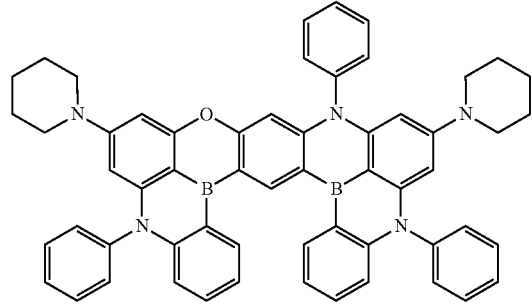
36
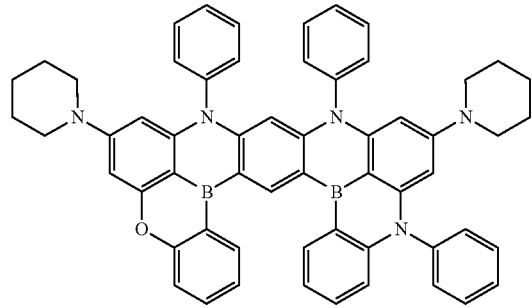
37
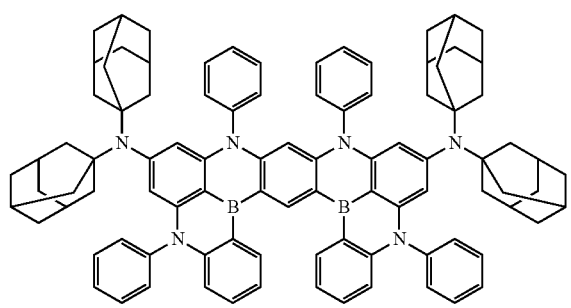
38
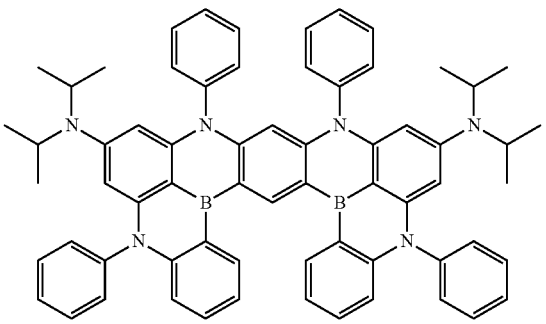
39
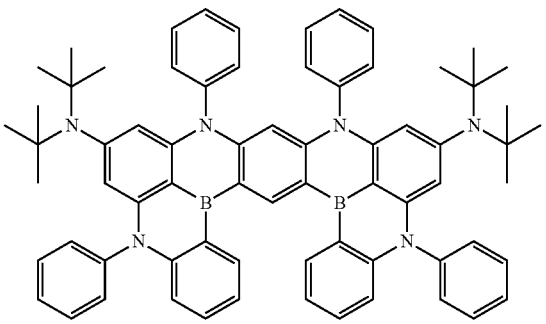
40
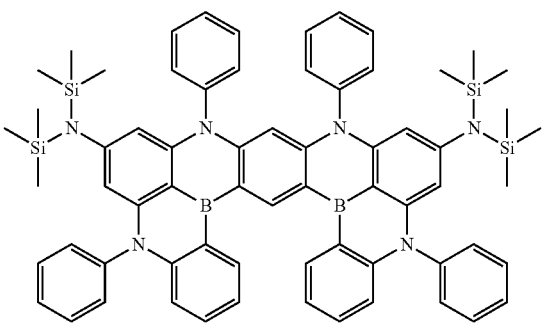
41
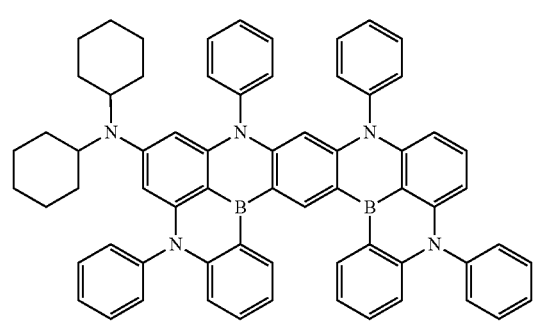

-continued
42
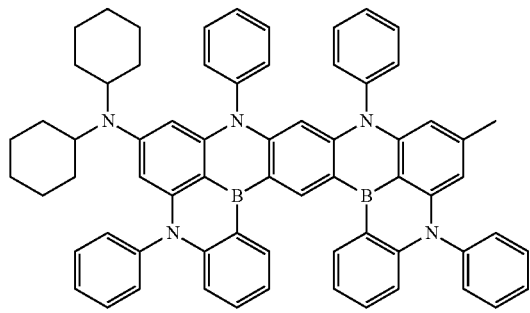
43
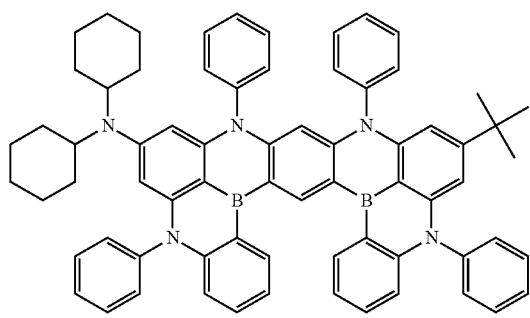
44
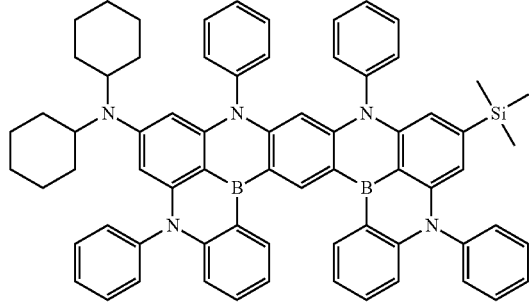
45
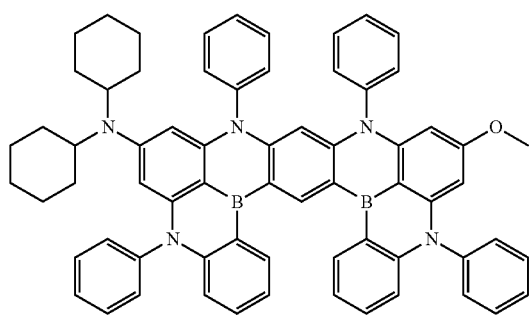
46
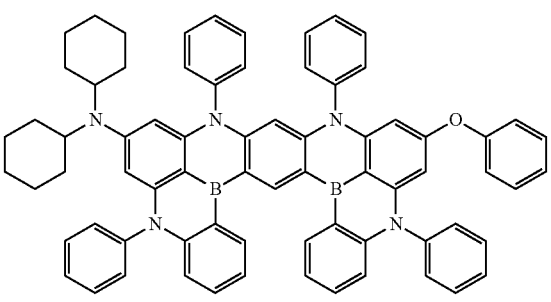
-continued
47
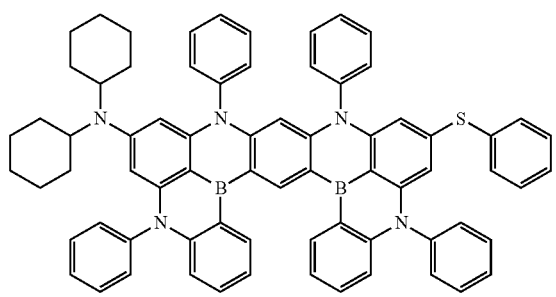
48
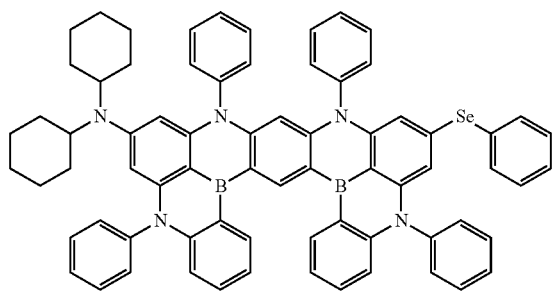
49
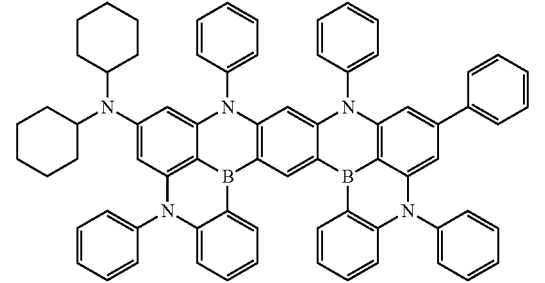
50
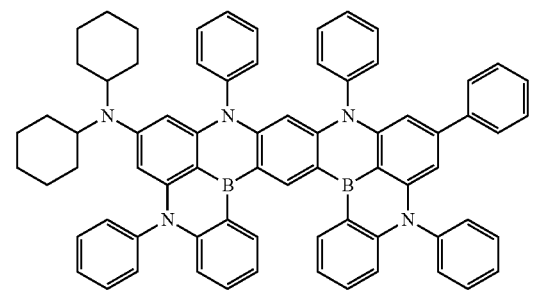
51
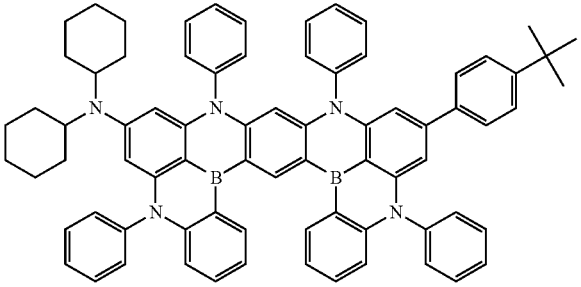

52
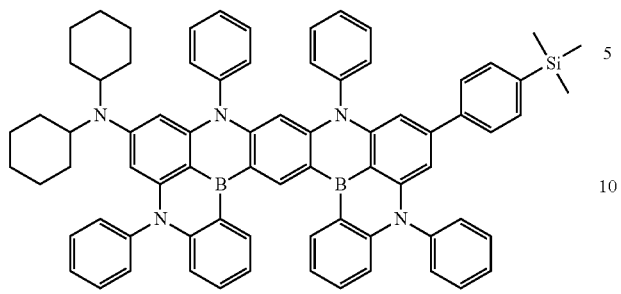
53
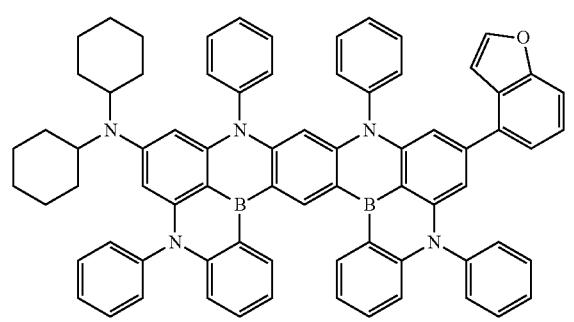
54
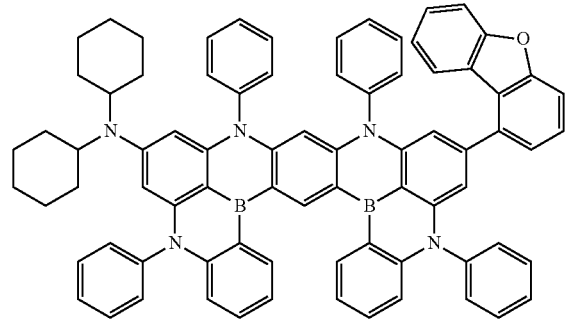
55
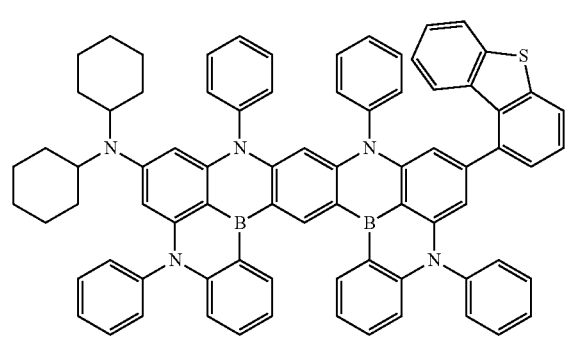
56
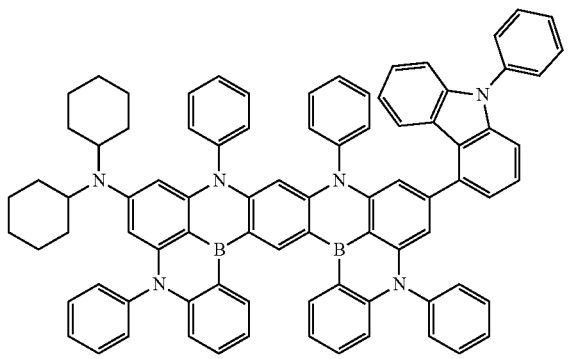
57
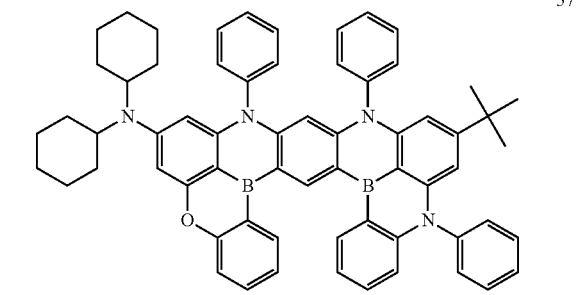
58
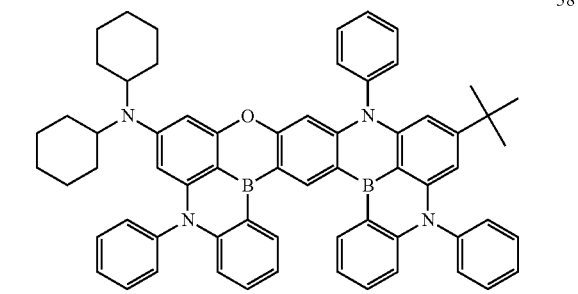
59
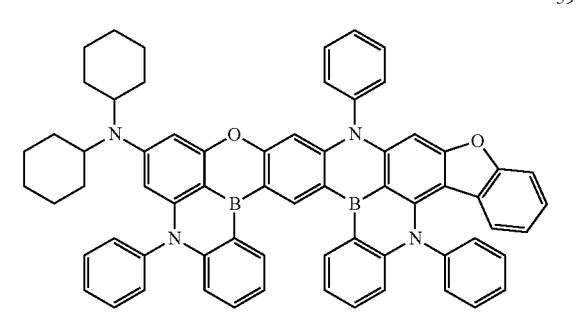
60
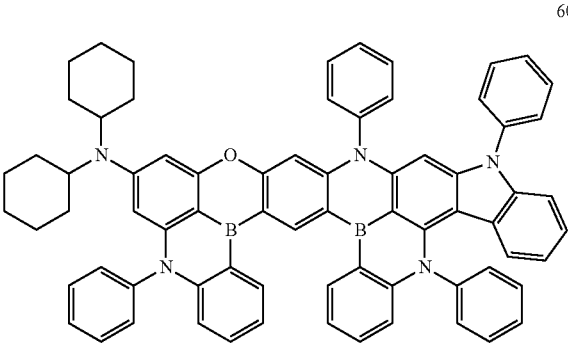

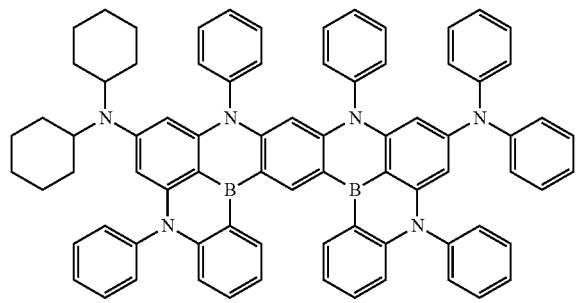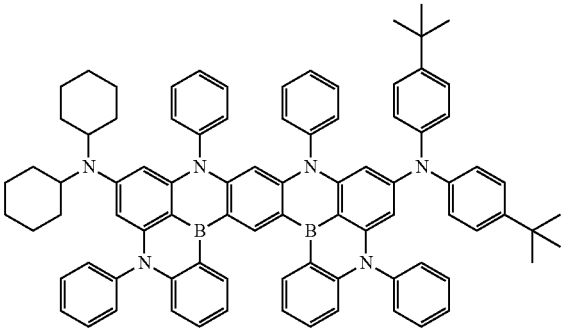

71
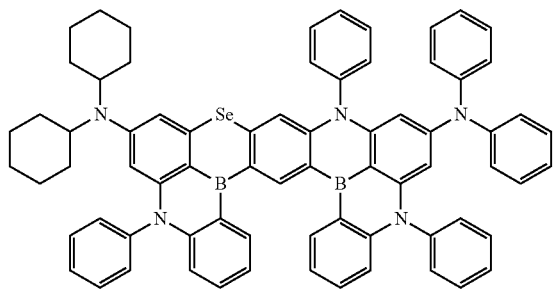
72
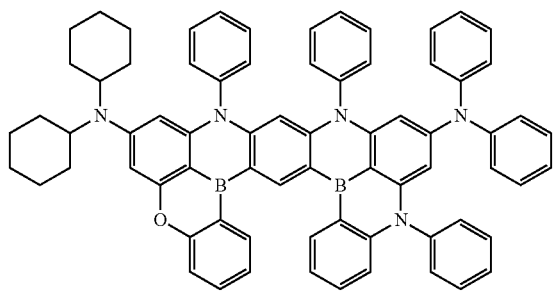
73
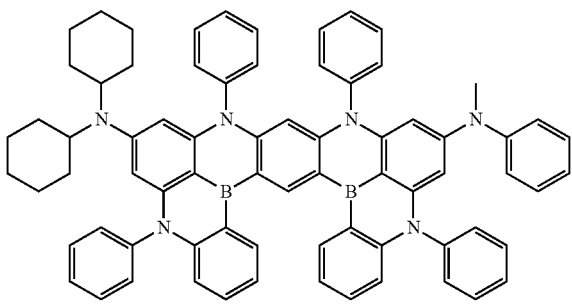
74
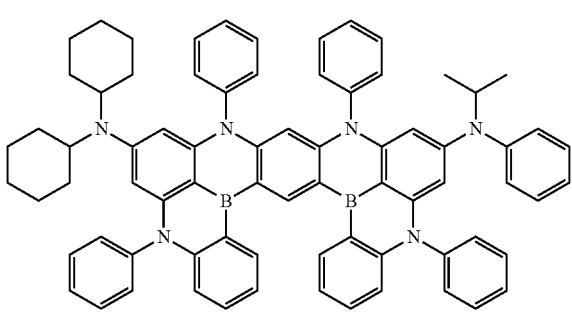
75
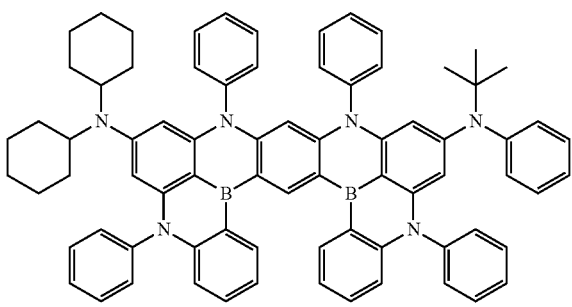
76
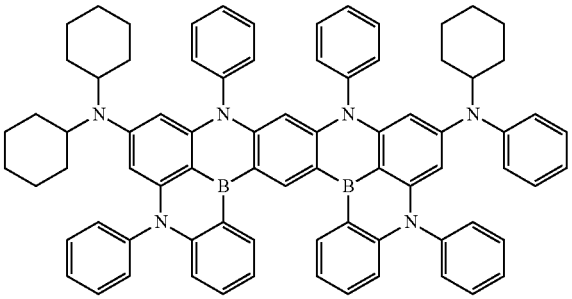
77
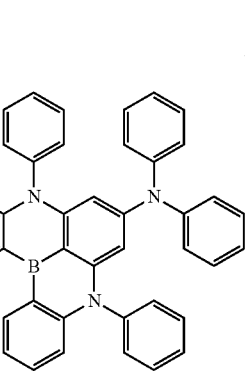
78
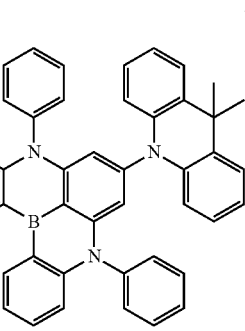
79
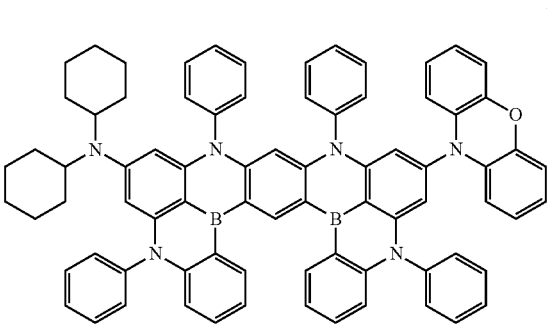
80
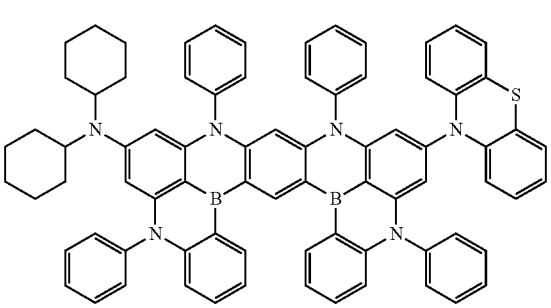

-continued
61D
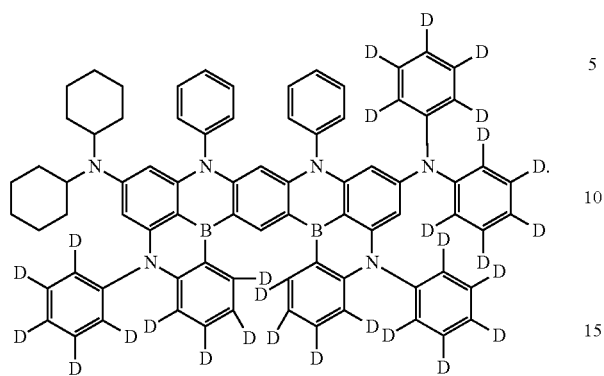
* * * * *